United States Patent
Godo et al.

(10) Patent No.: US 8,704,216 B2
(45) Date of Patent: Apr. 22, 2014

(54) SEMICONDUCTOR DEVICE AND MANUFACTURING METHOD THEREOF

(75) Inventors: Hiromichi Godo, Isehara (JP); Kengo Akimoto, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 456 days.

(21) Appl. No.: 12/706,737

(22) Filed: Feb. 17, 2010

(65) Prior Publication Data

US 2010/0219410 A1   Sep. 2, 2010

(30) Foreign Application Priority Data

Feb. 27, 2009  (JP) .................. 2009-045536

(51) Int. Cl.
*H01L 29/786* (2006.01)
(52) U.S. Cl.
USPC ............... 257/43; 257/57; 257/59; 257/72; 257/E21.476; 438/104; 438/158
(58) Field of Classification Search
USPC .......... 257/43, 57, 59, 72, E29.296, E29.094, 257/E21.746, E21.459, E21.476; 438/104, 438/158
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,680,223 B1 * | 1/2004 | Yamazaki et al. | 438/149 |
| 6,727,522 B1 | 4/2004 | Kawasaki et al. | |
| 6,900,461 B2 | 5/2005 | Inoue et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| CN | 001463466 | 12/2003 |
| CN | 001941299 | 4/2007 |

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Thinh T Nguyen
(74) *Attorney, Agent, or Firm* — Eric J. Robinson; Robinson Intellectual Property Law Office, P.C.

(57) ABSTRACT

An object is to reduce to reduce variation in threshold voltage to stabilize electric characteristics of thin film transistors each using an oxide semiconductor layer. An object is to reduce an off current. The thin film transistor using an oxide semiconductor layer is formed by stacking an oxide semiconductor layer containing insulating oxide over the oxide semiconductor layer so that the oxide semiconductor layer and source and drain electrode layers are in contact with each other with the oxide semiconductor layer containing insulating oxide interposed therebetween; whereby, variation in threshold voltage of the thin film transistors can be reduced and thus the electric characteristics can be stabilized. Further, an off current can be reduced.

21 Claims, 38 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,291,967 B2 | 11/2007 | Sakata et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,492,090 B2 | 2/2009 | Yamazaki et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,799,622 B2 * | 9/2010 | Jung et al. ............... 438/151 |
| 7,910,490 B2 | 3/2011 | Akimoto et al. |
| 7,923,287 B2 | 4/2011 | Lee et al. |
| 7,932,521 B2 | 4/2011 | Akimoto et al. |
| 7,940,345 B2 | 5/2011 | Yamazaki |
| 8,143,115 B2 | 3/2012 | Omura et al. |
| 8,148,721 B2 | 4/2012 | Hayashi et al. |
| 8,188,480 B2 | 5/2012 | Itai |
| 8,274,077 B2 | 9/2012 | Akimoto et al. |
| 8,466,463 B2 | 6/2013 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118786 A1 * | 6/2006 | Kim et al. ............... 257/59 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0042326 A1 | 2/2009 | Yamazaki et al. |
| 2009/0045399 A1 | 2/2009 | Kaji et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0305468 A1 * | 12/2009 | Jung et al. ............... 438/151 |
| 2010/0051937 A1 | 3/2010 | Kaji et al. |
| 2010/0065837 A1 * | 3/2010 | Omura et al. ............... 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0198595 A1 | 8/2011 | Yamazaki |
| 2012/0168750 A1 | 7/2012 | Hayashi et al. |

FOREIGN PATENT DOCUMENTS

| | | |
|---|---|---|
| CN | 101226901 | 7/2008 |
| CN | 101350367 | 1/2009 |
| EP | 1396881 A | 3/2004 |
| EP | 1737044 A | 12/2006 |
| EP | 1770788 A | 4/2007 |
| EP | 1933385 A | 6/2008 |
| EP | 1995787 A | 11/2008 |
| EP | 1998373 A | 12/2008 |
| EP | 1998374 A | 12/2008 |
| EP | 1998375 A | 12/2008 |
| EP | 2105967 A | 9/2009 |
| EP | 2226847 A | 9/2010 |
| JP | 60-170972 | 9/1985 |
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 | 5/2000 |

(56) References Cited

FOREIGN PATENT DOCUMENTS

| JP | 2002-076356 A | 3/2002 |
|---|---|---|
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-073701 | 3/2007 |
| JP | 2007-096055 | 4/2007 |
| JP | 2007-123861 | 5/2007 |
| JP | 2007-150158 A | 6/2007 |
| JP | 2008-218495 A | 9/2008 |
| JP | 2008-276212 A | 11/2008 |
| JP | 2009-231613 A | 10/2009 |
| WO | WO-2004/114391 | 12/2004 |
| WO | WO-2008/069056 | 6/2008 |
| WO | WO-2008/069255 | 6/2008 |
| WO | WO 2008/105250 | 9/2008 |
| WO | WO 2008/126883 | 10/2008 |
| WO | WO-2008/126884 | 10/2008 |

OTHER PUBLICATIONS

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3$ (ZnO)$m$ ($m$=7, 8, 9, and 16) in the $In_2O_3$-$ZnGa_2O_4$ZnO System," Journal of Solid State Chemistry, Apr. 1, 1995, vol. 116, No. 1, pp. 170-178.

Nakamura et al., "Synthesis and crystal structures of new homologous compounds, indium iron zinc oxides ($InFeO_3$ (ZnO)$m$) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Masuda et al., "Transparent thin film transistors using ZnO as an active channel layer and their electrical properties," Journal of Applied Physics, Feb. 1, 2003, vol. 93, No. 3, pp. 1624-1630.

Fortunato.E et al., "Wide-Bandgap High-Mobility ZnO Thin-Film Transistors Produced at Room Temperature,", Apple. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full Functional System Liquid Crystal Display Using CG-Solicon Technology,", SID Digest '04: SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Phyics Letters), Jun. 26, 2007, vol. 90, No. 26, pp. 262106-1-262106-3.

Takahashi.M et al., "Theoretical Analsis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2 Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsix structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID DIGEST '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: International Connector with Surpressed Voltage Loss For White Tandem Oleds,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for mobile TFT-LCDs,", IDW'02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID DIGEST '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase", ", Physics Letters, Sep. 10, 1973, vol. 45A, No. 2, pp. 115-116.

Cho.D et al., "21.2: Al and Sn-Doped Zinc Indium Oxide Thin Film Transistors for Amoled Back-Plane,", SID DIGEST '09: SID International Symposium Digest of Technical Papers, May 31, 2009, pp. 280-283.

Lee.M et al., "15.4: Excellent Performance of Indium-Oxide-Based Thin-Film Transistors by DC Sputtering,", SID DIGEST '09: SID International Symposium Digest of Technical Papers, May 31, 2009, pp. 191-193.

Jin.D et al., "65.2: Distinguished Paper: World-Largest (6.5") Flexible Full Color Top Emission Amoled Display on Plastic Film and Its Bending Properties,", SID DIGEST '09: SID International Symposium Digest of Technical Papers, May 31, 2009, pp. 983-985.

Sakata.J et al., "Development of 4.0-In. Amoled Display with Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTs and their Application for Large Size Amoled,", AM-FPD '08 Digest of Technical Papers, Jul. 2, 2008, pp. 275-278.

(56) References Cited

OTHER PUBLICATIONS

Park.S et al., "Challenge to Future Displays: Transparent Am-Oled Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3: Invited Paper: Transparent Amorphous Oxide Semiconductors for High Performance TFT,", SID Digest '07: SID International Symposium Digest of Technical Papers, 2007, vol. 38, pp. 1830-1833.

Godo.H et al., "P-9: Numerical Analysis on Temperature Dependence of Characteristics of Amorphous In-Ga-Zn-Oxide TFT,", SID DIGEST '09: SID International Symposium Digest of Technical Papers, May 31, 2009, pp. 1110-1112.

Ohara.H et al., "21.3:4.0 In. QVGA Amoled Display Using In-Ga-Zn Oxide TFTs With a Novel Passivation Layer,", SID Digest '09: SID International Symposium Digest of Technical Papers, May 31, 2009, pp. 284-287.

Miyaska.M, "Suftla Flexible Microelectronics on Their Way to Business,", SID DIGEST '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1: Invited Paper: Optically Isotropic Nano-Structured Liquid Crystal Composites for Display Applications,", SID DIGEST '09: SID International Symposium Digest of Technical Papers, May 31, 2008, pp. 578-581.

Asaoka.Y et al., "29.1: Polarizer-Free Reflective LCD Combined with Ultra Low-Power Driving Technology,", SID DIGEST '09: SID International Symposium Digest of Technical Papers, May 31, 2009, pp. 395-398.

Lee.H et al., "Current Status of, Challenges to, and Perspective View of Am-Oled,", IDW '06: Proceedings of the 13th International Display Workshops, Dec. 7, 2006, pp. 663-666.

Kikuchi.H et al., "62.2: Invited Papers: Fast Electro-Optical Switching in Polymer-Stabalized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabalized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 18, pp. 1216-1219.

Park.Sang-Hee et al., "42.3: Transparent ZnO Thin Film Transitor for the Application of High Aperture Ratio Bottom Emission AM-OLED Display,", SID DIGEST '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review, B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Opon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID DIGEST '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to expore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry Etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin Film Transistors with Aluminum Oxide Dielectric Layers,", J. Electrochem, Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters), Sep. 1, 2003, vol. 83, No. 9, pp. 1755-1757.

Chinese Office Action (Application No. 201010135175.5; CN12199) Dated Oct. 31, 2013.

Chinese Office Action (Application No. 201010135175.5) Dated Oct. 31, 2013.

\* cited by examiner

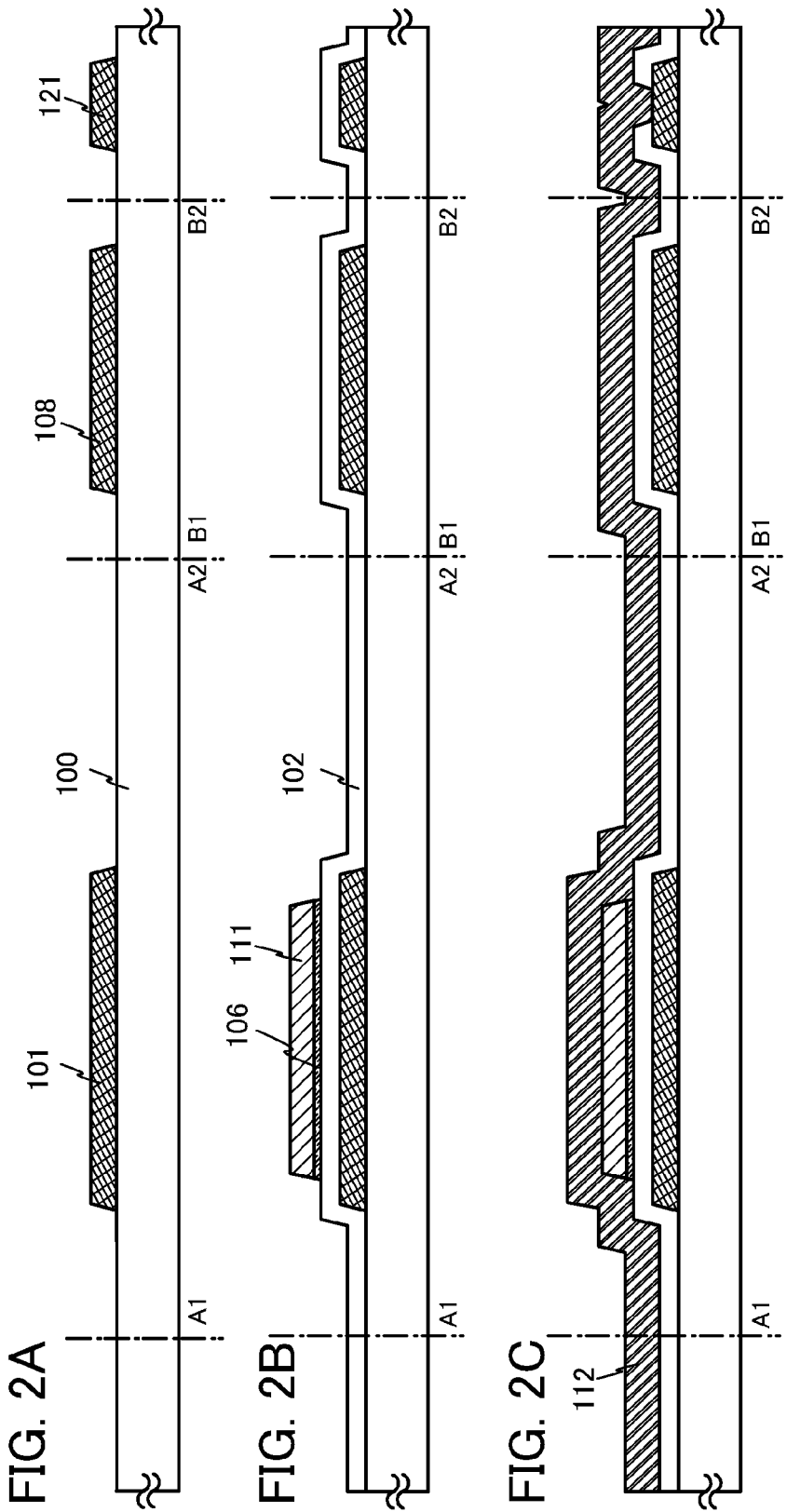

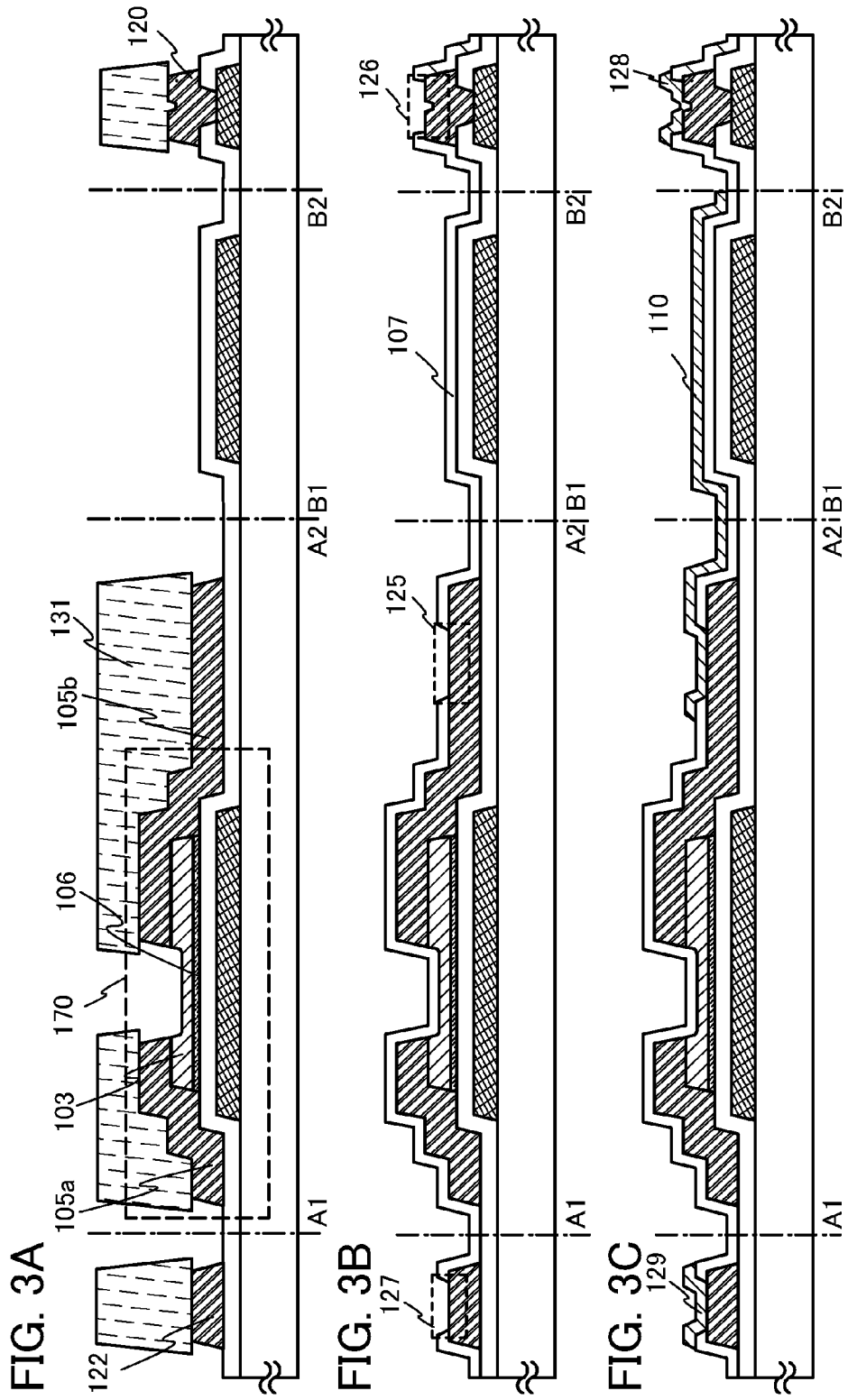

FIG. 8A1
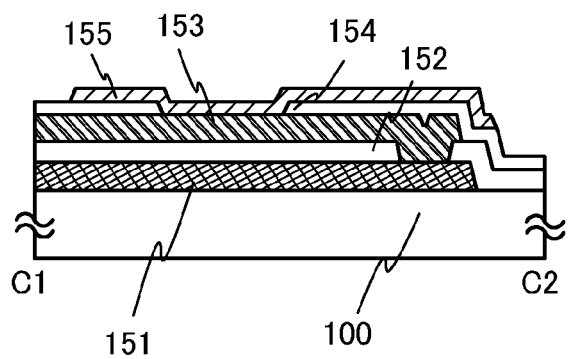
FIG. 8A2
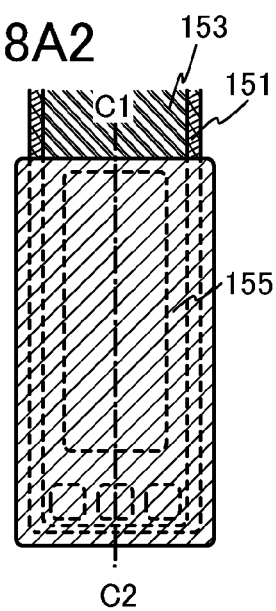
FIG. 8B1
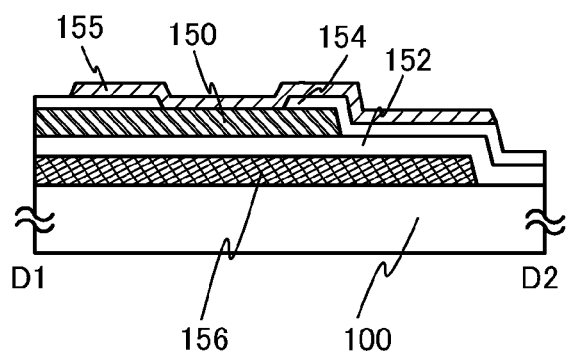
FIG. 8B2
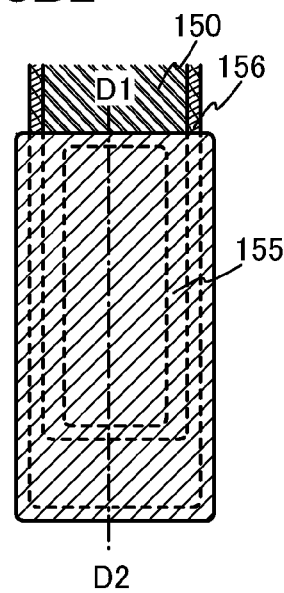

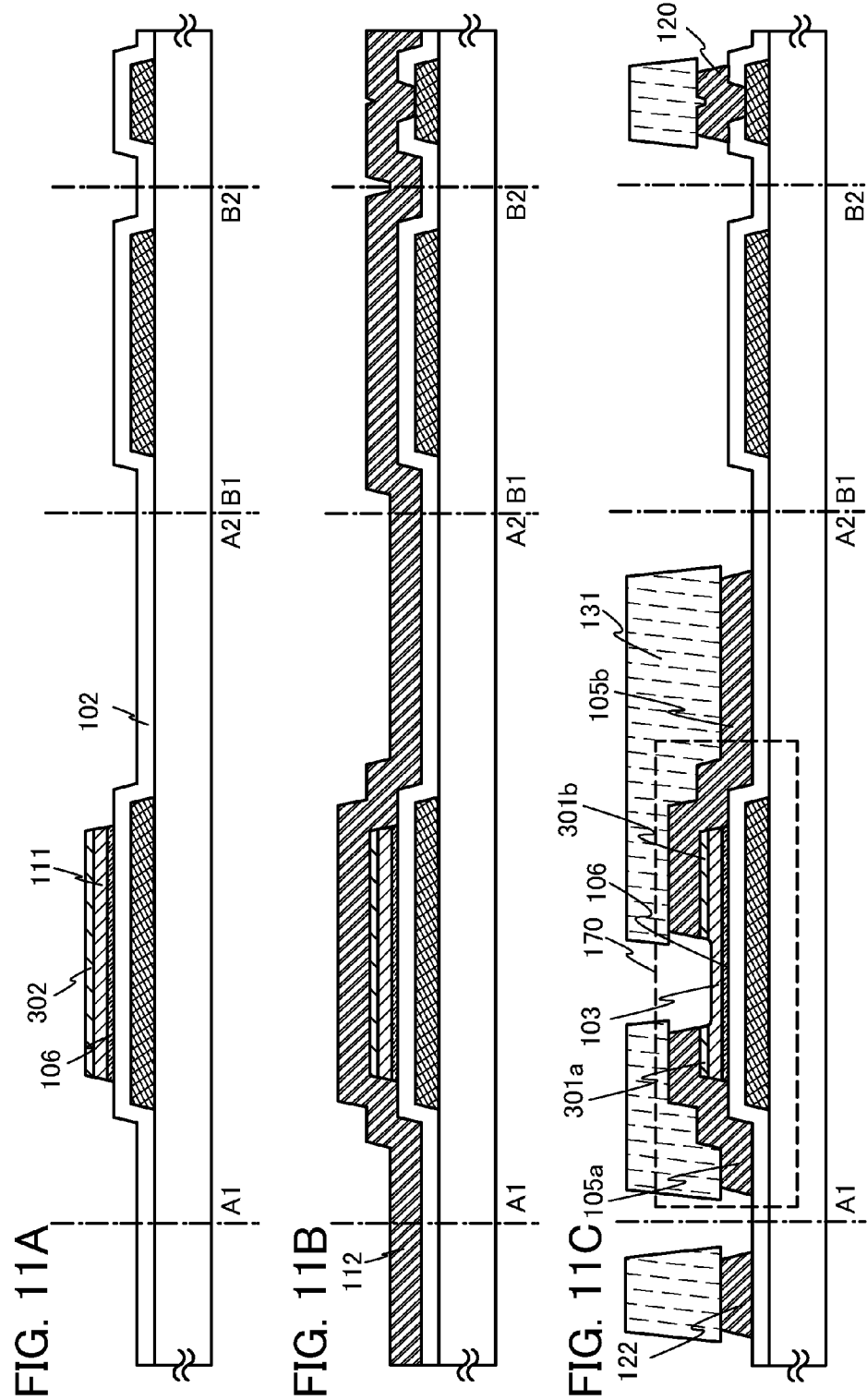

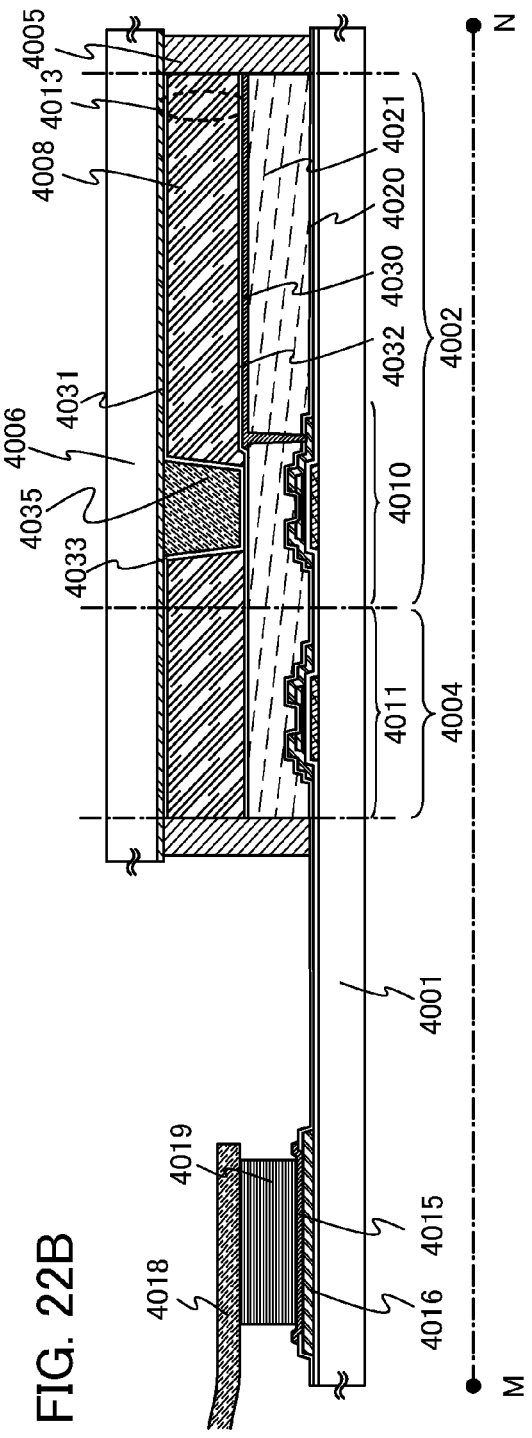

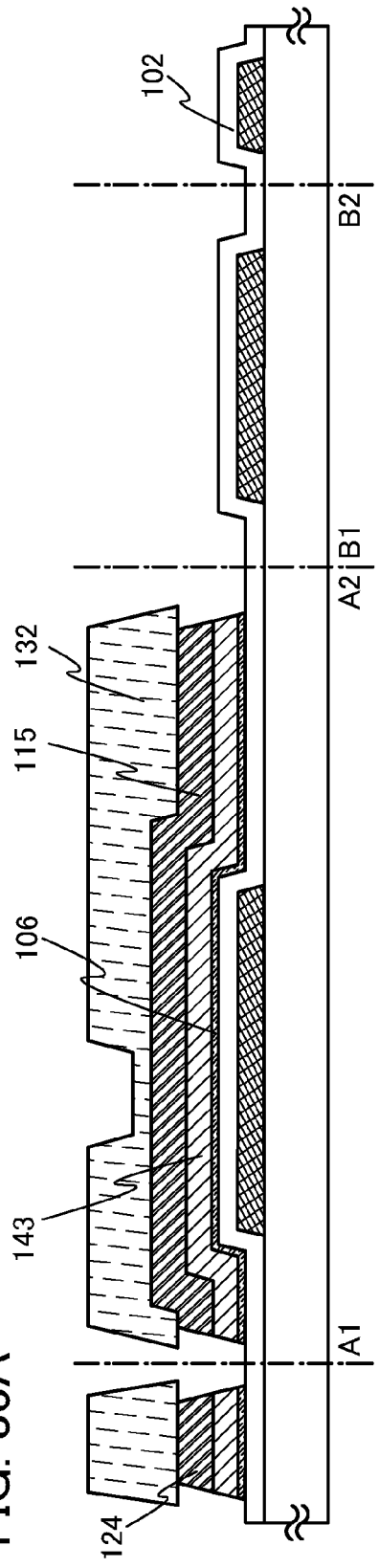
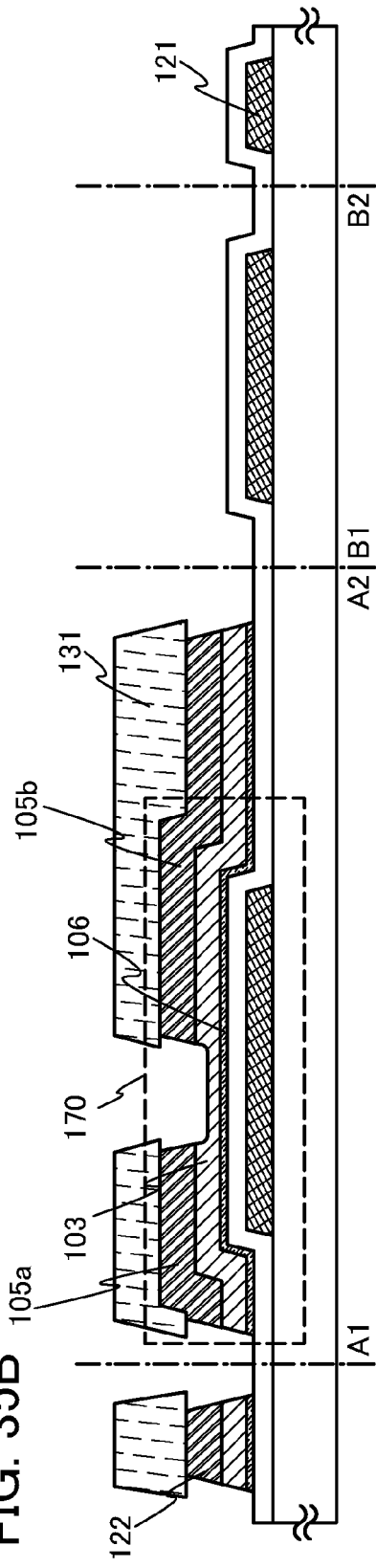

SEMICONDUCTOR DEVICE AND MANUFACTURING METHOD THEREOF

BACKGROUND OF THE INVENTION

1. Field of the Invention

The present invention relates to a semiconductor device using an oxide semiconductor, a display device using the semiconductor device, and manufacturing methods thereof.

2. Description of the Related Art

Various metal oxides exist and are used for a variety of applications. Indium oxide is a well-known material and is used as a light-transmitting electrode material which is needed for a liquid crystal display or the like.

Some metal oxides have semiconductor characteristics. As metal oxides having semiconductor characteristics, for example, there are tungsten oxide, tin oxide, indium oxide, zinc oxide, and the like, and a thin film transistor in which such a metal oxide having semiconductor characteristics is used for a channel formation region has been disclosed (Patent Documents 1 to 4 and Non-Patent Document 1).

Incidentally, not only unitary oxides but also multiple oxides are known as metal oxides. For example, $InGaO_3(ZnO)_m$ (m is a natural number) which has a homologous phase is known as a multiple oxide semiconductor containing In, Ga, and Zn (Non-Patent Documents 2 to 4).

Further, it is confirmed that such an oxide semiconductor made of In—Ga—Zn-based oxide is applicable to a channel layer of a thin film transistor (also referred to as a "TFT") (Patent Document 5 and Non-Patent Documents 5 and 6).

In a conventional case, amorphous silicon or polycrystalline silicon has been used for a thin film transistor (TFT) provided for each pixel of an active matrix liquid crystal display. However, a technique for manufacturing a thin film transistor using the above metal oxide semiconductor instead of such a silicon material has attracted attention. Examples of the techniques are disclosed in Patent Document 6 and Patent Document 7, where a thin film transistor is manufactured using zinc oxide or an In—Ga—Zn—O-based oxide semiconductor for a metal oxide semiconductor film and is used as a switching element or the like of an image display device.

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-96055
[Non-Patent Document]
[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_n$, (m=7, 8, 9, and 16) in the $In_2O_3$—$ZnGa_2O_4$—ZnO System", *J. Solid State Chem.*, 1995, Vol. 116, pp. 170-178
[Non-Patent Document 4] Masaki NAKAMURA, Noboru KIMIZUKA, Takahiko MOHRI, and Mitsumasa ISOBE, "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

An object of an embodiment of the present invention is to reduce variation in threshold voltage of thin film transistors each using an oxide semiconductor layer in order to stabilize the electric characteristics of the thin film transistors. Further, an object of an embodiment of the present invention is to reduce an off current in order to stabilize the electric characteristics of a thin film transistor using an oxide semiconductor layer. Further, an object of an embodiment of the present invention is to provide a display device having the thin film transistor using an oxide semiconductor layer.

To achieve the above objects, a thin film transistor using an oxide semiconductor layer is formed by stacking an oxide semiconductor layer containing insulating oxide over an oxide semiconductor layer so that the oxide semiconductor layer and the source or drain electrode layer are in contact with each other with the oxide semiconductor layer containing insulating oxide interposed therebetween.

An embodiment of the present invention is a semiconductor device including a gate electrode layer, a gate insulating layer over the gate electrode layer, an oxide semiconductor layer over the gate insulating layer, an oxide semiconductor layer containing insulating oxide, which is over the oxide semiconductor layer, and source and drain electrode layers over the oxide semiconductor layer containing insulating oxide. The oxide semiconductor layer containing insulating oxide, which is over the oxide semiconductor layer, has an amorphous structure. The oxide semiconductor layer containing insulating oxide is electrically connected to the source and drain electrode layers.

Another embodiment of the present invention is a semiconductor device including a gate electrode layer, a gate insulating layer over the gate electrode layer, an oxide semiconductor layer over the gate insulating layer, an oxide semiconductor layer containing insulating oxide, which is over the oxide semiconductor layer, a buffer layer having n-type conductivity over the oxide semiconductor layer containing insulating oxide, and source and drain electrode layers over the buffer layer. The oxide semiconductor layer containing insulating oxide, which is over the oxide semiconductor layer, has an amorphous structure. The conductivity of the buffer layer is higher than that of the oxide semiconductor layer. The oxide semiconductor layer containing insulating oxide is electrically connected to the source and drain electrode layers through the buffer layer.

Note that the insulating oxide is preferably silicon oxide. Further, the oxide semiconductor layer containing insulating oxide is preferably formed by a sputtering method using a target containing $SiO_2$ at from 0.1% by weight to 30% by weight. Further, the oxide semiconductor layer and the oxide semiconductor layer containing insulating oxide each preferably contain at least one of indium, tin, and zinc. Further, the buffer layer is preferably formed using a non-single crystal film formed using an oxide semiconductor.

Further, the oxide semiconductor layer may have a region which is between the source electrode layer and the drain electrode layer and whose thickness is smaller than that of a region overlapped with the source or drain electrode layer. Further, the oxide semiconductor layer containing insulating oxide between the source electrode layer and the drain electrode layer may be etched so that the oxide semiconductor layer is exposed. Further, a channel protective layer formed using an inorganic material may be provided over the oxide semiconductor layer. Further, the width in a channel direction of the gate electrode layer may be larger than that of either the oxide semiconductor layer containing insulating oxide or the oxide semiconductor layer. Further, hollows may be formed under end portions of the oxide semiconductor layer containing insulating oxide. Further, end portions of the oxide semiconductor layer may be covered with the oxide semiconductor layer containing insulating oxide.

Another embodiment of the present invention is a method for manufacturing a semiconductor device, which includes the steps of forming a gate electrode layer over a substrate; forming a gate insulating layer over the gate electrode layer; forming a first oxide semiconductor film over the gate insulating layer by a sputtering method; forming a second oxide semiconductor film containing silicon oxide, over the first oxide semiconductor film, by a sputtering method using a target containing $SiO_2$; etching the first oxide semiconductor film and the second oxide semiconductor film to form an oxide semiconductor layer and an island-shaped second oxide semiconductor film; forming a conductive layer over the island-shaped second oxide semiconductor film; and etching the island-shaped second oxide semiconductor film and the conductive layer to form an oxide semiconductor layer containing insulating oxide and source and drain electrode layers. The target containing $SiO_2$ contains $SiO_2$ at from 0.1% by weight to 30% by weight.

Another embodiment of the present invention is a method for manufacturing a semiconductor device, which includes the steps of forming a gate electrode layer over a substrate; forming a gate insulating layer over the gate electrode layer; forming a first oxide semiconductor film over the gate insulating layer by a sputtering method; etching the first oxide semiconductor film to form an oxide semiconductor layer; forming a second oxide semiconductor film containing silicon oxide, over the oxide semiconductor layer, by a sputtering method using a target containing $SiO_2$; etching the second oxide semiconductor film to form an island-shaped second oxide semiconductor film so that it covers the oxide semiconductor layer; forming a conductive layer over the island-shaped second oxide semiconductor film; and etching the island-shaped second oxide semiconductor film and the conductive layer to form an oxide semiconductor layer containing insulating oxide and source and drain electrode layers. The target containing $SiO_2$ contains $SiO_2$ at from 0.1% by weight to 30% by weight.

Note that the target containing $SiO_2$ preferably contains $SiO_2$ at from 1% by weight to 10% by weight. Further, the first oxide semiconductor film and the second oxide semiconductor film each preferably contain at least one of indium, tin, and zinc. Further, the first oxide semiconductor film and the second oxide semiconductor film may be wet-etched, so that the first oxide semiconductor film is side-etched and thus hollows are formed under end portions of the oxide semiconductor layer containing insulating oxide. Further, the oxide semiconductor layer may have a region which is between the source electrode layer and the drain electrode layer and whose thickness is smaller than that of a region overlapped with the source or drain electrode layer.

Note that the ordinal numbers such as "first" and "second" in this specification are used for convenience and do not denote the order of steps or the stacking order of layers. In addition, the ordinal numbers in this specification do not denote particular names which specify the present invention.

Note that the semiconductor devices in this specification indicate all the devices which can operate using semiconductor characteristics, and an electronic optical device, a semiconductor circuit, and an electronic device are all included in the semiconductor devices.

According to an embodiment of the present invention, the thin film transistors each using an oxide semiconductor layer is formed by stacking the oxide semiconductor layer containing insulating oxide over the oxide semiconductor layer so that the oxide semiconductor layer and the source and drain electrode layers are in contact with each other with the oxide semiconductor layer containing insulating oxide interposed therebetween; whereby, variation in threshold voltage of the thin film transistors can be reduced and the electric characteristics can be stabilized. Further, according to an embodiment of the present invention, an off current can be reduced.

By using the thin film transistors for a pixel portion and a driver circuit portion of a display device, the display device can have stable electric characteristics and high reliability.

BRIEF DESCRIPTION OF THE DRAWINGS

In the accompanying drawings:

FIGS. 2A to 2C illustrate a method for manufacturing a semiconductor device according to an embodiment of the present invention;

FIGS. 3A to 3C illustrate the method for manufacturing the semiconductor device according to an embodiment of the present invention;

FIGS. 8A1, 8A2, 8B1, and 8B2 illustrate semiconductor devices according to embodiments of the present invention;

FIGS. 11A to 11C illustrate a method for manufacturing a semiconductor device, according to an embodiment of the present invention;

FIGS. 22A1, 22A2, and 22B illustrate semiconductor devices according to embodiments of the present invention;

FIGS. 35A and 35B illustrate a method for manufacturing a semiconductor device, according to an embodiment of the present invention;

DETAILED DESCRIPTION OF THE INVENTION

Figure 1A:
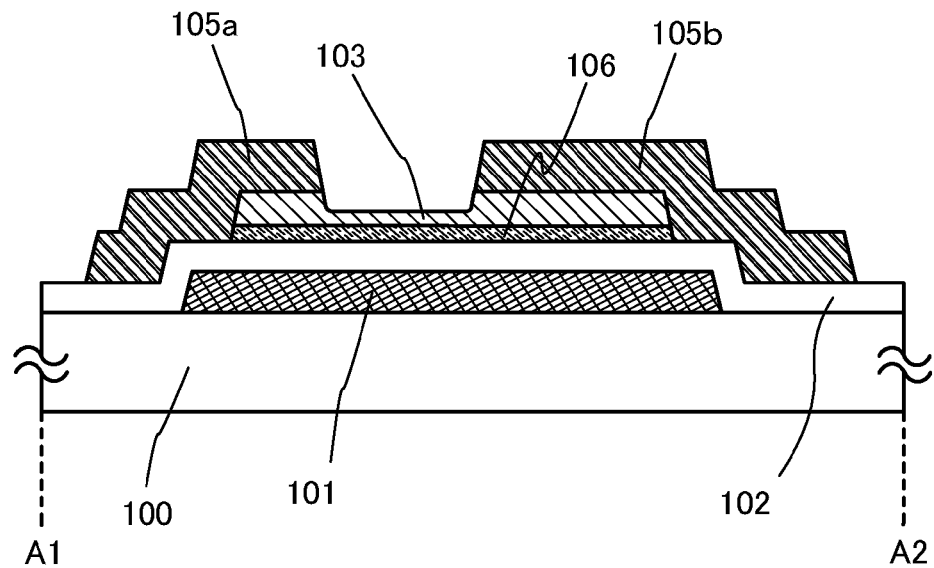
FIGS. 1A and 1B illustrate a semiconductor device according to an embodiment of the present invention.

The embodiments of the present invention are described in detail with reference to drawings. Note that the present invention is not limited to the description below, and it is apparent to those skilled in the art that modes and details can be modified in various ways without departing from the spirit and scope of the present invention. Accordingly, the present invention should not be construed as being limited to the description of the embodiments given below. Note that in the structures of the present invention described below, same reference numerals refer to the same portions or portions having similar functions, and the description thereof is omitted.

Embodiment 1

In this embodiment, a structure of a thin film transistor is described with reference to FIGS. 1A and 1B.

Figure 1B:
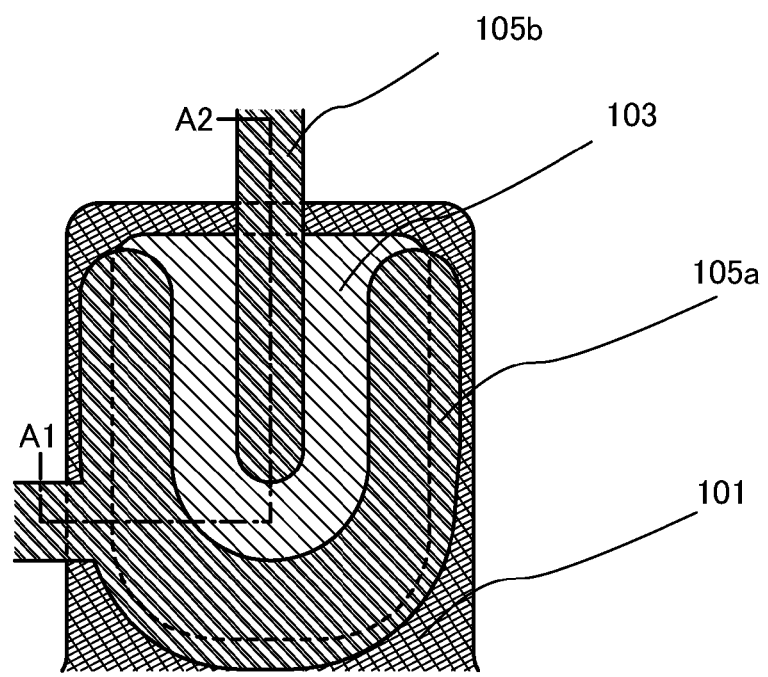
Figure 4:
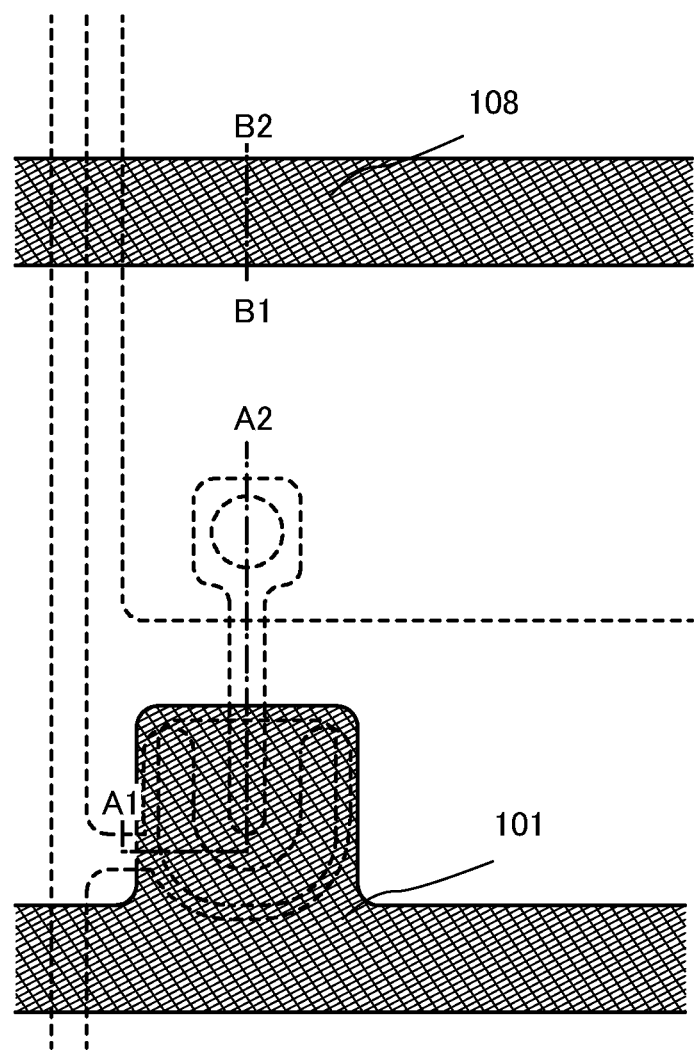
FIG. 4 illustrates the method for manufacturing the semiconductor device according to an embodiment of the present invention.
Figure 5:
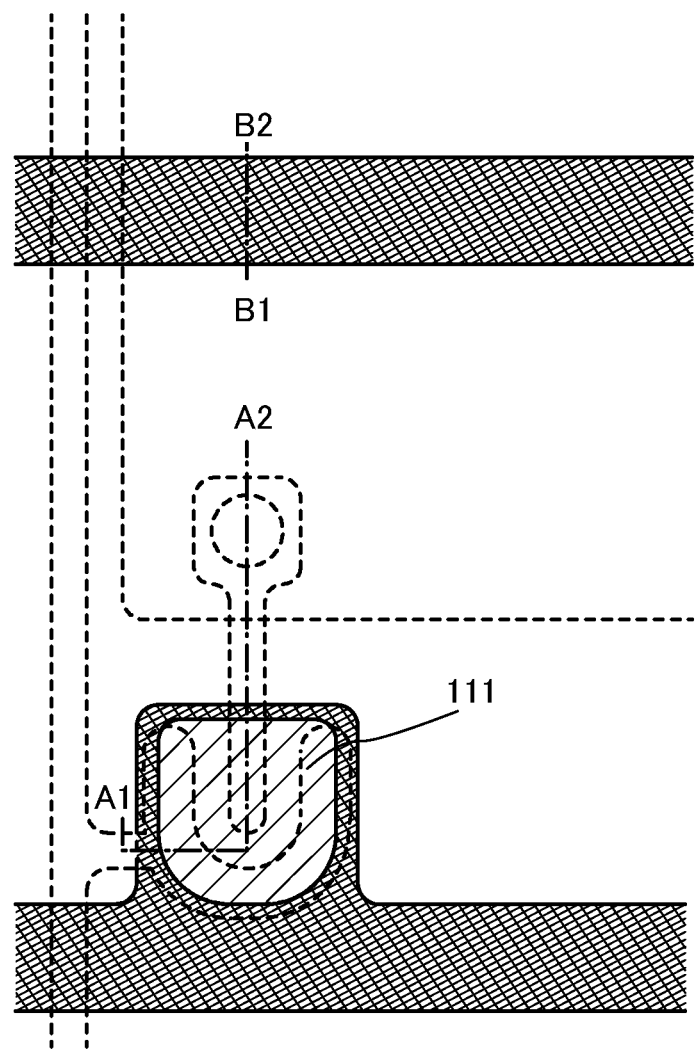
FIG. 5 illustrates the method for manufacturing the semiconductor device according to an embodiment of the present invention.
Figure 6:
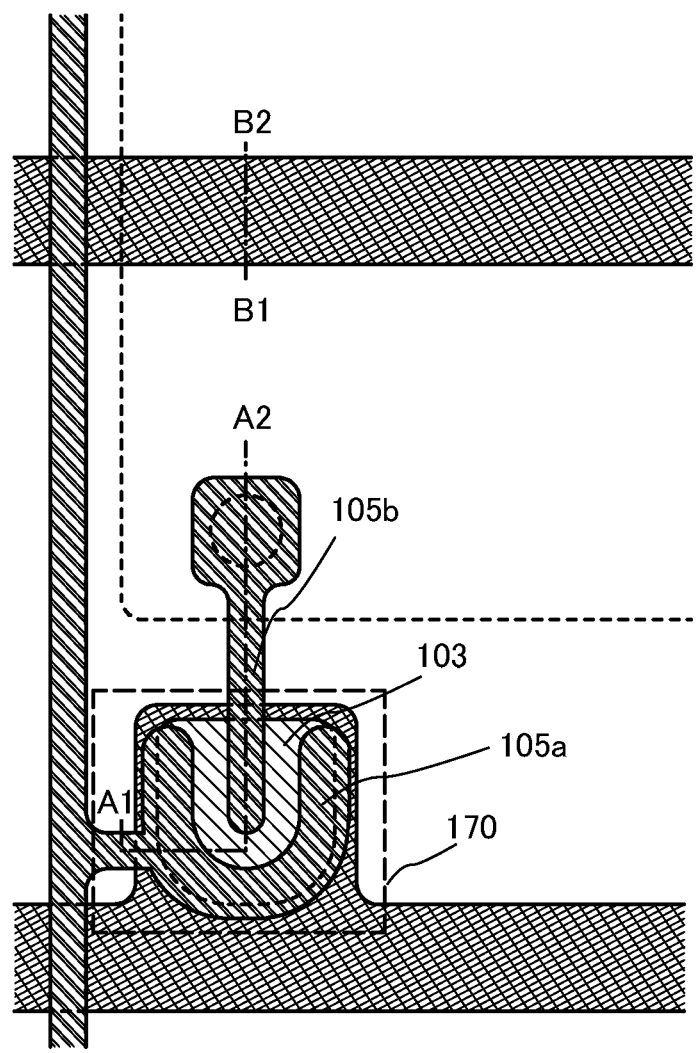
FIG. 6 illustrates the method for manufacturing the semiconductor device according to an embodiment of the present invention.

A thin film transistor having a bottom-gate structure of this embodiment is illustrated in FIGS. 1A and 1B. FIG. 1A is a cross-sectional view, and FIG. 1B is a plan view. FIG. 1A is a cross-sectional view taken along line A1-A2 of FIG. 1B.

In the thin film transistor illustrated in FIGS. 1A and 1B, a gate electrode layer 101 is provided over a substrate 100, a gate insulating layer 102 is provided over the gate electrode layer 101, an oxide semiconductor layer 106 is provided over the gate insulating layer 102, an oxide semiconductor layer 103 containing insulating oxide is provided over the oxide semiconductor layer 106, and source and drain electrode layers 105a and 105b are provided over the oxide semiconductor layer 103 containing insulating oxide.

The gate electrode layer 101 is formed to have a single-layer structure or a layered structure using a metal material such as aluminum, copper, molybdenum, titanium, chromium, tantalum, tungsten, neodymium, or scandium; an alloy material containing any of these metal materials as its main component; or a nitride containing any of these metal materials as its component. The gate electrode layer 101 is desirably formed using a low-resistance conductive material such as aluminum or copper; however, the low-resistance conductive material has disadvantages of having low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, as a layered structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used.

For the oxide semiconductor layer 106, preferably used is a non-single-crystal film formed of an In—Ga—Zn—O-based, In—Sn—Zn—O-based, Ga—Sn—Zn—O-based, In—Zn—O-based, Sn—Zn—O-based, In—Sn—O-based, Ga—Zn—O-based, In—O-based, Sn—O-based, or Zn—O-based oxide semiconductor.

In this specification, an In—Ga—Zn—O-based oxide semiconductor is an oxide semiconductor containing at least In, Ga, and Zn. An In—Sn—Zn—O-based oxide semiconductor is an oxide semiconductor containing at least In, Sn, and Zn. A Ga—Sn—Zn—O-based oxide semiconductor is an oxide semiconductor containing at least Ga, Sn, and Zn. An In—Zn—O-based oxide semiconductor is an oxide semiconductor containing at least In and Zn. A Sn—Zn—O-based oxide semiconductor is an oxide semiconductor containing at least Sn and Zn. An In—Sn—O-based oxide semiconductor is an oxide semiconductor containing at least In and Sn. A Ga—Zn—O-based oxide semiconductor is an oxide semiconductor containing at least Ga and Zn. An In—O-based oxide semiconductor is an oxide semiconductor containing at least In. A Sn—O-based oxide semiconductor is an oxide semiconductor containing at least Sn. A Zn—O-based oxide semiconductor is an oxide semiconductor containing at least Zn. The above oxide semiconductor may contain one or more of metal elements of Fe, Ni, Mn, and Co.

The oxide semiconductor layer 106 does not necessarily have an amorphous structure, and includes a crystal grain (nanocrystal) in some cases. The crystal grain (nanocrystal) is 1 nm to 10 nm in diameter, typically, about 2 nm to about 4 nm in diameter. Note that the crystal state is evaluated by X-ray diffraction (XRD) analysis.

The thickness of the oxide semiconductor layer 106 is 10 nm to 300 nm, preferably 20 nm to 100 nm.

For the oxide semiconductor layer 103 containing insulating oxide, preferably used is a non-single-crystal film formed of an In—Ga—Zn—O-based, In—Sn—Zn—O-based, Ga—Sn—Zn—O-based, In—Zn—O-based, Sn—Zn—O-based, In—Sn—O-based, Ga—Zn—O-based, In—O-based, Sn—O-based, or Zn—O-based oxide semiconductor, which contains insulating oxide. Here, as the insulating oxide, silicon oxide is preferable. Further, nitrogen may be added to the insulating oxide.

Further, the oxide semiconductor layer 103 containing insulating oxide has an amorphous structure. Note that the crystal state is evaluated by X-ray diffraction (XRD) analysis similarly to that of the oxide semiconductor layer 106.

Further, the oxide semiconductor layer 103 containing insulating oxide is preferably formed by a sputtering method using a target containing $SiO_2$ at from 0.1% by weight to 30% by weight, more preferably at from 1% by weight to 10% by weight.

The oxide semiconductor layer 103 containing insulating oxide contains insulating oxide such as silicon oxide, whereby crystallization of the oxide semiconductor layer 103 containing insulating oxide can be suppressed and thus the oxide semiconductor layer 103 containing insulating oxide can have an amorphous structure, which can lead to reduction in variation in thin film transistor characteristics and stabilization of the characteristics. Further, even when heat treatment at from 300° C. to 600° C. is performed, crystallization of the oxide semiconductor layer 103 containing insulating oxide or generation of a microcrystal grain in the oxide semiconductor layer 103 containing insulating oxide can be prevented.

Since the oxide semiconductor layer 103 containing insulating oxide has an amorphous structure and does not include crystal or a crystal grain, conductance thereof is low. Therefore, in the case where the oxide semiconductor layer 103 containing insulating oxide, which has an amorphous structure, is between the oxide semiconductor layer 106 and the source and drain electrode layers 105a and 105b, variation in threshold voltage of the thin film transistors can be reduced and thus the electric characteristics can be stabilized. Further, an off current can be reduced.

The thickness of the oxide semiconductor layer 103 containing insulating oxide is 10 nm to 300 nm, preferably 20 nm to 100 nm The oxide semiconductor layer 103 containing insulating oxide may have a region which is between the source and drain electrode layers 105a and 105b and whose thickness is smaller than that of a region overlapped with the source or drain electrode layer 105a or 105b.

The source and drain electrode layers 105a and 105b can be formed using a metal material such as aluminum, copper, molybdenum, titanium, chromium, tantalum, tungsten, neodymium, or scandium; an alloy material containing any of these metal materials as its main component; or nitride containing any of these metal materials as its component. The source and drain electrode layers 105a and 105b are desirably formed using a low-resistance conductive material such as aluminum or copper; however, the low-resistance conductive material has disadvantages of having low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, preferable is a three-layer structure in which a first conductive layer and a third conductive layer are formed using titanium that is a heat-resistant conductive material, and a second conductive layer is formed using an aluminum alloy containing neodymium that has low resistance. With such a structure, low resistance of aluminum is utilized and generation of hillocks can be reduced. Note that the structure of the source and drain electrode layers 105a and 105b is not limited to this. A single-layer structure, a two-layer structure, or a layered structure of four or more layers may alternatively be employed.

Next, effects of the thin film transistor where the oxide semiconductor layer 103 containing insulating oxide is stacked over the oxide semiconductor layer 106 are described on the basis of results of calculator simulation. Here, variations in threshold voltage of thin film transistors due to carriers generated in a back channel are examined. Note that in this specification, a back channel is a portion of an active layer in a thin film transistor, which is overlapped with neither a source electrode layer nor a drain electrode layer and opposite side to a gate electrode layer and a gate insulating layer.

Figure 36A:
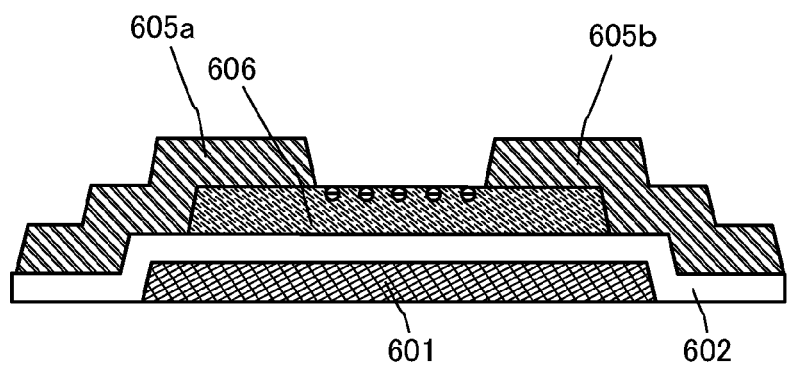
FIGS. 36A to 36C illustrate structures of thin film transistors used for simulation.
Figure 36B:
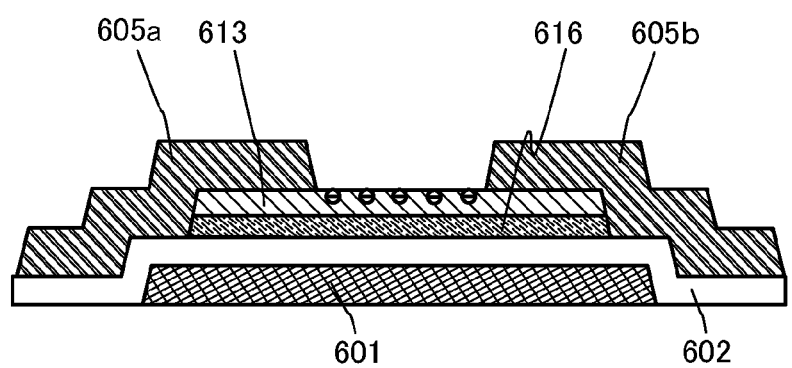
Figure 36C:
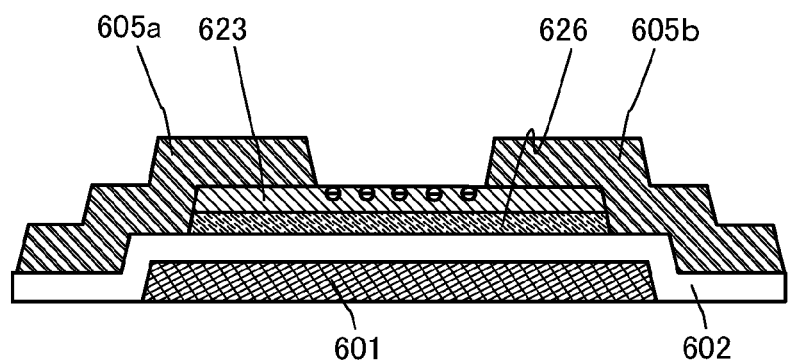

FIGS. 36A to 36C illustrate structures of thin film transistors used for calculation models. Each of the thin film transistors includes a gate electrode layer 601, a gate insulating layer 602 provided over the gate electrode layer 601, an active layer formed using an oxide semiconductor, which is provided over the gate insulating layer 602, and source and drain electrode layers 605a and 605b provided over the active layer. It was assumed that the channel length and the channel width of each of the thin film transistors were 10 μm and 100 μm, respectively; the gate electrode layer 601 was formed using tungsten to have a thickness of 100 nm, and the work function thereof was 4.6 eV; the gate insulating layer 602 was formed using silicon oxynitride to have a thickness of 100 nm, and the dielectric constant thereof was 4.1; and the source and drain electrode layers 605a and 605b were formed using titanium to have a thickness of 100 nm, and the work function thereof is 4.3 eV.

Here, it is known that in an oxide semiconductor, excess carriers are generated due to oxygen vacancy or entry of hydrogen. In the back channel of the thin film transistor, oxygen vacancy is likely to occur due to plasma damage when the source and drain electrode layers 605a and 605b are etched, and thus excess carries are likely to be generated. Further, there is a possibility that excess carriers are generated in the back channel due to entry of hydrogen in the air or from an interlayer film. Therefore, carriers (electrons) generated due to oxygen vacancy or entry of hydrogen through steps of etching, deposition, and the like were assumed to be in the back channel of each of the thin film transistors.

The thin film transistor having a structure A in FIG. 36A has an active layer formed of a single oxide semiconductor layer 606. It was assumed that the oxide semiconductor layer 606 was an In—Ga—Zn—O-based non-single-crystal film with a thickness of 50 nm, the electron intrinsic mobility thereof was 20 cm$^2$/Vs, the band gap (Eg) was 3.05 eV, and the electron affinity ($\chi$) was 4.3 eV.

The thin film transistor having a structure B in FIG. 36B has an active layer having a layered structure of an oxide semiconductor layer 616 and an oxide semiconductor layer 613 containing insulating oxide, which is formed over the oxide semiconductor layer 616. It was assumed that the oxide semiconductor layer 613 containing insulating oxide was an In—Ga—Zn—O-based non-single-crystal film which contains silicon oxide and had a thickness of 25 nm, and the electron intrinsic mobility thereof was 2 cm$^2$/Vs. Since the In—Ga—Zn—O-based non-single-crystal film contained silicon oxide, the electron intrinsic mobility thereof was low. It was also assumed that the oxide semiconductor layer 616 was an In—Ga—Zn—O-based non-single-crystal film with a thickness of 25 nm, and the electron intrinsic mobility thereof was 20 cm$^2$/Vs. It was also assumed that the oxide semiconductor layer 613 containing insulating oxide and the oxide semiconductor layer 616 each had a band gap (Eg) of 3.05 eV and an electron affinity ($\chi$) of 4.3 eV.

The thin film transistor having a structure C in FIG. 36C has an active layer having a layered structure of an oxide semiconductor layer 626 and an oxide semiconductor layer 623 containing insulating oxide, which is formed over the oxide semiconductor layer 626. It is to be noted that the oxide semiconductor layer 623 containing insulating oxide of the structure C contains a larger amount of silicon oxide than the oxide semiconductor layer 613 containing insulating oxide of the structure B. It was assumed that the oxide semiconductor layer 623 containing insulating oxide was an In—Ga—Zn—O-based non-single-crystal film which contains silicon oxide and had a thickness of 25 nm, and the electron intrinsic mobility thereof was 0.2 cm$^2$/Vs. Since the In—Ga—Zn—O-based non-single-crystal film contained a large amount of silicon oxide as compared to the structure B, the electron intrinsic mobility thereof was lower than that in the structure B. It was also assumed that the oxide semiconductor layer 626 was an In—Ga—Zn—O-based non-single-crystal film with a thickness of 25 nm, and the electron intrinsic mobility thereof was 20 cm$^2$/Vs. It was also assumed that the oxide semiconductor layer 623 containing insulating oxide and the oxide semiconductor layer 626 each had a band gap (Eg) of 3.05 eV and an electron affinity ($\chi$) of 4.3 eV.

As for carriers (electrons) generated due to oxygen vacancy or entry of hydrogen in steps of etching, deposition, and the like, the carrier densities were assumed to be $5 \times 10^{16}$ cm$^{-3}$, $1 \times 10^{17}$ cm$^{-3}$, $2.5 \times 10^{17}$ cm$^{-3}$, $5 \times 10^{17}$ cm$^{-3}$, and $1 \times 10^{18}$ cm$^{-3}$ at a depth of 5 nm from a surface of the back channel of each of the thin film transistors, and the threshold voltages in the cases of respective carrier densities were calculated by calculator simulation.

Note that a device simulation soft "Atlas" manufactured by Silvaco Data Systems Inc. was used for calculation of the models. An off current was calculated using a model of tunneling between bands.

Figure 37:
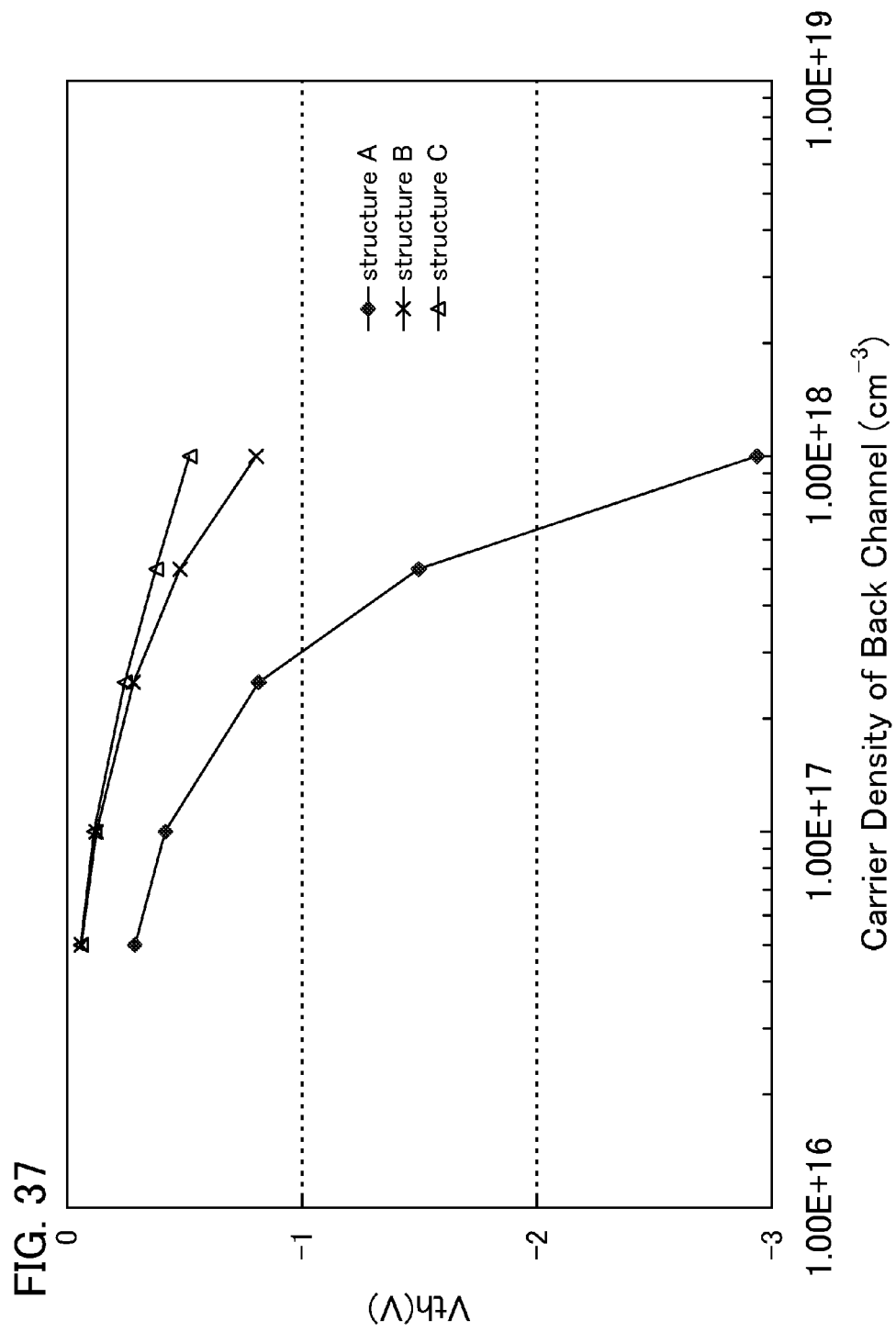
FIG. 37 shows threshold voltages of thin film transistors obtained by the simulation.

FIG. 37 shows the dependence of threshold voltages on carrier densities of back channels of the thin film transistors having the structures in FIGS. 36A to 36C. In FIG. 37, the vertical axis represents the threshold voltages (Vth [V]) of the thin film transistors having the structures and the horizontal axis represents carrier densities (cm$^{-3}$) generated in back channels of active layers of the structures.

In the calculations, the threshold voltages (Vth [V]) of the thin film transistors are defined by contacts between a Vg axis and a tangent line having the highest inclination of square roots of drain currents (Id$^{1/2}$) in a graph where gate voltages (Vg [V]) and Id$^{1/2}$ are plotted on the horizontal axis and the vertical axis, respectively.

As shown in FIG. 37, in the case of the thin film transistor having the structure A, as the carrier density of the back channel is increased, the absolute value of the threshold voltage is also increased. The threshold voltage of the structure A is shifted by about 3 V when the carrier density of the back channel is changed from $5 \times 10^{16}$ cm$^{-3}$ to $1 \times 10^{18}$ cm$^{-3}$.

As compared to the structure A, in the case of the structure B where the active layer has a layered structure of the oxide semiconductor layer 616 and the oxide semiconductor layer 613 containing insulating oxide, an increase in absolute value of the threshold voltage with respect to the carrier density of the back channel is small. The threshold voltage of the structure B is shifted by only 1 V or lower when the carrier densities of the back channel is changed from $5 \times 10^{16}$ cm$^{-3}$ to $1 \times 10^{18}$ cm$^{-3}$.

In the case of the structure C where the oxide semiconductor layer 623 containing insulating oxide contains larger amount of silicon oxide than the oxide semiconductor layer containing insulating oxide of the structure B, an increase in absolute value of the threshold voltage with respect to the carrier density of the back channel is smaller than that of the structure B. The threshold voltage of the structure C is shifted by only about 0.5 V when the carrier densities of the back channel is changed from $5 \times 10^{16}$ cm$^{-3}$ to $1 \times 10^{18}$ cm$^{-3}$.

Figure 38:
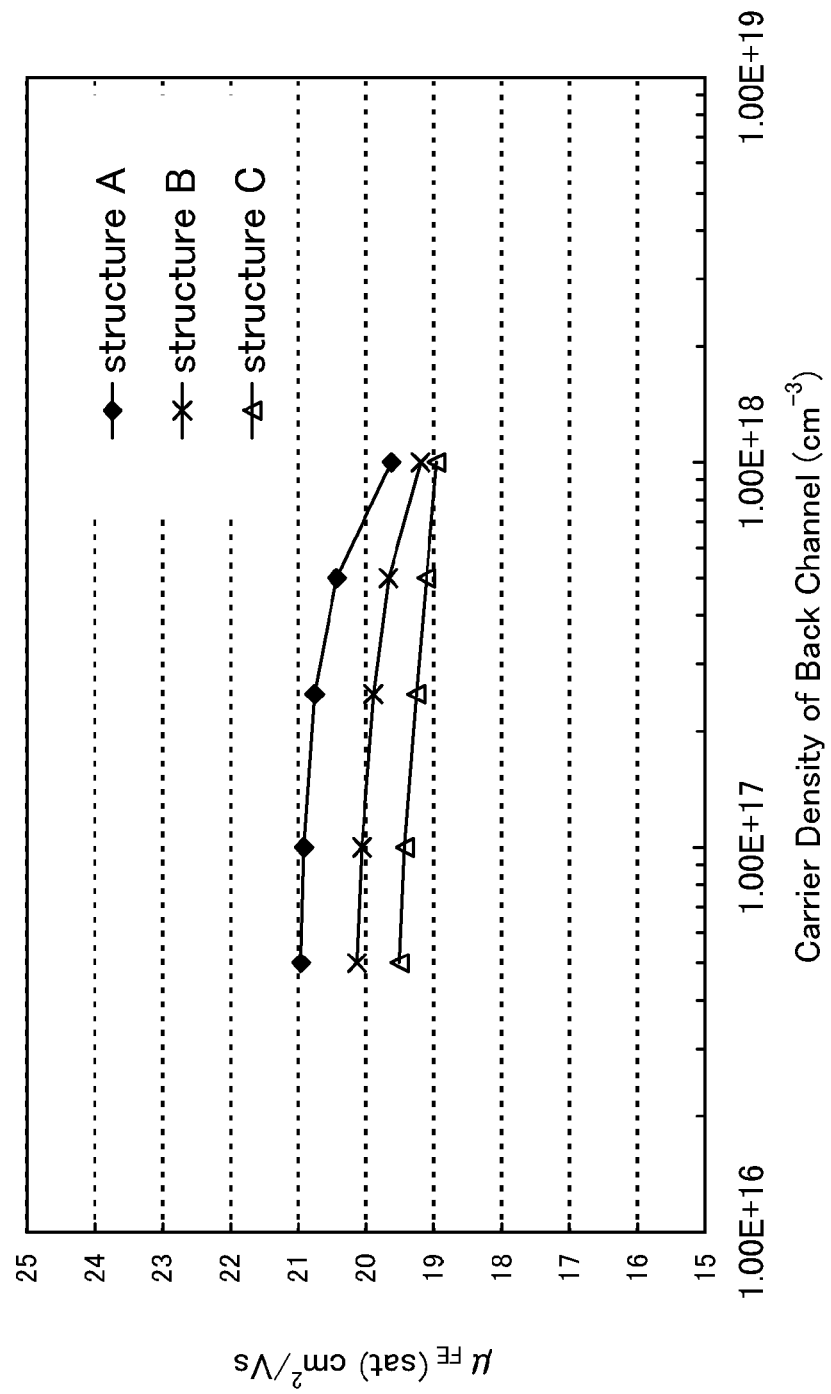
FIG. 38 shows saturation mobilities of thin film transistors obtained by the simulation.

Further, FIG. 38 shows the dependence of saturation mobilities on carrier densities of back channels of the thin film transistors having the structures in FIGS. 36A to 36C. The vertical axis represents the saturation mobilities ($\mu_{FE}$(sat) [cm$^2$/Vs]) of the thin film transistors having the structures and the horizontal axis represents carrier densities (cm$^{-3}$) generated in the back channels of the active layers of the structures.

According to FIG. 38, the thin film transistors having the structure B and the structure C each have a saturation mobility substantially equivalent to that of the transistor having the structure A. Therefore, even when an oxide semiconductor layer containing insulating oxide with low electron intrinsic mobility is stacked and thus variation in threshold voltage due to carriers of a back channel is reduced, the saturation mobility and the on current of a thin film transistor can be held.

As described above, an active layer of a thin film transistor is formed to have a layered structure of an oxide semiconductor layer containing insulating oxide and an oxide semiconductor layer, so that variation in threshold voltage due to carriers of a back channel can be reduced without the saturation mobility of the thin film transistor reduced. Therefore, a thin film transistor having an active layer formed by stacking an oxide semiconductor layer containing insulating oxide and an oxide semiconductor layer is used for a pixel portion of an image display device, whereby variation in threshold voltage of switching transistors can be reduced and thus variation in luminance between pixels can be reduced.

Figure 12A:
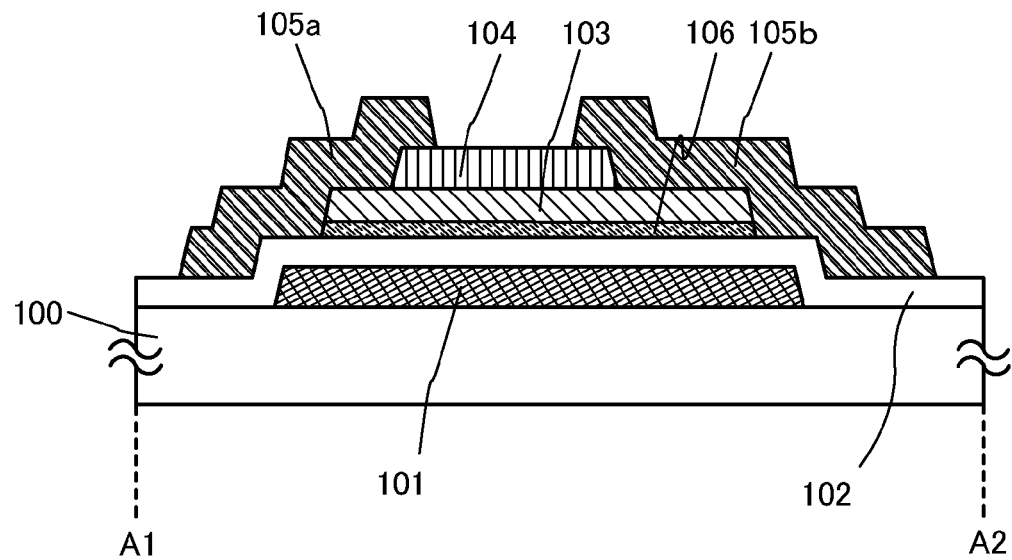
FIGS. 12A and 12B illustrate a semiconductor device according to an embodiment of the present invention.
Figure 12B:
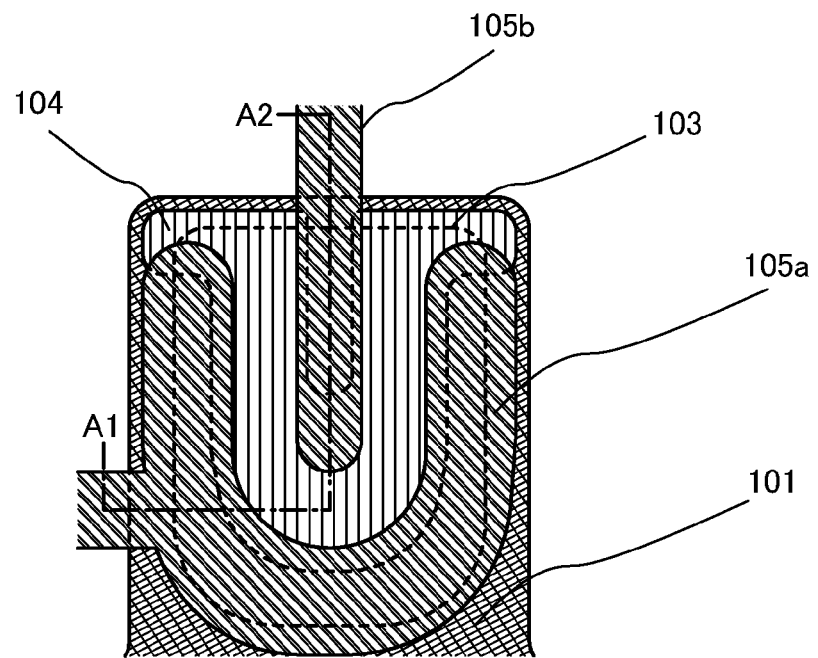

In addition, without limitation to the thin film transistor having an inverted staggered structure illustrated in FIGS. 1A and 1B, a thin film transistor having an inverted staggered structure in which a channel protective layer 104 is provided over the oxide semiconductor layer 103 containing insulating oxide illustrated in FIGS. 12A and 12B may be employed. Note that FIG. 12A is a cross-sectional view taken along line A1-A2 in FIG. 12B. For the channel protective layer 104, an inorganic material (such as silicon oxide, silicon nitride, silicon oxynitride, or silicon nitride oxide) which is deposited by a sputtering method or a vapor phase growth method such as a plasma CVD method or a thermal CVD method can be used.

The structure in which the channel protective layer 104 is provided over the oxide semiconductor layer 103 containing insulating oxide can prevent damage to the channel formation region of the oxide semiconductor layer 103 containing insulating oxide (for example, oxidation or reduction in film thickness due to plasma or an etchant in etching at the formation of the oxide semiconductor layer containing insulating oxide) in the manufacturing process. Therefore, reliability of the thin film transistor can be improved. Note that the thin film transistor illustrated in FIGS. 12A and 12B has the same structure as the thin film transistor illustrated in FIGS. 1A and 1B except that the channel protective layer 104 is formed over the oxide semiconductor layer 103 containing insulating oxide, and reference numerals in FIGS. 12A and 12B are the same as those used for the thin film transistor illustrated in FIGS. 1A and 1B.

Figure 30A:
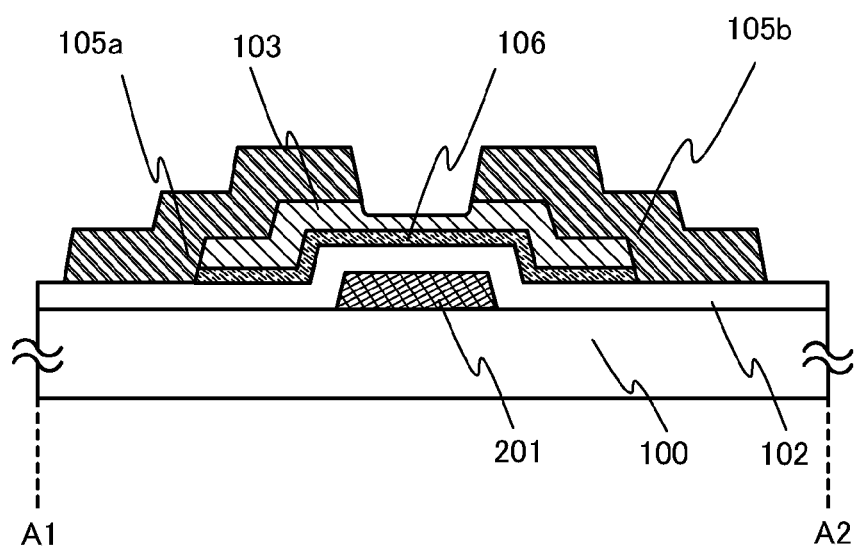
FIGS. 30A and 30B illustrate a semiconductor device according to an embodiment of the present invention.
Figure 30B:
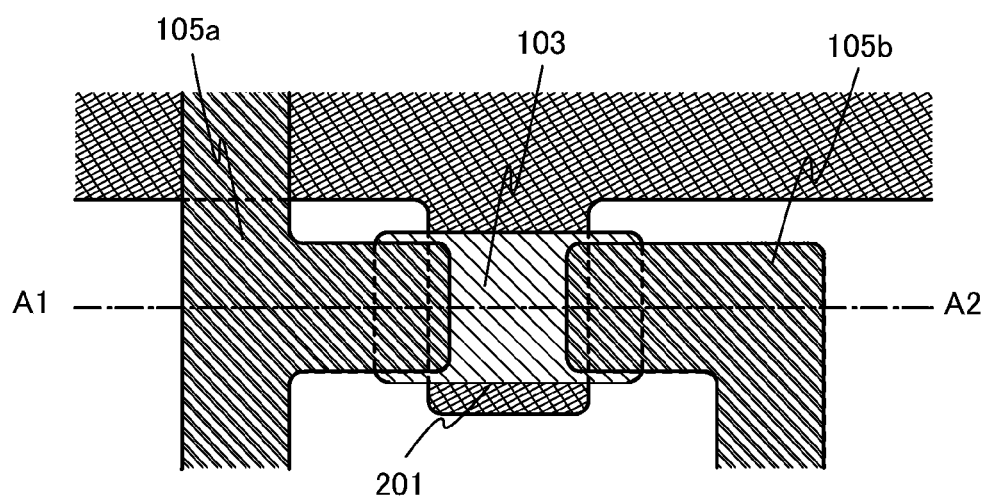

Further, although the thin film transistor having an inverted staggered structure illustrated in FIGS. 1A and 1B has the gate electrode layer 101 having a width in a channel direction, which is larger than that of either the oxide semiconductor layer 103 containing insulating oxide or the oxide semiconductor layer 106, the thin film transistor described in this embodiment is not limited thereto. As illustrated in FIGS. 30A and 30B, a gate electrode layer 201 having a width in a channel direction, which is smaller than that of either the oxide semiconductor layer 103 containing insulating oxide or the oxide semiconductor layer 106, may be used. Note that FIG. 30A is a cross-sectional view taken along line A1-A2 in FIG. 30B. With such a structure, a distance between the gate electrode layer 201 and the source or drain electrode layer 105a or 105b is increased, so that an off current which directly flows from the source or drain electrode layer 105a or 105b to the oxide semiconductor layer 106 can be reduced. Thus, reliability of the thin film transistor can be improved. Note that except the gate electrode layer 201, reference numerals of parts of the thin film transistor illustrated in FIGS. 30A and 30B are the same as those used for the thin film transistor illustrated in FIGS. 1A and 1B.

Figure 31A:
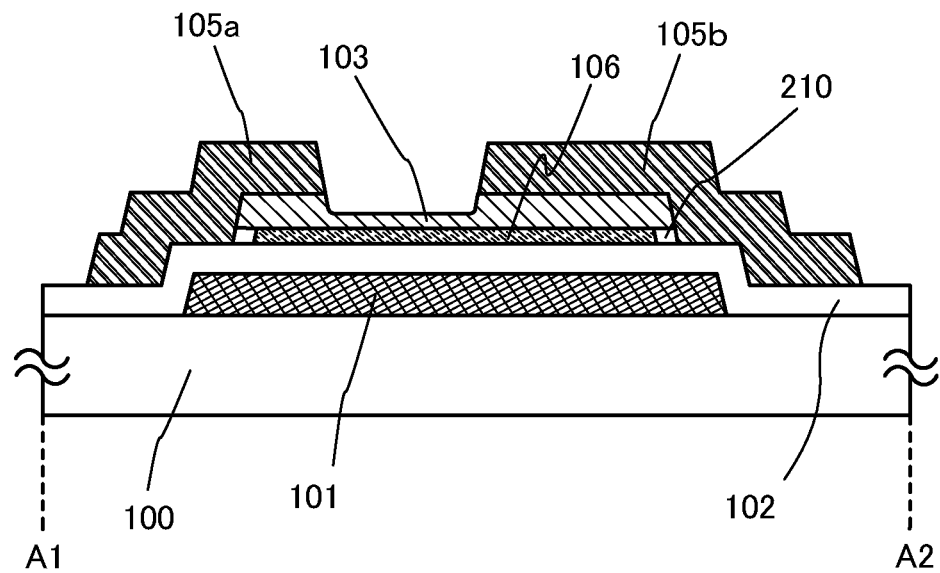
FIGS. 31A and 31B illustrate a semiconductor device according to an embodiment of the present invention.
Figure 31B:
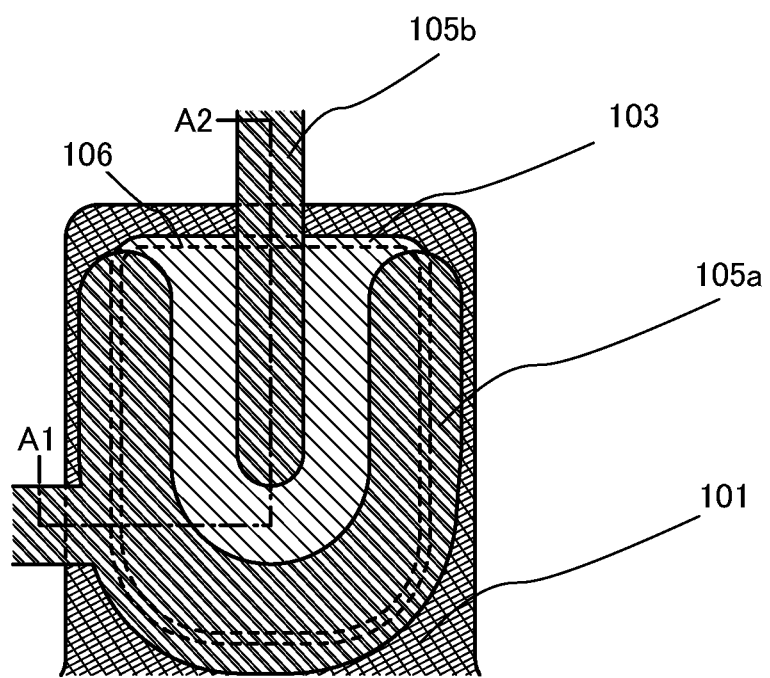

Further, in the thin film transistor having an inverted staggered structure illustrated in FIGS. 1A and 1B, the oxide semiconductor layer 106 is in contact with the source and drain electrode layers 105a and 105b at end portions of the oxide semiconductor layer 106; however, the thin film transistor described in this embodiment is not limited thereto. As illustrated in FIGS. 31A and 31B, the oxide semiconductor layer 106 may have a smaller area than the oxide semiconductor layer 103 containing insulating oxide and hollows 210 may be formed under end portions of the oxide semiconductor layer 103 containing insulating oxide. The hollows 210 are formed so as to be surrounded by the oxide semiconductor layer 106, the oxide semiconductor layer 103 containing insulating oxide, the source and drain electrode layers 105a and 105b, and the gate insulating layer 102. Note that the hollows 210 are formed by a protective insulating layer over the thin film transistor instead of the source and drain electrode layers 105a and 105b in a portion where the source and drain electrode layers 105a and 105b are not provided over the oxide semiconductor layer 106. The hollows 210 can be easily formed by utilizing the fact that the wet etching rate of the oxide semiconductor layer 103 containing insulating oxide is lower than that of the oxide semiconductor layer 106. With such a structure, the oxide semiconductor layer 106 is not in direct contact with the source and drain electrode layers 105a and 105b, so that an off current which directly flows from the source or drain electrode layer 105a or 105b to an end portion of the oxide semiconductor layer 106 can be reduced. Thus, reliability of the thin film transistor can be improved. Note that the thin film transistor illustrated in FIGS. 31A and 31B has the same structure as the thin film transistor illustrated in FIGS. 1A and 1B except that the hollows 210 are formed under the end portions of the oxide semiconductor layer 103 containing insulating oxide, and reference numerals in FIGS. 31A and 31B are the same as those used for the thin film transistor illustrated in FIGS. 1A and 1B.

Figure 32A:
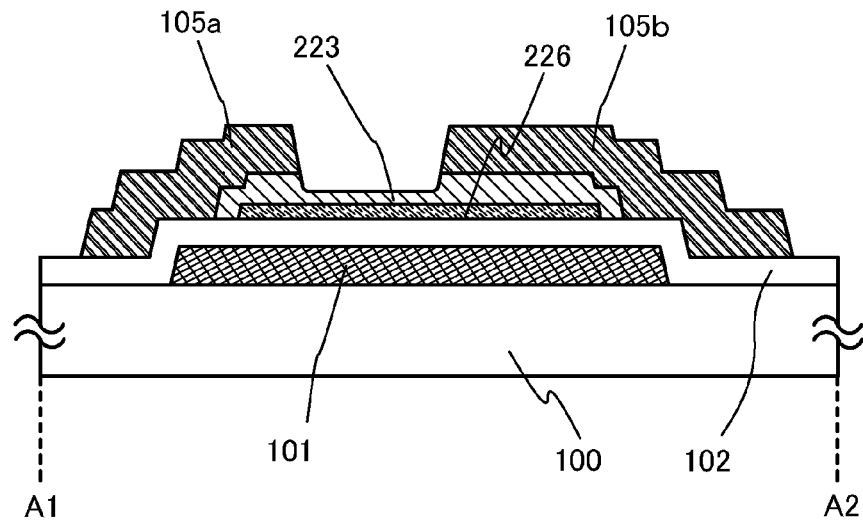
FIGS. 32A and 32B illustrate a semiconductor device according to an embodiment of the present invention.
Figure 32B:
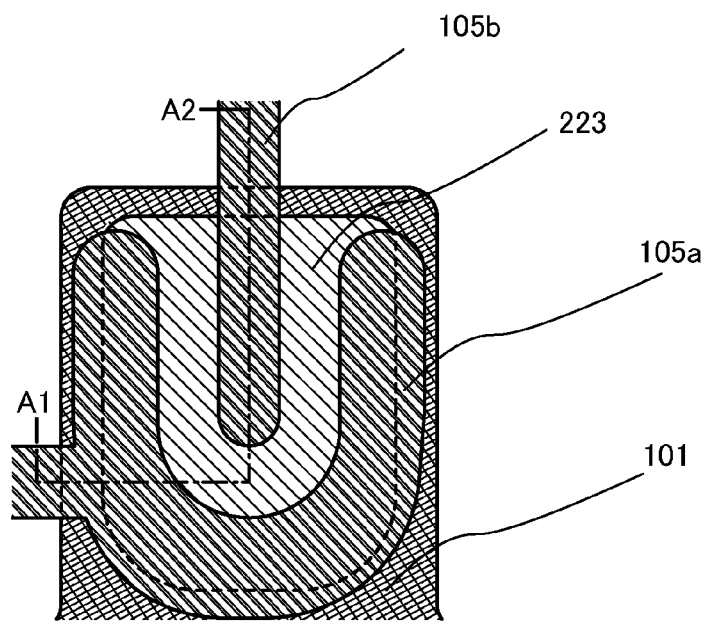

Further, as illustrated in FIGS. 32A and 32B, end portions of an oxide semiconductor layer 226 may be covered with an oxide semiconductor layer 223 containing insulating oxide. Note that FIG. 32A is a cross-sectional view taken along line A1-A2 in FIG. 32B. With such a structure, the oxide semiconductor layer 226 is not in direct contact with the source and drain electrode layers 105a and 105b, so that an off current which directly flows from the source or drain electrode layer 105a or 105b to an end portion of the oxide semiconductor layer 226 can be reduced. Thus, reliability of the thin film transistor can be improved. Note that the thin film transistor illustrated in FIGS. 32A and 32B has the same structure as the thin film transistor illustrated in FIGS. 1A and 1B except that the end portions of the oxide semiconductor layer 226 are covered with the oxide semiconductor layer 223 containing insulating oxide, and reference numerals in FIGS. 32A and 32B are the same as those used for the thin film transistor illustrated in FIGS. 1A and 1B.

Figure 33A:
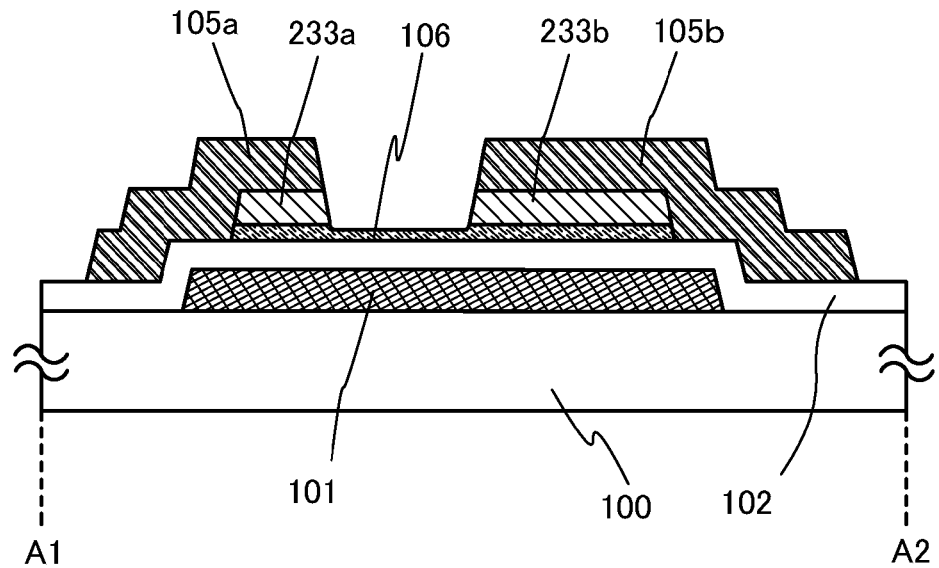
FIGS. 33A and 33B illustrate a semiconductor device according to an embodiment of the present invention.
Figure 33B:
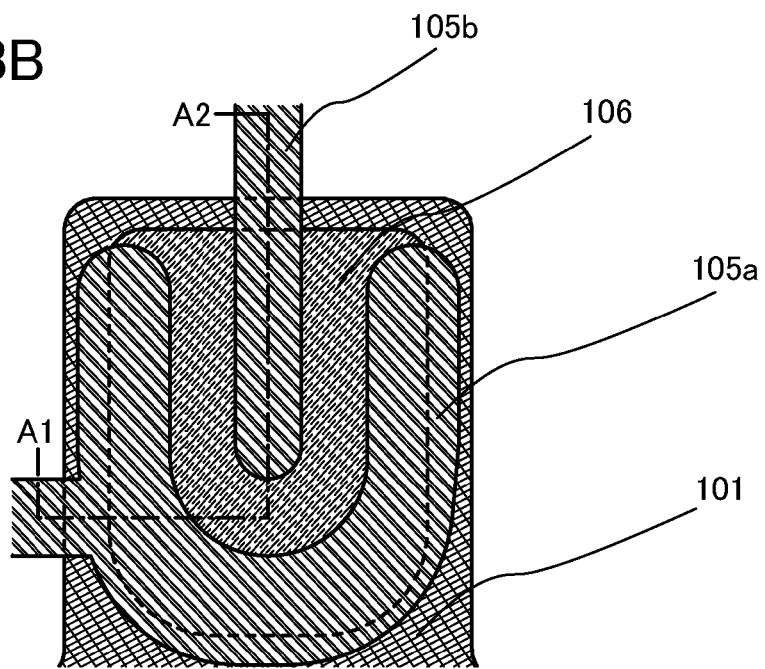

Further, in the thin film transistor having an inverted staggered structure illustrated in FIGS. 1A and 1B, the oxide semiconductor layer 103 containing insulating oxide is formed between the source and drain electrode layers 105a and 105b so as to cover the oxide semiconductor layer 106; however, the thin film transistor described in this embodiment is not limited thereto. As illustrated in FIGS. 33A and 33B, an oxide semiconductor layer containing insulating oxide between the source and drain electrode layers 105a and 105b may be etched to form oxide semiconductor layers 233a and 233b so that the oxide semiconductor layer 106 is exposed. Note that FIG. 33A is a cross-sectional view taken along line A1-A2 in FIG. 33B. Further, the oxide semiconductor layer 106 may have a region which is between the oxide semiconductor layers 233a and 233b each containing insulating oxide and whose thickness is smaller than that of a region overlapped with the oxide semiconductor layer 233a or 233b containing insulating oxide. With such a structure, a channel formation region can be formed only in the oxide semiconductor layer 106 which generally has higher conductance than the oxide semiconductor layers 233a and 233b each containing insulating oxide; therefore, an off current can be reduced due to the oxide semiconductor layers 233a and 233b each containing insulating oxide and an S value (subthreshold swing) can be reduced. Thus, reliability of the thin film transistor can be improved. Note that the thin film transistor illustrated in FIGS. 33A and 33B has the same structure as the thin film transistor illustrated in FIGS. 1A and 1B except that the oxide semiconductor layers 233a and 233b each containing insulating oxide are separated to be on the source electrode side and the drain electrode side, and reference numerals in FIGS. 33A and 33B are the same as those used for the thin film transistor illustrated in FIGS. 1A and 1B.

Thus, the thin film transistor is formed by stacking the oxide semiconductor layer containing insulating oxide over the oxide semiconductor layer so that the oxide semiconductor layer and the source and drain electrode layers are in contact with each other with the oxide semiconductor layer containing insulating oxide interposed therebetween. Accordingly, variation in threshold voltage of the thin film transistors can be reduced and thus the electric characteristics can be stabilized. Further, an off current can be reduced.

Note that the structure described in this embodiment can be used in combination with any of the structures described in the other embodiments, as appropriate. Further, any of the structures described in this embodiment can be used in combination with each other, as appropriate.

Embodiment 2

In this embodiment, a manufacturing process of a display device including the thin film transistor described in Embodiment 1 is described with reference to FIGS. 2A to 2C, FIGS. 3A to 3C, FIG. 4, FIG. 5, FIG. 6, FIG. 7, FIGS. 8A1, 8A2, 8B1 and 8B2, and FIG. 9. FIGS. 2A to 2C and FIGS. 3A to 3C are cross-sectional views, and FIG. 4, FIG. 5, FIG. 6, FIG. 7, and FIG. 9 are plan views. Line A1-A2 and line B1-B2 in FIG. 4, FIG. 5, FIG. 6, FIG. 7, and FIG. 9 correspond to line A1-A2 and line B1-B2 in the cross-sectional views of FIGS. 2A to 2C and FIGS. 3A to 3C, respectively.

First, the substrate 100 is prepared. As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance high enough to withstand a process temperature of this manufacturing process; and the like. Alternatively, a metal substrate such as a stainless steel alloy substrate, which is provided with an insulating film over its surface, may be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

In addition, an insulating film as a base film may be formed over the substrate 100. The base film may be formed to have a single-layer structure or a layered structure of any of a silicon oxide film, a silicon nitride film, a silicon oxynitride film, and a silicon nitride oxide film by a CVD method, a sputtering method, or the like. In the case where a substrate containing mobile ions, such as a glass substrate, is used as the substrate 100, a film containing nitrogen such as a silicon nitride film or a silicon nitride oxide film is used as the base film, whereby the mobile ions can be prevented from entering the oxide semiconductor layer.

Next, a conductive film which is provided to form a gate wiring including the gate electrode layer 101, a capacitor wiring 108, and a first terminal 121 is formed over the entire surface of the substrate 100 by a sputtering method or a vacuum evaporation method. Next, a photolithography process is performed. That is, a resist mask is formed, and unnecessary portions are removed by etching to form wirings and an electrode (the gate wiring including the gate electrode layer 101, the capacitor wiring 108, and the first terminal 121). At that time, etching is preferably performed so that at least an end portion of the gate electrode layer 101 is tapered for prevention of breakage. A cross-sectional view at this stage is illustrated in FIG. 2A. Note that a plan view at this stage corresponds to FIG. 4.

The gate wiring including the gate electrode layer 101, the capacitor wiring 108, and the first terminal 121 in a terminal portion can be formed to have a single-layer structure or a layered structure using any of the conductive materials described in Embodiment 1.

Here, the gate electrode layer 101 may be formed so that the width in a channel direction of the gate electrode layer 101 is smaller than that of either the oxide semiconductor layer 103 containing insulating oxide or the oxide semiconductor layer 106 which is to be formed in a later step. By forming the gate electrode layer 101 in this manner, a thin film transistor illustrated in FIGS. 30A and 30B can be formed. In the case of the thin film transistor illustrated in FIGS. 30A and 30B, the distance between the gate electrode layer 201 and the source or drain electrode layer 105a or 105b is increased, so that an off current which directly flows from the source or drain electrode layer 105a or 105b to the oxide semiconductor layer 106 can be reduced.

Next, a gate insulating layer 102 is formed over an entire surface of the gate electrode layer 101. The gate insulating layer 102 is formed to a thickness of 50 nm to 250 nm by a CVD method, a sputtering method, or the like.

For example, the gate insulating layer 102 is formed using a silicon oxide film to a thickness of 100 nm by a CVD method or a sputtering method. Needless to say, the gate insulating layer 102 is not limited to such a silicon oxide film. The gate insulating layer 102 may be formed to have a single-layer structure or a layered structure using another insulating film such as a silicon oxynitride film, a silicon nitride oxide film, a silicon nitride film, an aluminum oxide film, or a tantalum oxide film.

Alternatively, as the gate insulating layer 102, a silicon oxide layer can be formed by a CVD method using an organosilane gas. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Alternatively, the gate insulating layer 102 may be formed using one kind of oxide, nitride, oxynitride, or nitride oxide of aluminum, yttrium, or hafnium; or a compound including at least two or more kinds of the above compounds.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by RBS (Rutherford Backscattering Spectrometry) and HFS (Hydrogen Forward Scattering Spectrometry). Further, a "silicon nitride oxide film" means a film that contains more nitrogen atoms than oxygen atoms, and oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 atomic %.

Note that before an oxide semiconductor film which is provided to form the oxide semiconductor layer 106 is formed, reverse sputtering by which plasma is generated by introduction of an argon gas into a chamber where the substrate 100 is placed is preferably performed to remove dust attached to a surface of the gate insulating layer. Further, by reverse sputtering, planarity of the surface of the gate insulating layer 102 can be improved. The reverse sputtering refers to a method in which without application of a voltage to the target side, an RF power source is used for application of a voltage to the substrate side in an argon atmosphere to produce plasma so that a substrate surface is modified. Note that instead of an argon atmosphere, a nitrogen atmosphere, a helium atmosphere, or the like may be used. Alternatively, an argon atmosphere to which oxygen, $N_2O$, or the like is added may be used. Alternatively, an argon atmosphere to which $Cl_2$, $CF_4$, or the like is added may be used. After the reverse sputtering, a first oxide semiconductor film is formed without exposure to the air, whereby dust or moisture can be prevented from attaching to an interface between the gate insulating layer 102 and the oxide semiconductor layer 106.

Next, the first oxide semiconductor film which is provided to form the oxide semiconductor layer 106 is formed over the gate insulating layer 102 by a sputtering method in an atmosphere of a rare gas such as an argon gas and an oxygen gas. In that case, by performing deposition under the condition that the flow rate of a rare gas such as an argon gas is higher than that of an oxygen gas or performing deposition in an atmosphere of only a rare gas such as an argon gas without using an oxygen gas, conductivity of the oxide semiconductor layer 106 can be increased. As the first oxide semiconductor film, the oxide semiconductor described in Embodiment 1 can be used. Specifically, for example, deposition is performed by sputtering with the use of an oxide semiconductor target containing In, Ga, and Zn ($In_2O_3$:$Ga_2O_3$:ZnO=1:1:1) of 8 inches in diameter, under the conditions that the distance between the substrate and the target is 170 mm, the pressure is 0.4 Pa, the direct-current (DC) power is 0.5 kW, the deposition gases are Ar and $O_2$ (Ar:$O_2$=30:15 (sccm)), and the deposition temperature is room temperature. Further, as the target, $Ga_2O_3$ and ZnO in a pellet state may be disposed on a disk of 8 inches in diameter which contains $In_2O_3$. Note that a pulsed direct-current (DC) power source is preferably used because dust can be reduced and the thickness distribution can be uniform. The thickness of the first oxide semiconductor film is set to 10 nm to 300 nm, preferably 20 nm to 100 nm.

Next, a second oxide semiconductor film which is provided to form the oxide semiconductor layer 103 containing insulating oxide is formed over the first oxide semiconductor film without exposure to the air by a sputtering method in an atmosphere of a rare gas such as an argon gas and an oxygen gas. Here, as the insulating oxide, silicon oxide is preferable. In that case, by performing deposition under the condition that the flow rate of an oxygen gas is high, conductivity of the semiconductor layer 103 containing insulating oxide can be reduced. As the second oxide semiconductor film, the oxide semiconductor described in Embodiment 1 can be used. When the second oxide semiconductor film is formed, it is preferable to use an oxide semiconductor target containing $SiO_2$ at from 0.1% by weight to 30% by weight, preferably at from 1% by weight to 10% by weight. Specifically, for example, deposition is performed by sputtering with the use of an oxide semiconductor target of 8 inches in diameter which contains In, Ga, and Zn ($In_2O_3$:$Ga_2O_3$:ZnO=1:1:1) and contains $SiO_2$ at 2% by weight, under the conditions that the distance between the substrate and the target is 170 mm, the pressure is 0.4 Pa, the direct-current (DC) power is 0.5 kW, the deposition gases are Ar and $O_2$ (Ar:$O_2$=30:15 (sccm)), and the deposition temperature is room temperature. Further, as the target, $SiO_2$, $Ga_2O_3$, and ZnO in a pellet state may be disposed on a disk of 8 inches in diameter which contains $In_2O_3$. Note that a pulsed direct-current (DC) power source is preferably used because dust can be reduced and the thickness distribution can be uniform. The thickness of the second oxide semiconductor film is set to 10 nm to 300 nm, preferably 20 nm to 100 nm.

The second oxide semiconductor film is made to contain insulating oxide such as silicon oxide, whereby the oxide semiconductor to be formed is made amorphous easily. In addition, in the case where the oxide semiconductor is subjected to heat treatment, the oxide semiconductor can be prevented from being crystallized.

A chamber used for film formation of the first oxide semiconductor film and the second oxide semiconductor film may be the same as or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus which is provided with a magnet system inside the chamber and is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which a voltage is also applied to a substrate during deposition.

Next, a photolithography process is performed. That is, a resist mask is formed, and the first oxide semiconductor film and the second oxide semiconductor film are etched. In the etching, organic acid such as citric acid or oxalic acid can be used for an etchant. Here, the first oxide semiconductor film and the second oxide semiconductor film are etched by wet etching with the use of ITO-07N (manufactured by Kanto Chemical Co., Inc.) to remove an unnecessary portion. Thus, the first oxide semiconductor film and the second oxide semiconductor film are processed to have island shapes, whereby the oxide semiconductor layer 106 and an oxide semiconductor layer 111 containing insulating oxide are formed. The end portions of the oxide semiconductor layer 106 and the oxide semiconductor layer 111 containing insulating oxide are etched to have tapered shapes, whereby breakage of a wiring due to a step shape can be prevented. The cross-sectional view at this stage is illustrated in FIG. 2B. Note that a plan view at this stage corresponds to FIG. 5.

Here, the wet etching rate of the second oxide semiconductor film containing insulating oxide such as silicon oxide is lower than that of the first oxide semiconductor film. In the case where the first oxide semiconductor film and the second oxide semiconductor film are stacked and subjected to wet etching, side etching proceeds so that end portions of the first oxide semiconductor film are on the inner side than those of the second oxide semiconductor film. Therefore, as illustrated in FIG. 31A, the end portions of the oxide semiconductor layer 106 are on the inner side than those of the oxide semiconductor layer 111 containing insulating oxide, and thus hollows 210 are formed under the end portions of the oxide semiconductor layer 111 containing insulating oxide. Accordingly, source and drain electrode layers 105a and 105b can be prevented from being in contact with the end portions of the oxide semiconductor layer 106 when the source and drain electrode layers 105a and 105b are formed in a later step, so that a current can be prevented from flowing directly between the source and drain electrode layers 105a and 105b and the end portions of the oxide semiconductor layer 106.

Further, in this embodiment, after the first oxide semiconductor film and the second oxide semiconductor film are formed to be stacked, the oxide semiconductor layer 106 and the oxide semiconductor layer 111 containing insulating oxide are formed by a photolithography process; however, this embodiment is not limited thereto. After the first oxide semiconductor film is formed and the oxide semiconductor layer 106 is formed by photolithography, the second oxide semiconductor film may be formed and the oxide semiconductor layer 111 containing insulating oxide may be formed by photolithography. In that case, as illustrated in FIGS. 32A and 32B, a structure is employed in which the oxide semiconductor layer 111 containing insulating oxide (oxide semiconductor layer 223 containing insulating oxide) covers the oxide semiconductor layer 106 (oxide semiconductor layer 226). Accordingly, the source and drain electrode layers 105a and 105b can be prevented from being in contact with the end portions of the oxide semiconductor layer 226 when the source and drain electrode layers 105a and 105b are formed in a later step, so that a current can be prevented from flowing directly between the source and drain electrode layers 105a and 105b and the end portions of the oxide semiconductor layer 226.

Note that etching here is not limited to wet etching and may be dry etching. As an etching apparatus used for the dry etching, an etching apparatus using a reactive ion etching method (an RIE method) or a dry etching apparatus using a high-density plasma source such as ECR (electron cyclotron resonance) or ICP (inductively coupled plasma) can be used. As a dry etching apparatus by which uniform electric discharge can be performed over a large area as compared to an ICP etching apparatus, there is an ECCP (enhanced capacitively coupled plasma) mode etching apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be applied, for example, even when a substrate of the tenth generation with a side of larger than 3 m is used.

Next, a photolithography process is performed. That is, a resist mask is formed, and an unnecessary portion of the gate insulating layer 102 is removed by etching, whereby a contact hole that reaches the wiring or the electrode layer which is formed from the same material as the gate electrode layer 101 is formed. This contact hole is formed for direct connection with a conductive film to be formed later. For example, a contact hole is formed when a thin film transistor in which a connection to form a diode-connection by directly connecting the gate electrode layer t with the source or drain electrode layer in the driver circuit is formed or a terminal that is electrically connected to the gate wiring of the terminal portion is formed.

Next, over the oxide semiconductor layer 111 containing insulating oxide and the gate insulating layer 102, a conductive film 112 formed from a metal material is formed by a sputtering method or a vacuum evaporation method. FIG. 2C is a cross-sectional view at this stage.

The conductive film 112 can be formed to have a single-layer structure or a layered structure using the conductive material described in Embodiment 1. For example, in the conductive film 112, a first conductive layer and a third conductive layer may be formed using titanium that is a heat-resistant conductive material, and a second conductive layer may be formed using an aluminum alloy containing neodymium. The conductive film 112 has such a structure, whereby low resistance of aluminum is utilized and generation of hillocks can be reduced.

Next, a photolithography process is performed. That is, a resist mask 131 is formed, and unnecessary portions are removed by etching, whereby the source and drain electrode layers 105a and 105b, the oxide semiconductor layer 103 containing insulating oxide, and a connection electrode 120 are formed. Wet etching or dry etching is used as an etching method at that time. For example, when in the conductive film 112, the first and third conductive layers are formed using titanium and the second conductive layer is formed using an aluminum alloy containing neodymium, wet etching can be performed using a hydrogen peroxide solution, heated hydrochloric acid, or a nitric acid solution containing ammonium fluoride as an etchant. For example, the conductive film 112 including the first conductive layer, the second conductive layer, and the third conductive layer can be etched collectively with the use of KSMF-240 (manufactured by Kanto Chemical Co., Inc.). In this etching step, an exposed region of the oxide semiconductor layer 111 containing insulating oxide is also partly etched, so that formed is the oxide semiconductor layer 103 containing insulating oxide, which has a region which is between the source and drain electrode layers 105a and 105b and whose thickness is smaller than that of a region overlapped with the source or drain electrode layer 105a or 105b. Accordingly, a channel formation region of the oxide semiconductor layer 103 containing insulating oxide and the oxide semiconductor layer 106 overlaps with the small-thickness region of the oxide semiconductor layer 103 containing insulating oxide.

In FIG. 3A, the conductive film 112 and the oxide semiconductor layer 111 containing insulating oxide can be etched in one step; therefore, end portions of the source and drain electrode layers 105a and 105b and the oxide semiconductor layer 103 containing insulating oxide are aligned with each other, and a continuous structure can be formed. In addition, wet etching enables isotropical etching, so that the end portions of the source and drain electrode layers 105a and 105b are on the inner side than those of the resist mask 131. Through the aforementioned steps, a thin film transistor 170 which includes the oxide semiconductor layer 103 containing insulating oxide and the oxide semiconductor layer 106 as a channel formation region can be manufactured. A cross-sectional view at this stage is illustrated in FIG. 3A. Note that a plan view at this stage corresponds to FIG. 6.

At that time, not only the conductive film 112 and the oxide semiconductor layer 111 containing insulating oxide but the oxide semiconductor layer 106 may be etched. Thus, as illustrated in FIGS. 33A and 33B, the source and drain electrode layers 105a and 105b and oxide semiconductor layers 233a and 233b each containing insulating oxide may be formed. In this etching step, an exposed region of the oxide semiconductor layer 106 is also partly etched, so that the oxide semiconductor layer 106 has a region which is between the oxide semiconductor layers 233a and 233b each containing insulating oxide and whose thickness is smaller than that of a region overlapped with the oxide semiconductor layer 233a or 233b containing insulating oxide. Accordingly, a channel formation region of the oxide semiconductor layer 106 overlaps with the small-thickness region of the oxide semiconductor layer 106. With such a structure, the channel formation region can be formed only in the oxide semiconductor layer 106 which generally has higher conductance than the oxide semiconductor layers 233a and 233b each containing insulating oxide; therefore, in addition to the reduction of an off current due to the semiconductor layers 233a and 233b each containing insulating oxide, reduction of an S value (sub-threshold swing) can be achieved.

Further, in this photolithography process, a second terminal 122 formed using the same material as that of the source and drain electrode layers 105a and 105b is left in the terminal portion. Note that the second terminal 122 is electrically connected to a source wiring (a source wiring including the source or drain electrode layer 105a or 105b).

In addition, in the terminal portion, the connection electrode 120 is directly connected to the first terminal 121 of the terminal portion through a contact hole formed in the gate insulating layer 102. Note that although not illustrated here, a source or drain wiring of the thin film transistor of the driver circuit is directly connected to the gate electrode through steps the same as those describe above.

In the above photolithography process, two masks are necessary in a step where the conductive film 112 is etched to have an island shape and a step where the source and drain electrode layers 105a and 105b are formed. However, with the use of a resist mask having regions with plural thicknesses (typically, two different thicknesses), which is formed using a multi-tone (high-level grayscale) mask, the number of resist masks can be reduced, which results in a simplified process and lower cost. A photolithography process using a multi-tone mask is described with reference to FIGS. 35A and 35B.

First, from the state of FIG. 2A, the gate insulating layer 102, the first oxide semiconductor film, the second oxide semiconductor film, and the conductive film 112 are formed by the above method. Then, a resist mask 132 having regions with a plurality of different thicknesses, which is illustrated in FIG. 35A, is formed over the conductive film 112 by light exposure using a multi-tone (high-level grayscale) mask with which transmitted light has a plurality of intensities. The resist mask 132 has a small thickness in a region that overlaps part of the gate electrode layer 101. Next, the first oxide semiconductor film, the second oxide semiconductor film, and the conductive film 112 are etched and processed to have an island shape with the use of the resist mask 132, so that the oxide semiconductor layer 106, an oxide semiconductor layer 143 containing insulating oxide, a conductive layer 115, and a second terminal 124 are formed. A cross-sectional view at this stage corresponds to FIG. 35A.

Next, the resist mask 132 is subjected to ashing to form the resist mask 131. As illustrated in FIG. 35B, the resist mask 131 is reduced in area and thickness by ashing, and the region thereof having a small thickness is removed.

Finally, the oxide semiconductor layer 143 containing insulating oxide, the conductive layer 115, and the second terminal 124 are etched using the resist mask 131 to form the oxide semiconductor layer 103 containing insulating oxide, the source and drain electrode layers 105a and 105b, and the second terminal 122. The resist mask 131 is reduced in area, whereby the oxide semiconductor layer 103 containing insulating oxide, the source and drain electrode layers 105a and 105b, and the end portions of the second terminal 122 are also etched. A cross-sectional view at this stage corresponds to FIG. 35B. Note that after a protective insulating layer 107 is formed in a subsequent step, the gate insulating layer 102 and the protective insulating layer 107 are etched to form a contact hole, and a transparent conductive film is formed to connect the first terminal 121 and an FPC to each other. Thus, the thin film transistor 170 can be manufactured using a multi-tone mask.

Next, after the resist mask 131 is removed, heat treatment (including light annealing) is preferably performed at 200° C. to 600° C., typically, 250° C. to 500° C. Here, heat treatment is performed in a furnace where the treatment atmosphere is an air atmosphere and the treatment temperature is 350° C. for an hour. By this heat treatment, the rearrangement of the oxide semiconductor layer 103 containing insulating oxide and the oxide semiconductor layer 106 at the atomic level is achieved. Further, due to containing insulating oxide such as silicon oxide, the oxide semiconductor layer 103 containing insulating oxide can be prevented from being crystallized due to this heat treatment and can maintain an amorphous structure. Note that there is no particular limitation on the timing of heat treatment as long as it is performed after formation of the oxide semiconductor layer 103 containing insulating oxide, and, for example, heat treatment may be performed after formation of a pixel electrode.

Further, the exposed channel formation region of the oxide semiconductor layer 103 containing insulating oxide may be subjected to oxygen radical treatment. By oxygen radical treatment, the thin film transistor can be normally off. In addition, the radical treatment can repair damage due to the etching of the oxide semiconductor layer 103 containing insulating oxide. The radical treatment is preferably performed in an atmosphere of $O_2$ or $N_2O$, and preferably in an atmosphere of $N_2$, He, or Ar each containing oxygen. Alternatively, the radical treatment may be performed in an atmosphere in which $Cl_2$ and $CF_4$ are added to the above atmosphere. Note that the radical treatment is preferably performed with no bias applied.

Next, a protective insulating layer 107 is formed to cover the thin film transistor 170. As the protective insulating layer 107, a silicon nitride film, a silicon oxide film, a silicon oxynitride film, an aluminum oxide film, a tantalum oxide film, or the like which is obtained by a sputtering method or the like can be used.

Next, a photolithography process is performed. That is, a resist mask is formed and the protective insulating layer 107 is etched to form a contact hole 125 reaching the source or drain electrode layer 105b. In addition, by this etching, a contact hole 127 reaching the second terminal 122 and a contact hole 126 reaching the connection electrode 120 are also formed. A cross-sectional view at this stage is illustrated in FIG. 3B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed using a hydrochloric acid based solution. Instead, because a residue tends to be generated particularly in etching of ITO, an alloy of indium oxide and zinc oxide ($In_2O_3$—ZnO) may be used in order to improve etching processability.

Next, a photolithography process is performed. That is, a resist mask is formed and an unnecessary portion is removed by etching to form a pixel electrode layer 110.

In this photolithography process, a storage capacitor is formed with the capacitor wiring 108 and the pixel electrode layer 110, in which the gate insulating layer 102 and the protective insulating layer 107 in the capacitor portion are used as a dielectric.

In addition, in this photolithography process, the first terminal 121 and the second terminal 122 are covered with the resist mask, and transparent conductive films 128 and 129 formed in the terminal portion are left. The transparent conductive films 128 and 129 serve as electrodes or wirings that are used for connection with an FPC. The transparent conductive film 128 formed over the connection electrode 120 which is directly connected to the first terminal 121 is a connection terminal electrode which functions as an input terminal of the gate wiring. The transparent conductive film 129 formed over the second terminal 122 is a connection terminal electrode which functions as an input terminal of the source wiring.

Then, the resist mask is removed. A cross-sectional view at this stage is illustrated in FIG. 3C. Note that a plan view at this stage corresponds to FIG. 7.

FIGS. 8A1 and 8A2 are a cross-sectional view of a gate wiring terminal portion at this stage and a plan view thereof, respectively. FIG. 8A1 corresponds to a cross-sectional view taken along line C1-C2 in FIG. 8A2. In FIG. 8A1, a transparent conductive film 155 formed over a protective insulating layer 154 is a connection terminal electrode which functions as an input terminal. In the terminal portion in FIG. 8A1, the first terminal 151 formed from the same material as the gate wiring and a connection electrode 153 formed from the same material as the source wiring overlap with each other with a gate insulating layer 152 interposed therebetween, and are in direct contact with each other to be electrically connected. Further, the connection electrode 153 and the transparent conductive film 155 are in direct contact with each other and are electrically connected through a contact hole formed in the protective insulating layer 154.

FIGS. 8B1 and 8B2 illustrate a cross-sectional view of a source wiring terminal portion and a plan thereof, respectively. FIG. 8B1 corresponds to a cross-sectional view taken along line D1-D2 in FIG. 8B2. In FIG. 8B1, a transparent conductive film 155 formed over a protective insulating layer 154 is a connection terminal electrode which functions as an input terminal In the terminal portion in FIG. 8B1, an electrode 156 formed from the same material as the gate wiring is located below a second terminal 150 and overlapped with the second terminal 150 electrically connected to the source wiring, with the gate insulating layer 152 interposed therebetween. The electrode 156 is not electrically connected to the second terminal 150, and if the electrode 156 is set at a potential different from that of the second terminal 150, such as floating, GND, or 0 V, a capacitor as a measure against noise or a capacitor as a measure against static electricity can be formed. The second terminal 150 is electrically connected to the transparent conductive film 155 through a contact hole of the protective insulating layer 154.

A plurality of gate wirings, source wirings, and capacitor wirings are provided in accordance with pixel density. In the terminal portion, a plurality of first terminals at the potential the same as that of gate wirings, second terminals at the potential the same as that of source wirings, third terminals at the potential the same as that of capacitor wirings, or the like are arranged. The number of terminals of each type may be optionally determined by a practitioner as appropriate.

Thus, a pixel portion including the thin film transistor 170 that is a bottom-gate n-channel thin film transistor, and a storage capacitor can be completed. These are arranged in matrix in pixels so that a pixel portion is formed, which can be used as one of substrates for manufacturing an active matrix display device. In this specification, such a substrate is referred to as an active matrix substrate for convenience.

In the case of manufacturing an active matrix liquid crystal display device, a liquid crystal layer is provided between an active matrix substrate and a counter substrate provided with a counter electrode, and the active matrix substrate and the counter substrate are fixed to each other. Note that a common electrode is provided over the active matrix substrate to be electrically connected to the counter electrode provided over the counter substrate, and a fourth terminal is provided in a terminal portion to be electrically connected to the common electrode. This fourth terminal is a terminal for setting the common electrode at a fixed potential such as GND or 0 V.

Figure 7:
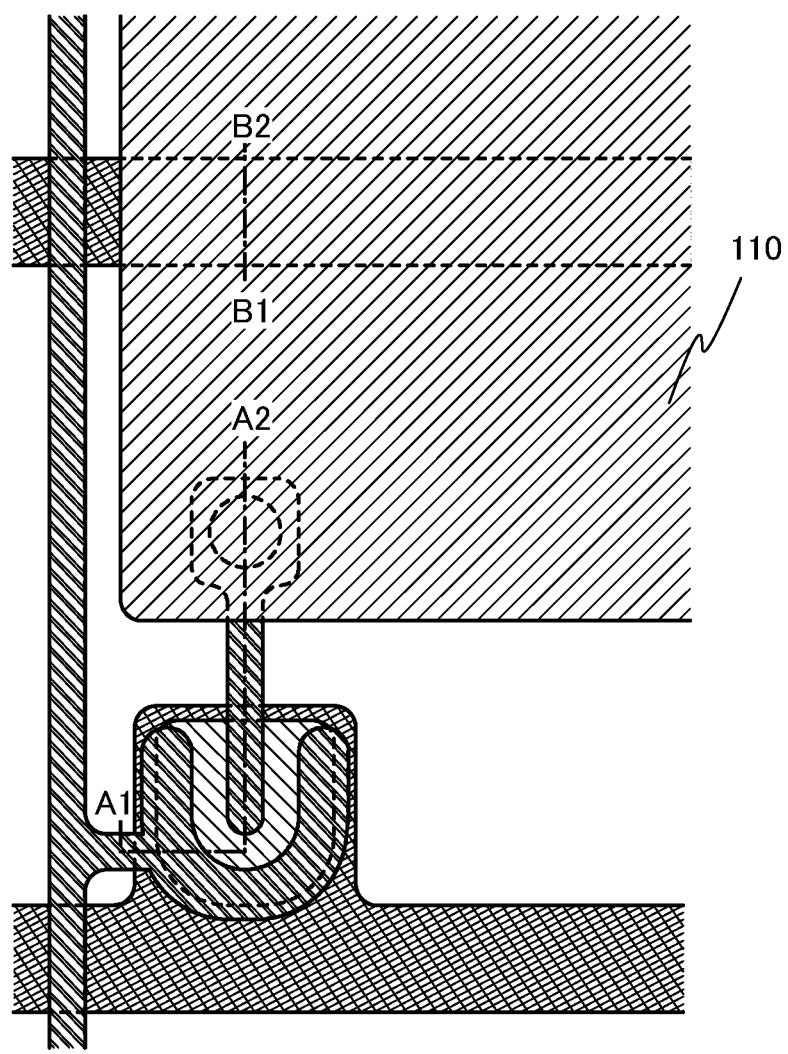
FIG. 7 illustrates the method for manufacturing the semiconductor device according to an embodiment of the present invention.
Figure 9:
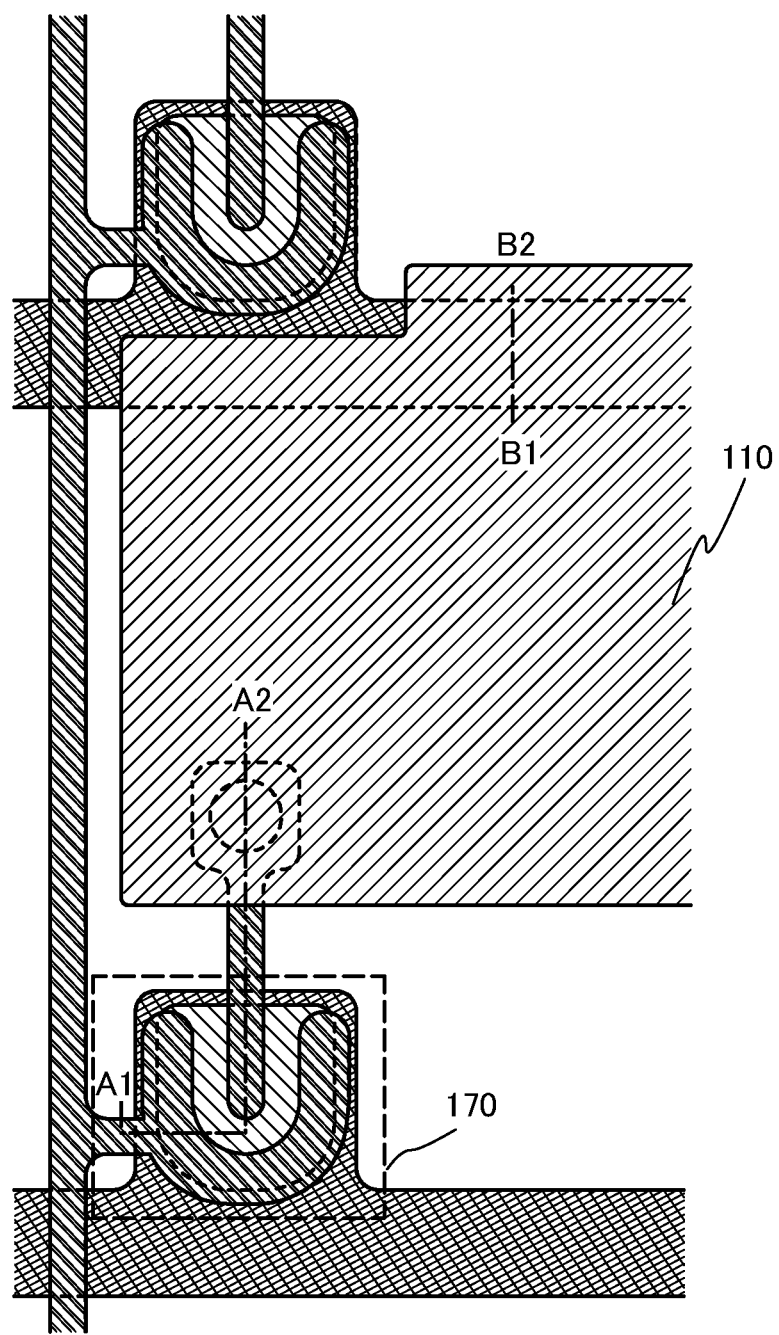
FIG. 9 illustrates a semiconductor device according to an embodiment of the present invention.

A pixel structure of this embodiment is not limited to that of FIG. 7, and an example of a plan view different from that of FIG. 7 is illustrated in FIG. 9. FIG. 9 illustrates an example in which a capacitor wiring is not provided and a storage capacitor is formed with a pixel electrode layer and a gate wiring of an adjacent pixel which overlap with each other with a protective insulating layer and a gate insulating layer interposed therebetween. In this case, the capacitor wiring and the third wiring connected to the capacitor wiring can be omitted. Note that in FIG. 9, the portions the same as those in FIG. 7 are denoted by the same reference numerals.

In an active matrix liquid crystal display device, display patterns are formed on a screen by driving of pixel electrodes that are arranged in matrix. Specifically, a voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, an afterimage occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Further, there is another driving technique which is called double-frame rate driving. In the double-frame rate driving, a vertical synchronizing frequency is 1.5 times or more, preferably 2 times or more as high as a usual vertical synchronizing frequency, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lightning in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

Combined with any of these driving techniques, a liquid crystal display device can have better display characteristics such as moving image characteristics than conventional liquid crystal display devices.

The n-channel transistor obtained in this embodiment includes an oxide semiconductor layer for a channel formation region and has excellent dynamic characteristics; thus, any of these driving techniques can be combined with each other.

In the case of manufacturing a light-emitting display device, one electrode (also called a cathode) of an organic light-emitting element is set at a low power supply potential such as GND or 0 V; thus, a fourth terminal for setting the cathode at a low power supply potential such as GND or 0 V is provided in a terminal portion. In addition, in the case of manufacturing a light-emitting display device, besides a source wiring and a gate wiring, a power supply line is provided. Accordingly, a fifth terminal which is electrically connected to the power supply line is provided in a terminal portion.

As described above, the thin film transistor using an oxide semiconductor layer is formed by stacking the oxide semiconductor layer containing insulating oxide over the oxide semiconductor layer so that the oxide semiconductor layer and the source and drain electrode layers are in contact with each other with the oxide semiconductor layer containing insulating oxide interposed therebetween. Thus, variation in threshold voltage of the thin film transistors can be reduced and the electric characteristics can be stabilized. Further, an off current can be reduced.

By using the thin film transistors for a pixel portion and the driver circuit portion of a display device, the display device can have favorable electric characteristics and high reliability.

Note that the structure and method described in this embodiment can be used in combination with any of the structures and methods described in the other embodiments, as appropriate.

Embodiment 3

In this embodiment, a thin film transistor having a shape different from the thin film transistors described in Embodiment 1 is described with reference to FIGS. 10A and 10B.

Figure 10A:
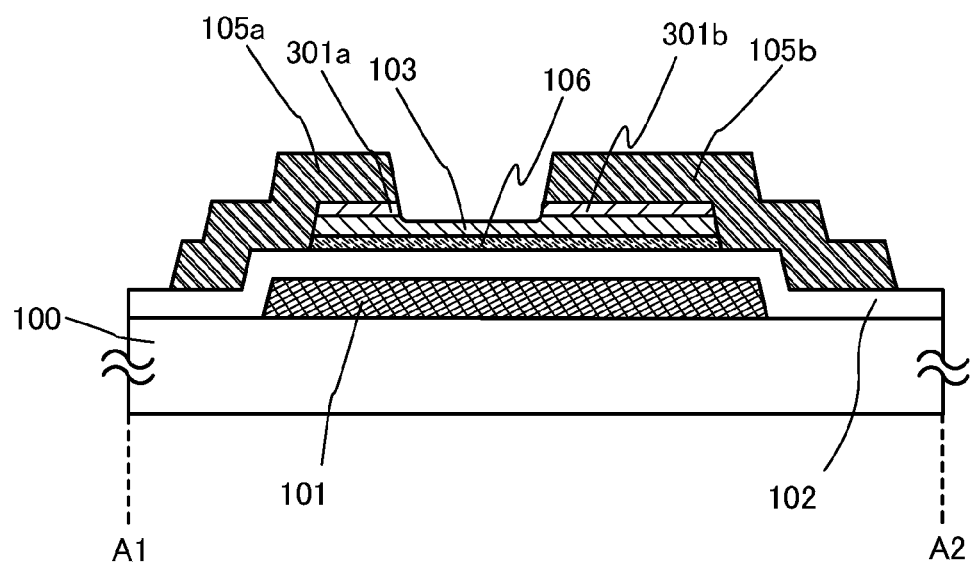
FIGS. 10A and 10B illustrate a semiconductor device according to an embodiment of the present invention.
Figure 10B:
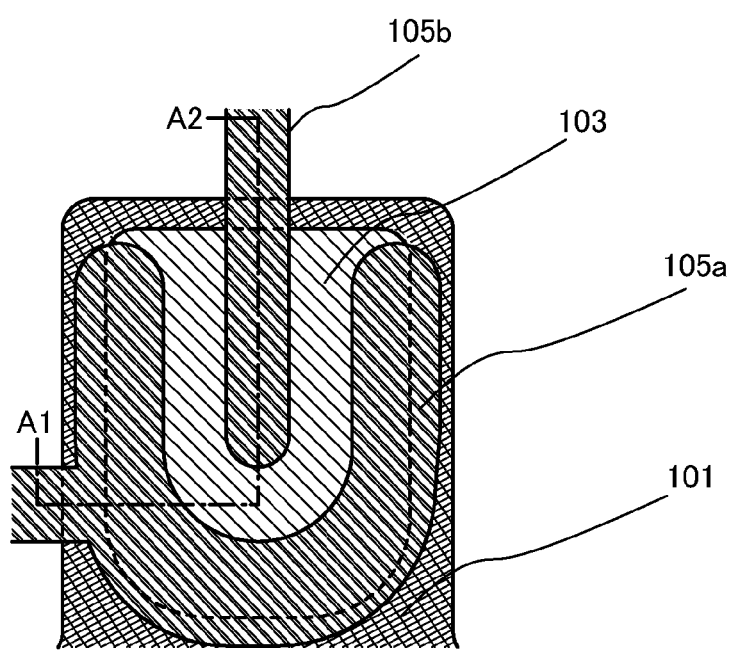

A thin film transistor having a bottom-gate structure of this embodiment is illustrated in FIGS. 10A and 10B. In the thin film transistor illustrated in FIGS. 10A and 10B, the gate electrode layer 101 is provided over the substrate 100, the gate insulating layer 102 is provided over the gate electrode layer 101, the oxide semiconductor layer 106 is provided over the gate insulating layer 102, the oxide semiconductor layer 103 containing insulating oxide is provided over the oxide semiconductor layer 106, buffer layers 301a and 301b are provided over the oxide semiconductor layer 103 containing insulating oxide, and the source and drain electrode layers 105a and 105b are provided over the buffer layers 301a and 301b. That is, the thin film transistor illustrated in FIGS. 10A and 10B has a structure in which the buffer layers 301a and 301b are additionally provided between the oxide semiconductor layer 103 containing insulating oxide and the source and drain electrode layers 105a and 105b in the thin film transistor illustrated in FIGS. 1A and 1B in Embodiment 1.

In a manner similar to that of formation of the oxide semiconductor layer 106, the buffer layers 301a and 301b which function as source and drain regions are preferably formed using a non-single-crystal film formed of an In—Ga—Zn—O-based, In—Sn—Zn—O-based, Ga—Sn—Zn—O-based, In—Zn—O-based, Sn—Zn—O-based, In—Sn—O-based, Ga—Zn—O-based, In—O-based, Sn—O-based, or Zn—O-based oxide semiconductor. Alternatively, the buffer layers 301a and 301b may be formed using a non-single-crystal film formed of an In—Ga—Zn—O-based, Ga—Zn—O-based, Zn—O—N-based, or Sn—Zn—O—N-based oxide semiconductor, which contains nitrogen. In this embodiment, a non-single-crystal film formed of an In—Ga—Zn—O-based oxide semiconductor is used for the buffer layers 301a and 301b. It is to be noted that the buffer layers 301a and 301b have n-type conductivity and higher conductivity than the oxide semiconductor layer 103 containing insulating oxide. Further, the buffer layers 301a and 301b include at least an amorphous component. In some cases, the buffer layers 301a and 301b include crystal grains (nanocrystals) in the amorphous structure. The crystal grains (nanocrystals) each have a diameter of 1 nm to 10 nm, typically about 2 nm to about 4 nm.

The oxide semiconductor film used for the buffer layers 301a and 301b is formed in an atmosphere of a rare gas such as an argon gas and an oxygen gas by a sputtering method. In that case, by performing deposition under the condition that the flow rate of a rare gas such as an argon gas is higher than that of an oxygen gas or performing deposition in an atmosphere of only a rare gas such as an argon gas without using an oxygen gas, conductivity of the oxide semiconductor layer 106 can be increased. Specifically, for example, deposition is performed by sputtering with the use of an oxide semiconductor target of 8 inches in diameter which contains In, Ga, and Zn ($In_2O_3:Ga_2O_3:ZnO=1:1:1$), under the conditions that the distance between the substrate and the target is 170 mm, the pressure is 0.4 Pa, the direct-current (DC) power is 0.5 kW, the deposition gases are Ar and $O_2$ ($Ar:O_2=50:1$ (sccm)), and the deposition temperature is room temperature.

The thickness of the oxide semiconductor film used for the buffer layers 301a and 301b is 5 nm to 20 nm It is needless to say that in the case where a crystal grain is included in the film, the size of the crystal grain included in the film does not exceed the film thickness.

Thus, provision of the buffer layers 301a and 301b can improve thermal stability between the oxide semiconductor layer and the source and drain electrode layers 105a and 105b as compared to formation of Schottky junction, whereby operating characteristics of the thin film transistor can be stabilized. In addition, because of high conductivity, favorable mobility can be kept even when high drain voltage is applied.

Note that as for a structure and materials of the thin film transistor of this embodiment except the buffer layers 301a and 301b, Embodiment 1 is to be referred to.

A manufacturing process of the thin film transistor of this embodiment is almost similar to the manufacturing process of the thin film transistor described in Embodiment 2. First, by the method described in Embodiment 2, steps up to forming the oxide semiconductor film which is provided to form the oxide semiconductor layer 103 containing insulating oxide are performed. Following the above steps, the oxide semiconductor film which is provided to form the buffer layers 301a and 301b is formed by sputtering with the use of the above method. Next, by a photolithography process, in a manner similar to that of formation of the oxide semiconductor layer 111 containing insulating oxide and the oxide semiconductor layer 106, the oxide semiconductor film which is provided to form the buffer layers 301a and 301b is etched to have an island shape, whereby an oxide semiconductor film 302 is formed (see FIG. 11A). Then, by the method described in Embodiment 2, steps up to formation of the conductive film 112 are performed (see FIG. 11B). Next, by a photolithography process, in a manner similar to that of formation of the source and drain electrode layers 105a and 105b and the oxide semiconductor layer 103 containing insulating oxide, the oxide semiconductor film 302 is etched to form the buffer layers 301a and 301b (see FIG. 11C). Following steps are similar to those in Embodiment 2.

Note that the structure and method described in this embodiment can be used in combination with any of the structures and methods described in the other embodiments, as appropriate.

Embodiment 4

In this embodiment, an inverter circuit formed using two bottom-gate thin film transistors described in Embodiment 1 is described with reference to FIGS. 34A to 34C.

The driver circuit for driving a pixel portion is formed using an inverter circuit, a capacitor, a resistor, and the like. When the inverter circuit is formed using two n-channel TFTs in combination, there are an inverter circuit having a combination of an enhancement-type transistor and a depletion-type transistor (hereinafter referred to as an EDMOS circuit) and an inverter circuit having a combination of two enhancement-type TFTs (hereinafter referred to as an EEMOS circuit). Note that in this specification, in the case where the threshold voltage of an n-channel TFT is positive, the n-channel TFT is defined as an enhancement-type transistor, whereas in the case where the threshold voltage of an n-channel TFT is negative, the n-channel TFT is defined as a depletion-type transistor.

The pixel portion and the driver circuit are formed over one substrate. In the pixel portion, on and off of voltage application to a pixel electrode are switched using enhancement-type transistors arranged in matrix. The enhancement-type transistors arranged in the pixel portion are formed using oxide semiconductors.

Figure 34A:
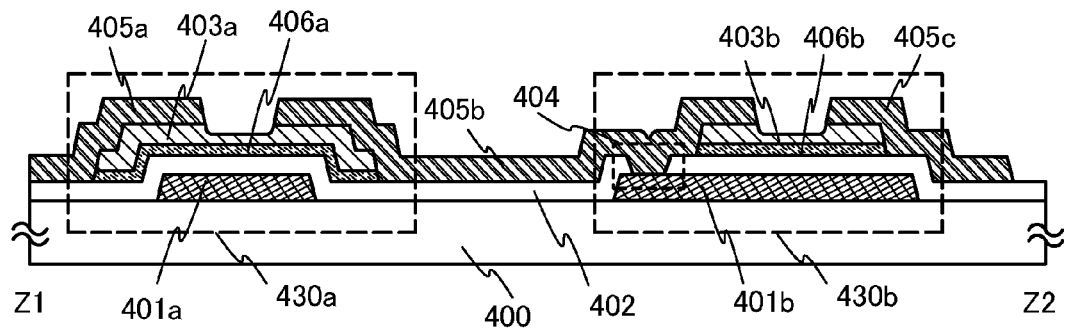
FIGS. 34A to 34C illustrate a semiconductor device according to an embodiment of the present invention.

FIG. 34A illustrates a cross-sectional structure of an inverter circuit of a driver circuit. Note that the inverted staggered thin film transistor illustrated in FIGS. 30A and 30B is used for a first thin film transistor 430a and a second thin film transistor 430b in FIG. 34A. However, the structure of a thin film transistor which can be used for the inverter circuit described in this embodiment is not limited to this.

In the first thin film transistor 430a illustrated in FIG. 34A, a first gate electrode layer 401a is provided over a substrate 400, a gate insulating layer 402 is provided over the first gate electrode layer 401a, a first oxide semiconductor layer 406a is provided over the gate insulating layer 402, a first oxide semiconductor layer 403a containing insulating oxide is provided over the first oxide semiconductor layer 406a, and a first wiring 405a and a second wiring 405b are provided over the first oxide semiconductor layer 403a containing insulating oxide. In a similar manner, in the second thin film transistor 430b, a second gate electrode layer 401b is provided over the substrate 400, the gate insulating layer 402 is provided over the second gate electrode layer 401b, a second oxide semiconductor layer 406b is provided over the gate insulating layer 402, a second oxide semiconductor layer 403b containing insulating oxide is provided over the second oxide semiconductor layer 406b, and the second wiring 405b and a third wiring 405c are provided over the second oxide semiconductor layer 403b containing insulating oxide. Here, the second wiring 405b is directly connected to the second gate electrode layer 401b through a contact hole 404 formed in the gate insulating layer 402. Note that as for the structure and the material of each portion, the thin film transistor described above is to be referred to.

The first wiring 405a is a power supply line at a ground potential (ground power supply line). This power supply line at a ground potential may be a power supply line to which a negative voltage VDL is applied (negative power supply line). The third wiring 405c is a power supply line to which a positive voltage VDD is applied (positive power supply line).

As illustrated in FIG. 34A, the second wiring 405b which is electrically connected to both the first oxide semiconductor layer 403a containing insulating oxide and the second oxide semiconductor layer 403b containing insulating oxide is directly connected to the second gate electrode layer 401b of the second thin film transistor 430b through the contact hole 404 formed in the gate insulating layer 402. By the direct connection between the second wiring 405b and the second gate electrode layer 401b, favorable contact can be obtained, which leads to a reduction in contact resistance. Compared with the case where the second gate electrode layer 401b and the second wiring 405b are connected to each other with another conductive film such as a transparent conductive film interposed therebetween, reduction in the number of contact holes and reduction in an area occupied by the driver circuit due to the reduction in the number of contact holes can be achieved.

Figure 34B:
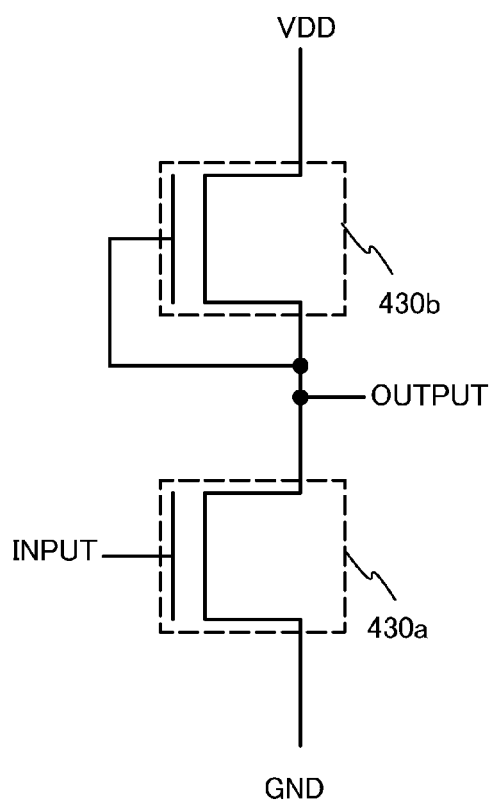
Figure 34C:
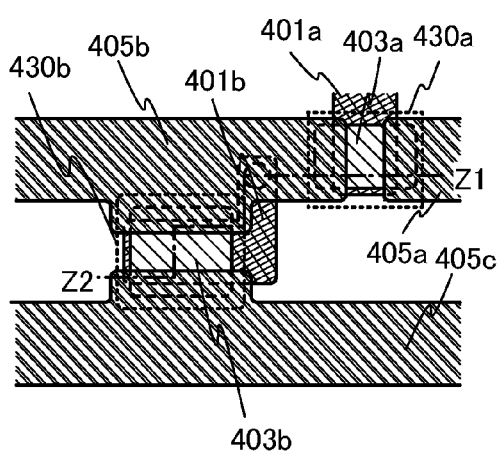

Further, a top view of the inverter circuit of the driver circuit is illustrated in FIG. 34C. In FIG. 34C, a cross-section taken along chain line Z1-Z2 corresponds to FIG. 34A.

Further, an equivalent circuit of the EDMOS circuit is illustrated in FIG. 34B. A circuit connection illustrated in FIGS. 34A and 34C corresponds to that in FIG. 34B, and is an example in which the first thin film transistor 430a is an enhancement-type n-channel transistor while the second thin film transistor 430b is a depletion-type n-channel transistor.

In order to manufacture an enhancement-type n-channel transistor and a depletion-type n-channel transistor over one substrate, for example, the first oxide semiconductor layer 403a containing insulating oxide and the first oxide semiconductor layer 406a are formed using different materials or under conditions different from those of the second oxide semiconductor layer 403b containing insulating oxide and the second oxide semiconductor layer 406b. Alternatively, an EDMOS circuit may be formed in such a manner that gate electrodes are provided over and under the oxide semiconductor layer to control the threshold voltage and a voltage is applied to the gate electrodes so that one of the TFTs is normally on while the other TFT is normally off.

Alternatively, without limitation to the EDMOS circuit, an EEMOS circuit may be formed, in which the first thin film transistor 430a and the second thin film transistor 430b are enhancement-type n-channel transistors. In that case, a connection between the third wiring 405c and the second gate electrode layer 401b is made instead of the connection between the second wiring 405b and the second gate electrode layer 401b.

The thin film transistor used in this embodiment is formed by stacking the oxide semiconductor layer containing insulating oxide over the oxide semiconductor layer so that the oxide semiconductor layer and the source and drain electrode layers are in contact with each other with the oxide semiconductor layer containing insulating oxide interposed therebetween. Thus, variation in threshold voltage of the thin film transistors can be reduced and the electric characteristics can be stabilized. Further, an off current can be reduced. Therefore, the circuit characteristics of the inverter circuit described in this embodiment can be improved.

Note that the structure described in this embodiment can be used in combination with any of the structures and methods described in the other embodiments, as appropriate.

Embodiment 5

In this embodiment, an example is described below in which in a display device which is an example of a semiconductor device, at least a part of a driver circuit and a thin film transistor of a pixel portion are formed over one substrate.

The thin film transistor of the pixel portion is formed according to Embodiment 2. Further, the thin film transistor described in any of Embodiments 1 to 3 is an n-channel TFT, and thus a part of a driver circuit that can formed of n-channel TFTs among driver circuits is formed over the same substrate as the thin film transistor of the pixel portion.

Figure 14A:
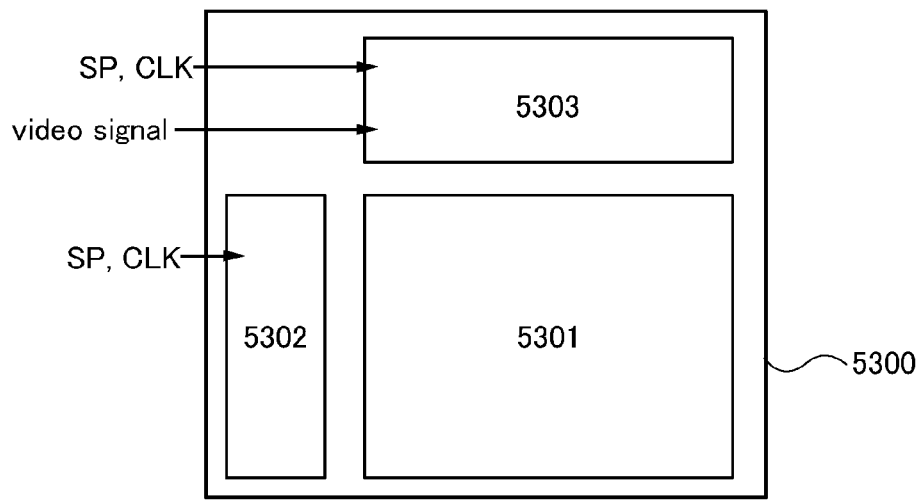
FIGS. 14A and 14B are block diagrams of semiconductor devices.

FIG. 14A illustrates an example of a block diagram of an active matrix liquid crystal display device which is an example of a semiconductor device. The display device illustrated in FIG. 14A includes, over a substrate 5300, a pixel portion 5301 including a plurality of pixels each provided with a display element; a scan line driver circuit 5302 that selects each pixel; and a signal line driver circuit 5303 that controls a video signal input to a selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (any one of the signal lines S1 to Sm) and a scan line Gi (any one of the scan lines G1 to Gn).

In addition, the thin film transistor described in any of Embodiments 1 to 3 is an n-channel TFT, and a signal line driver circuit including the n-channel TFT is described with reference to FIG. 15.

Figure 15:
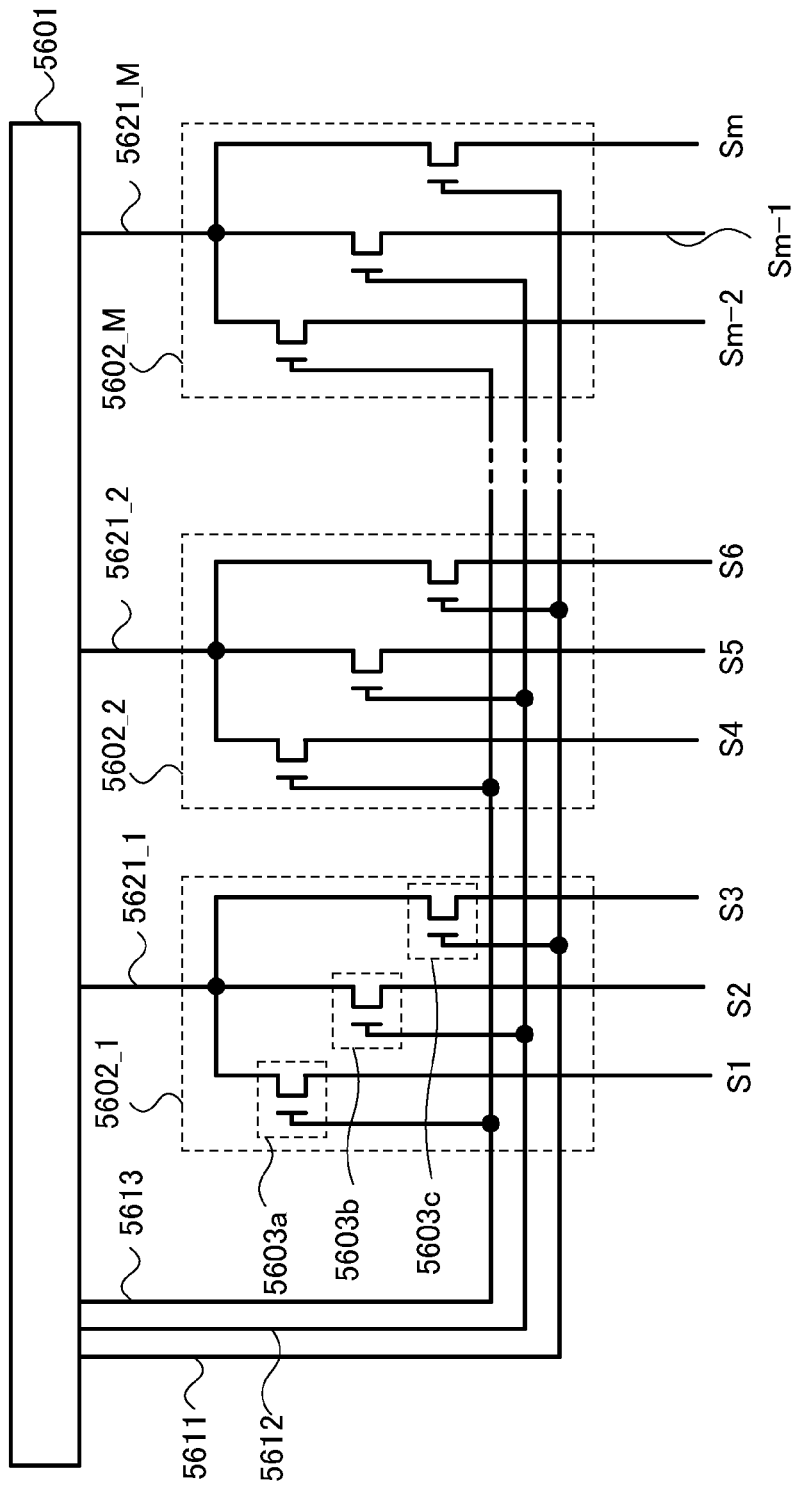
FIG. 15 illustrates a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. The switch groups 5602_1 to 5602_M are connected to the wirings 5621_1 to 5621_M corresponding to the switch groups 5602_1 to 5602_M, respectively, and are each connected to the first wiring 5611, the second wiring 5612, and the third wiring 5613. Each of the wirings 5621_1 to 5621_M is connected to three signal lines (a signal line Sm-2, a signal line Sm-1, and a signal line Sm (m=3M)) via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj-2, a signal line Sj-1, and a signal line Sj (j=3J) via the first thin film transistor 5603a, the second thin film transistor 5603b, and the third thin film transistor 5603c included in the switch group 5602_J. Note that a signal is input to each of the first wiring 5611, the second wiring 5612, and the third wiring 5613.

Note that the driver IC 5601 is desirably formed using a single crystal semiconductor. The switch groups 5602_1 to 5602_M are desirably formed over the same substrate as the pixel portion. Therefore, the driver IC 5601 and the switch groups 5602_1 to 5602_M are preferably connected via an FPC or the like. Alternatively, a single crystal semiconductor layer may be provided over the same substrate as the pixel portion by a method such as bonding to form the driver IC 5601.

Figure 16:
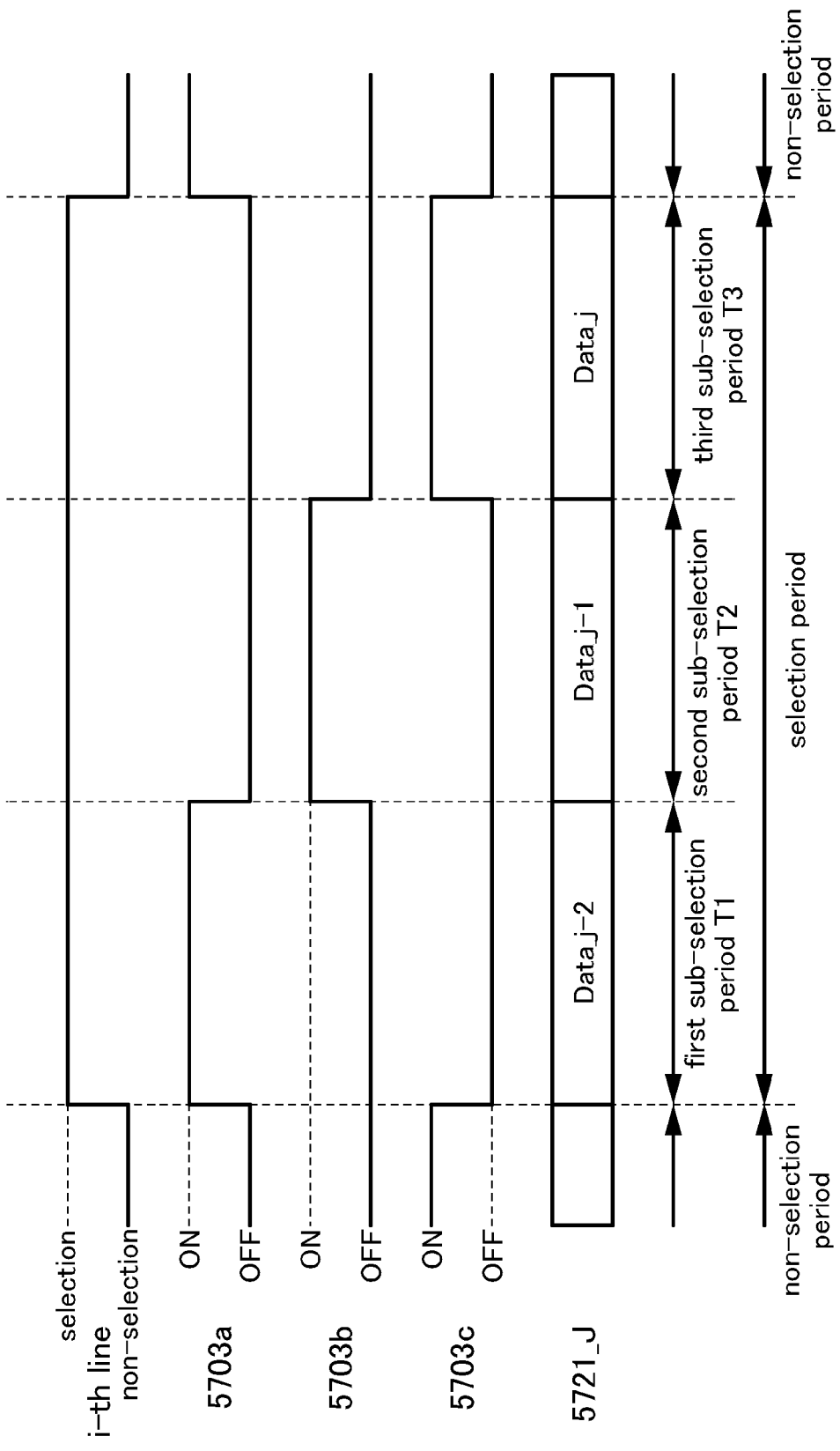
FIG. 16 is a timing chart showing the operation of the signal line driver circuit.

Next, operation of the signal line driver circuit illustrated in FIG. 15 is described with reference to a timing chart in FIG. 16. Note that the timing chart in FIG. 16 shows the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 15 operates as in FIG. 16 even when a scan line of another row is selected.

Note that the timing chart in FIG. 16 shows the case where the wiring 5621_J of the J-th column is connected to the signal line Sj-2, the signal line Sj-1, and the signal line Sj via the first thin film transistor 5603a, the second thin film transistor 5603b, and the third thin film transistor 5603c, respectively.

The timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

Note that in the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj-2, a video signal input to the wiring 5621_J in the second sub-selection period T2 is input to the signal line Sj-1, and a video signal input to the wiring 5621_J in the third sub-selection period T3 is input to the signal line Sj. In addition, in the first sub-selection period T1, the second sub-selection period T2, and the third sub-selection period T3, the video signals input to the wiring 5621_J are denoted by Data_j-2, Data_j-1, and Data_j.

As illustrated in FIG. 16, in the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603a. In the second sub-selection period T2, the second thin film transistor 5603b is turned on, and the first thin film transistor 5603a and the third thin film transistor 5603c are turned off. At this time, Data_j-1 input to the wiring 5621_J is input to the signal line Sj-1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 15 can be improved.

Note that there are no particular limitations on the arrangement, the number, a driving method, and the like of the thin film transistors, as long as one gate selection period can be divided into a plurality of sub-selection periods and video signals can be input to a plurality of signal lines from one wiring in the corresponding sub-selection periods as illustrated in FIG. 15.

For example, when video signals are input to three or more signal lines from one wiring in each of three or more sub-selection periods, it is only necessary to add a thin film transistor and a wiring for controlling the thin film transistor. It is to be noted that when one selection period is divided into four or more sub-selection periods, one sub-selection period is shorter. Therefore, one selection period is desirably divided into two or three sub-selection periods.

Figure 17:
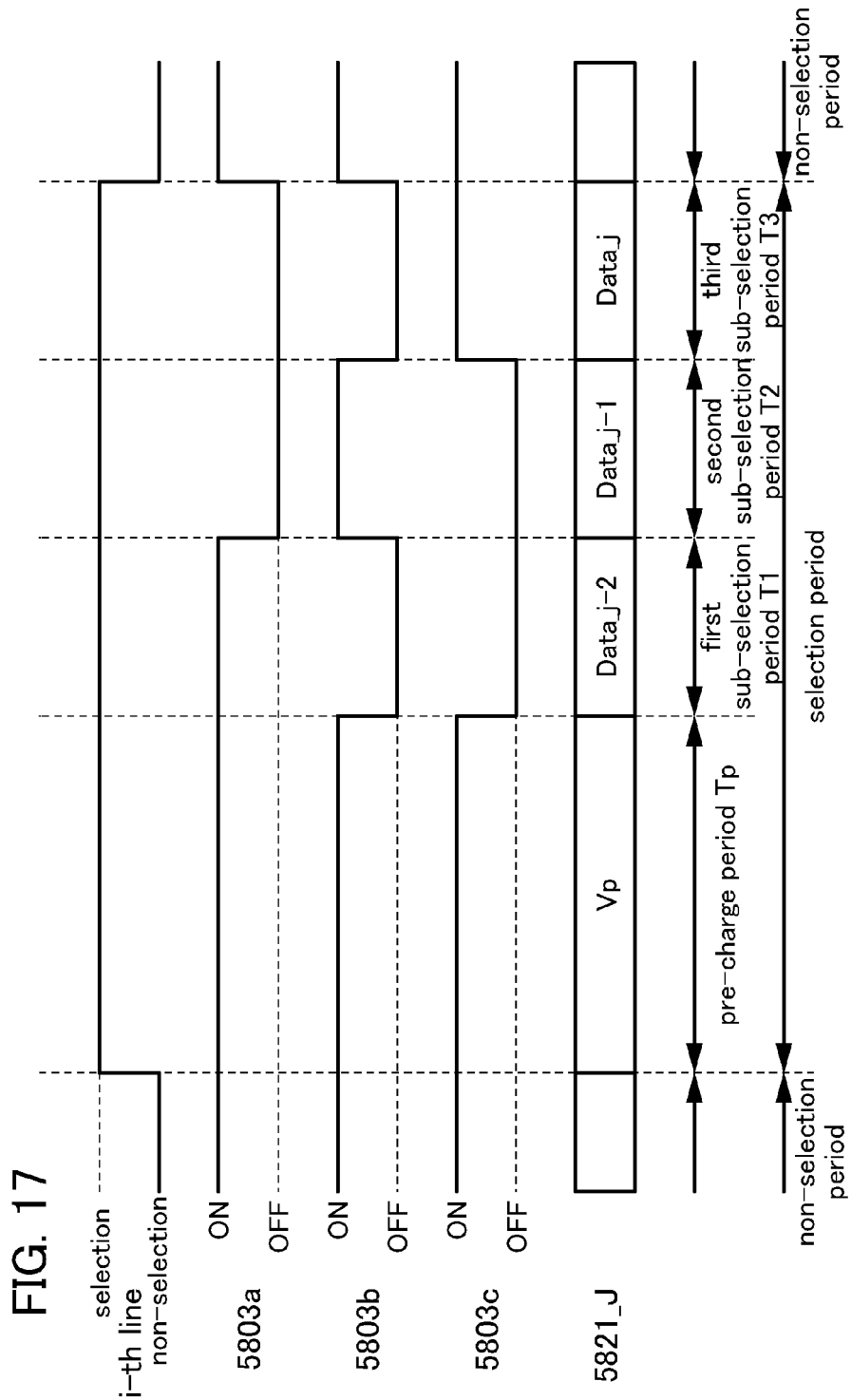
FIG. 17 is a timing chart showing the operation of the signal line driver circuit.

As another example, one selection period may be divided into a precharge period Tp, the first sub-selection period T1, the second sub-selection period T2, and the third sub-selection period T3 as illustrated in a timing chart in FIG. 17. The timing chart in FIG. 17 shows timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 17, the first thin film transistor 5603a, the second thin film transistor 5603b, and the third thin film transistor 5603c are tuned on in the precharge period Tp. At this time, a precharge voltage Vp input to the wiring 5621_J is input to each of the signal line Sj-2, the signal line Sj-1, and the signal line Sj via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603a. In the second sub-selection period T2, the second thin film transistor 5603b is turned on, and the first thin film transistor 5603a and the third thin film transistor 5603c are turned off. At this time, Data_j-1 input to the wiring 5621_) is input to the signal line Sj-1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_) is input to the signal line Sj via the third thin film transistor 5603c.

As described above, in the signal line driver circuit in FIG. 15 to which the timing chart in FIG. 17 is applied, the video signal can be written to the pixel at high speed because the signal line can be precharged by providing a precharge selection period before a sub-selection period. Note that portions in FIG. 17 which are similar to those of FIG. 16 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer through which a large current can flow is used.

One mode of a shift register which is used for a part of a scan line driver circuit is described with reference to FIG. 18 and FIG. 19.

Figure 18:
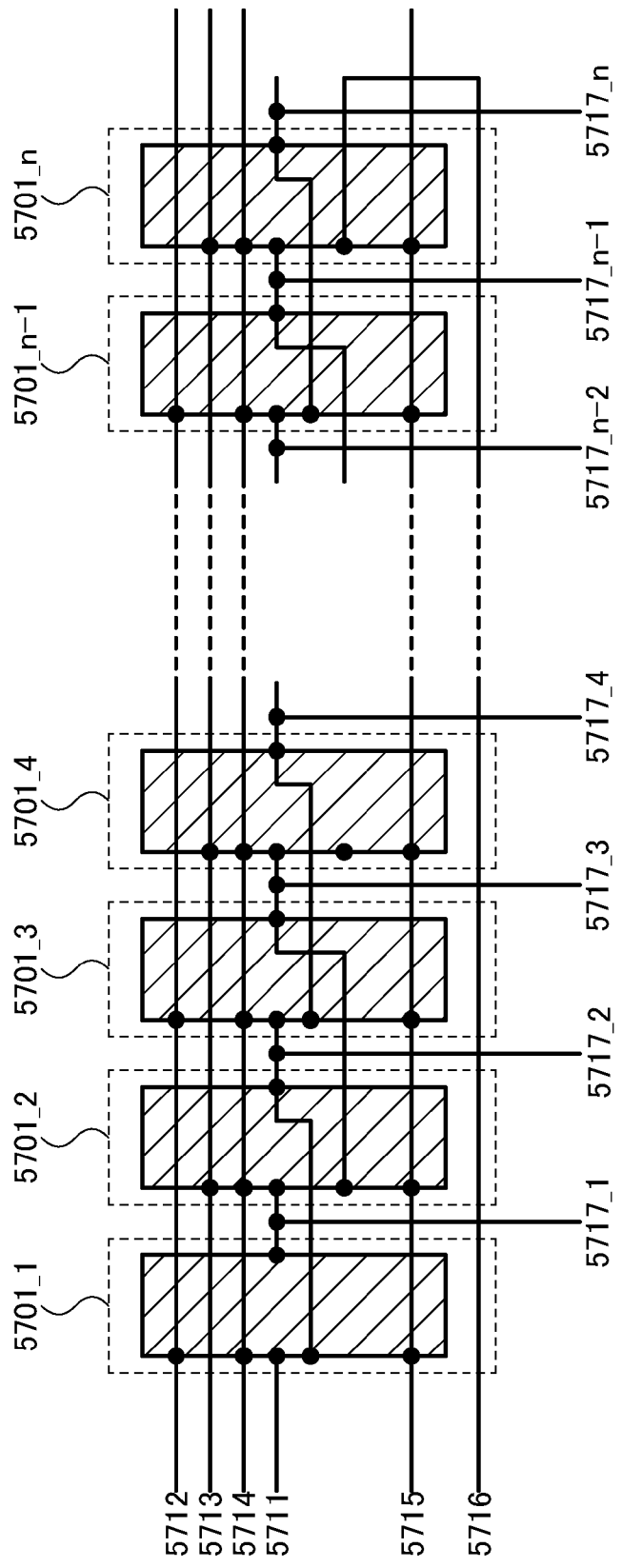
FIG. 18 illustrates a configuration of a shift register.

FIG. 18 illustrates a circuit configuration of a shift register. The shift register illustrated in FIG. 18 includes a plurality of flip-flops 5701_1 to 5701_n. The shift register is operated with input of a first clock signal, a second clock signal, a start pulse signal, and a reset signal.

Connection relations of the shift register in FIG. 18 are described. The first stage flip-flop 5701_1 is connected to a first wiring 5711, a second wiring 5712, a fourth wiring 5714, a fifth wiring 5715, a seventh wiring 5717_1, and a seventh wiring 5717_2. The second stage flip-flop 5701_2 is connected to a third wiring 5713, the fourth wiring 5714, the fifth wiring 5715, the seventh wiring 5717_1, the seventh wiring 57172, and a seventh wiring 5717_3.

In a similar manner, the i-th stage flip-flop 5701_i (any one of flip-flops 5701_1 to 5701_n) is connected to one of the second wiring 5712 and the third wiring 5713, the fourth wiring 5714, the fifth wiring 5715, a seventh wiring 5717_i−1, a seventh wiring 5717_i, and a seventh wiring 5717_i+1. Here, when i is an odd number, the i-th stage flip-flop 5701_i is connected to the second wiring 5712, whereas when i is an even number, the i-th stage flip-flop 5701_i is connected to the third wiring 5713.

The n-th stage flip-flop 5701_n is connected to one of the second wiring 5712 and the third wiring 5713, the fourth wiring 5714, the fifth wiring 5715, a seventh wiring 5717_n−1, a seventh wiring 5717_n, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, details of the flip-flop illustrated in FIG. 18 are described with reference to FIG. 19. The flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage (Vgs) exceeds the threshold voltage (Vth).

Figure 19:
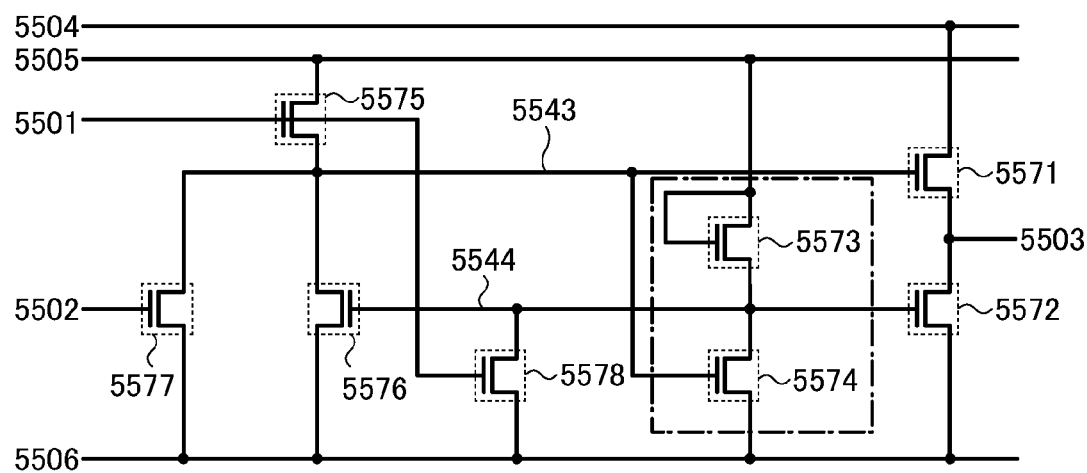
FIG. 19 illustrates a connection structure of the flip-flop illustrated in FIG. 18.

The flip-flop illustrated in FIG. 19 includes a first wiring 5501, a second wiring 5502, a third wiring 5503, a fourth wiring 5504, a fifth wiring 5505, and a sixth wiring 5506.

Here, an example is described in which all the thin film transistors are enhancement-type n-channel transistors; however, the present invention is not limited thereto. For example, the driver circuits may be driven with the use of depletion-type n-channel transistors.

Next, connection structures of the flip-flop illustrated in FIG. 19 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502.

A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the i-th stage flip-flop 5701_i, the first wiring 5501 in FIG. 19 is connected to the seventh wiring 5717_i−1 in FIG. 18; the second wiring 5502 in FIG. 19 is connected to the seventh wiring 5717_i+1 in FIG. 18; the third wiring 5503 in FIG. 19 is connected to the seventh wiring 5717_i in FIG. 18; and the sixth wiring 5506 in FIG. 19 is connected to the fifth wiring 5715 in FIG. 18.

When i is an odd number, the fourth wiring 5504 in FIG. 19 is connected to the second wiring 5712 in FIG. 18, whereas when i is an even number, the fourth wiring 5504 is connected to the third wiring 5713 in FIG. 18. In addition, the fifth wiring 5505 in FIG. 19 is connected to the fourth wiring 5714 in FIG. 18.

It is to be note that in the first stage flip-flop 5701_1, the first wiring 5501 in FIG. 19 is connected to the first wiring 5711 in FIG. 18. In the n-th stage flip-flop 5701_n, the second wiring 5502 in FIG. 19 is connected to the sixth wiring 5716 in FIG. 18.

In addition, the signal line driver circuit and the scan line driver circuit can be formed using only the n-channel TFTs described in any of Embodiments 1 to 3. The n-channel TFT described in any of Embodiments 1 to 3 has a high mobility, and thus a driving frequency of a driver circuit can be increased. Further, in the case of the n-channel TFT described in any of Embodiments 1 to 3, since parasitic capacitance is reduced by using an oxide semiconductor layer typified by an In—Ga—Zn—O-based non-single-crystal film, frequency characteristics (also referred to as f characteristics) is favor-able. For example, a scan line driver circuit using the n-channel TFT described in any of Embodiments 1 to 3 can be operated at high speed, and thus a frame frequency can be increased and insertion of black images can be realized.

In addition, when, for example, the channel width of the transistor in the scan line driver circuit is increased or a plurality of scan line driver circuits are provided, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized. Further, outputting a signal to a scan line from the plurality of scan line driver circuits is advantageous to an increase in size of a display device.

Figure 14B:
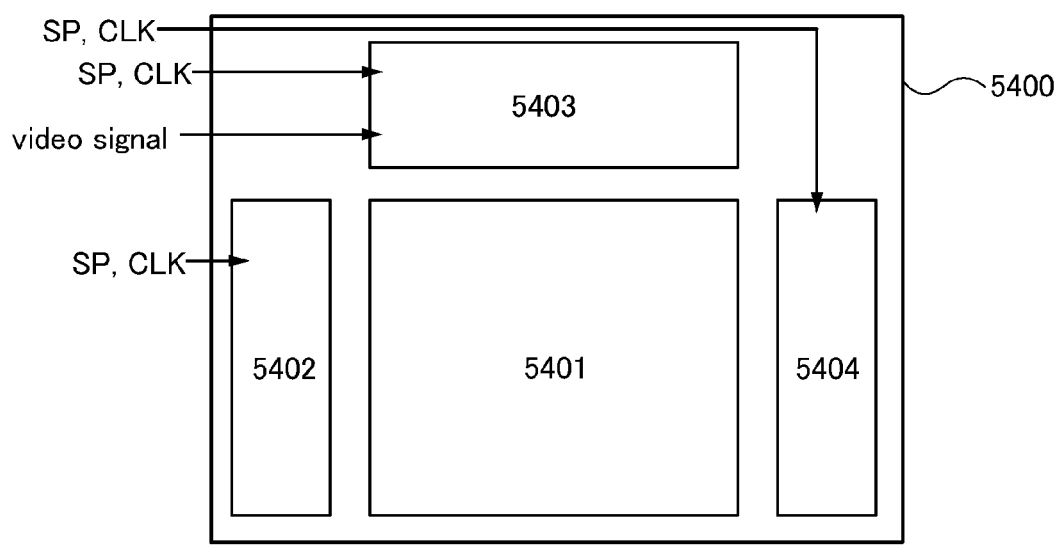

Further, when an active matrix light-emitting display device which is an example of a semiconductor device is manufactured, a plurality of thin film transistors are arranged in at least one pixel, and thus a plurality of scan line driver circuits are preferably arranged. FIG. 14B is a block diagram illustrating an example of an active matrix light-emitting display device.

The light-emitting display device illustrated in FIG. 14B includes, over a substrate 5400, a pixel portion 5401 having a plurality of pixels each provided with a display element, a first scan line driver circuit 5402 and a second scan line driver circuit 5404 each select a pixel, and a signal line driver circuit 5403 that controls input of a video signal to the selected pixel.

When the video signal input to a pixel of the light-emitting display device illustrated in FIG. 14B is a digital signal, the pixel emits or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of performing display with a time gray scale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales can be displayed.

In the example of the light-emitting display device illustrated in FIG. 14B, in the case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other switching TFT; however, one scan line driver circuit may generate both the signal which is input to the first scan line and the signal which is input to the second scan line. In addition, for example, there is a possibility that a plurality of scan lines used for controlling the operation of a switching element are provided in each pixel, depending on the number of switching TFTs included in the pixel. In that case, one scan line driver circuit may generate all signals that are input to the plurality of scan lines, or a plurality of scan line driver circuits may generate signals that are input to the plurality of scan lines.

In addition, also in the light-emitting display device, a part of the driver circuits that can formed of n-channel TFTs among driver circuits can be formed over the same substrate as the thin film transistors of the pixel portion. Alternatively, the signal line driver circuit and the scan line driver circuit can be formed using only the n-channel TFTs described in any of Embodiment 1 to 3.

Moreover, the above-described driver circuit can be used for electronic paper that drives electronic ink using an element electrically connected to a switching element, without being limited to applications to a liquid crystal display device or a light-emitting display device. Electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. An electrophoretic display contains a plurality of microcapsules dispersed in a solvent or a solute, each of which contains first particles which are positive-charged and second particles which are negative-charged. By applying an electric field to the microcapsules, the particles in the microcapsules are moved in opposite directions to each other and only the color of the particles concentrated on one side is exhibited. Note that the first particles and the second particles each contain a pigment and do not move without an electric field. Moreover, the colors of the first particles and the second particles are different from each other (the colors include achromatic color).

In this way, an electrophoretic display is a display that utilizes a so-called dielectrophoretic effect by which a substance that has a high dielectric constant moves to a high-electric field region. An electrophoretic display does not need to use a polarizing plate and a counter substrate, which are required in a liquid crystal display device, and both the thickness and weight of the electrophoretic display device can be half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, with the use of a color filter or particles each containing a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistor in any of Embodiments 1 to 3 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

With the above-mentioned structures, a highly reliable display device can be manufactured as a semiconductor device.

Note that the structure and method described in this embodiment can be used in combination with any of the structures and methods described in the other embodiments, as appropriate.

Embodiment 6

The thin film transistor described in any of Embodiments 1 to 3 is manufactured, and a semiconductor device having a display function (also referred to as a display device) can be manufactured using the thin film transistor for a pixel portion and further for a driver circuit. Further, part or whole of a driver circuit can be formed over the same substrate as a pixel portion, using the thin film transistor described in any of Embodiments 1 to 3, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one mode of an element substrate before the display element is completed in a manufacturing process of the display device, and the element substrate is provided with means for supplying a current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

First, the upper aspects and the cross section of liquid crystal display panels which are embodiments of a semiconductor device are described with reference to FIGS. 22A1, 22A2, and 22B. FIG. 22A1 and 22A2 are each a top view of a panel in which thin film transistors 4010 and 4011 each being highly reliable and using the oxide semiconductor layer typified by an In—Ga—Zn—O-based non-single-crystal film, which is described in any of Embodiments 1 to 3, and a liquid crystal element 4013 are formed over a first substrate 4001 and sealed between the first substrate 4001 and a second substrate 4006 with a sealant 4005. FIG. 22B is a cross-sectional view taken along line M-N of FIGS. 22A1 and 22A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scan line driver circuit 4004 provided over the first substrate 4001 include a plurality of thin film transistors. FIG. 22B illustrates the thin film transistor 4010 included in the pixel portion 4002 and the thin film transistor 4011 included in the scan line driver circuit 4004, as an example. Insulating layers 4020 and 4021 are formed over the thin film transistors 4010 and 4011.

As the thin film transistors 4010 and 4011, thin film transistors each of which is highly reliable and uses the oxide semiconductor layer typified by an In—Ga—Zn—O-based non-single-crystal film, which is described in any of Embodiments 1 to 3, can be used. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 are overlapped with one another corresponds to the liquid crystal element 4013. Note that the pixel electrode layer 4030 and the counter electrode layer 4031 are provided with an insulating layer 4032 and an insulating layer 4033 each functioning as an alignment film, respectively, and sandwich the liquid crystal layer 4008 with the insulating layers 4032 and 4033 interposed between the pixel electrode layer 4030 and the counter electrode layer 4031.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010. With the use of the common connection portion, the counter electrode layer 4031 is electrically connected to the common potential line through conductive particles provided between the pair of substrates. Note that the conductive particles are contained in the sealant 4005.

Alternatively, liquid crystal exhibiting a blue phase for which an alignment film is unnecessary may be used. A blue phase is one of the liquid crystal phases, which is generated just before a cholesteric phase changes into an isotropic phase while a temperature of cholesteric liquid crystal is increased. Since the blue phase is generated only within a narrow range of temperatures, a liquid crystal composition containing a chiral agent at 5 wt % or more is used for the liquid crystal layer 4008 in order to increase the temperature range. The liquid crystal composition containing liquid crystal exhibiting a blue phase and a chiral agent has a small response time of 10 µs to 100 µs, has optical isotropy, which makes the alignment process unneeded, and has small viewing angle dependence.

Although an example of a transmissive liquid crystal display device is described in this embodiment, an embodiment of the present invention can also be applied to a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor obtained by any of Embodiments 1 to 3 is covered with insulating layers (the insulating layers 4020 and 4021) serving as a protective film and a planarizing insulating film. Note that the protective film is provided to prevent entry of contamination impurities floating in the air, such as an organic substance, a metal substance, or moisture, and is preferably a dense film. The protective film may be formed by a sputtering method to have a single-layer structure or a layered structure of any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although this embodiment describes an example of forming the protective film by a sputtering method, the present invention is not particularly limited to this method and any of a variety of methods may be employed.

The insulating layer 4020 having a layered structure is formed as the protective film. Here, as a first layer of the insulating layer 4020, for example, a silicon oxide film is formed by a sputtering method. The use of the silicon oxide film for the protective film has an effect of preventing hillocks of an aluminum film used for the source and drain electrode layers.

Further, as a second layer of the insulating layer 4020, a silicon nitride film is formed by a sputtering method. The use of the silicon nitride film as the protective film can prevent mobile ions such as sodium ions from entering a semiconductor region, thereby suppressing changes in electrical characteristics of the TFT.

After the protective film is formed, the oxide semiconductor layer may be annealed (at 300° C. to 400° C.).

The insulating layer 4021 is formed as the planarizing insulating film. For the insulating layer 4021, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

Note that a siloxane-based resin is a resin formed using a siloxane material as a starting material and having a Si—O—Si bond. The siloxane-based resin may include as a substituent at least one of fluorine, an alkyl group, and an aryl group, as well as hydrogen.

There is no particular limitation on the method for forming the insulating layer 4021, and the insulating layer 4021 can be formed, depending on the material, by a sputtering method, an SOG method, spin coating, dipping, spray coating, a droplet discharge method (an ink-jet method, screen printing, offset printing, or the like), doctor knife, roll coater, curtain coater, knife coater, or the like. In the case where the insulating layer 4021 is formed using a material solution, the annealing (at 300° C. to 400° C.) of the oxide semiconductor layer may also be performed in a baking step. The baking step of the insulating layer 4021 also serves as the annealing step of the oxide semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode layer 4030 and the counter electrode layer 4031. The pixel electrode formed using the conductive composition preferably has a sheet resistance of 10000 Ω/square or less and a light transmissivity of 70% or more at a wavelength of 550 nm Further, the square resistivity of the conductive macromolecule contained in the conductive composition is preferably 0.1 Ω·cm or less.

As the conductive macromolecule, a so-called π-electron conjugated conductive macromolecule can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, and the scan line driver circuit 4004 and the pixel portion 4002, from an FPC 4018.

In this embodiment, a connection terminal electrode 4015 is formed using a conductive film the same as that of the pixel electrode layer 4030 included in the liquid crystal element 4013, and a terminal electrode 4016 is formed using a conductive film the same as that of source and drain electrode layers of the thin film transistors 4010 and 4011.

The connection terminal electrode 4015 is electrically connected to a terminal included in the FPC 4018 through an anisotropic conductive film 4019.

Further, FIGS. 22A1 and 22A2 illustrate an example in which the signal line driver circuit 4003 is formed separately and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 23:
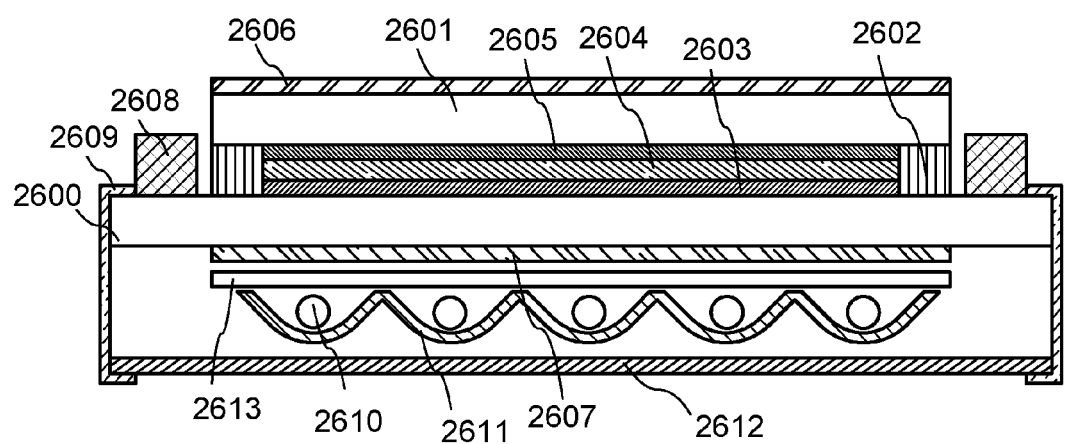
FIG. 23 illustrates a semiconductor device according to an embodiment of the present invention.

FIG. 23 illustrates an example in which a liquid crystal display module is formed as a semiconductor device by using a TFT substrate 2600 formed using the TFT described in any of Embodiments 1 to 3.

FIG. 23 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605, are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power supply circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode liquid crystal, or the like can be used.

With the above-mentioned structures, a highly reliable liquid crystal display panel can be manufactured as a semiconductor device.

Note that the structure and method described in this embodiment can be used in combination with any of the structures and methods described in the other embodiments, as appropriate.

Embodiment 7

In this embodiment, an example of electronic paper is described as a semiconductor device to which the thin film transistor described in any of Embodiments 1 to 3 is applied.

Figure 13:
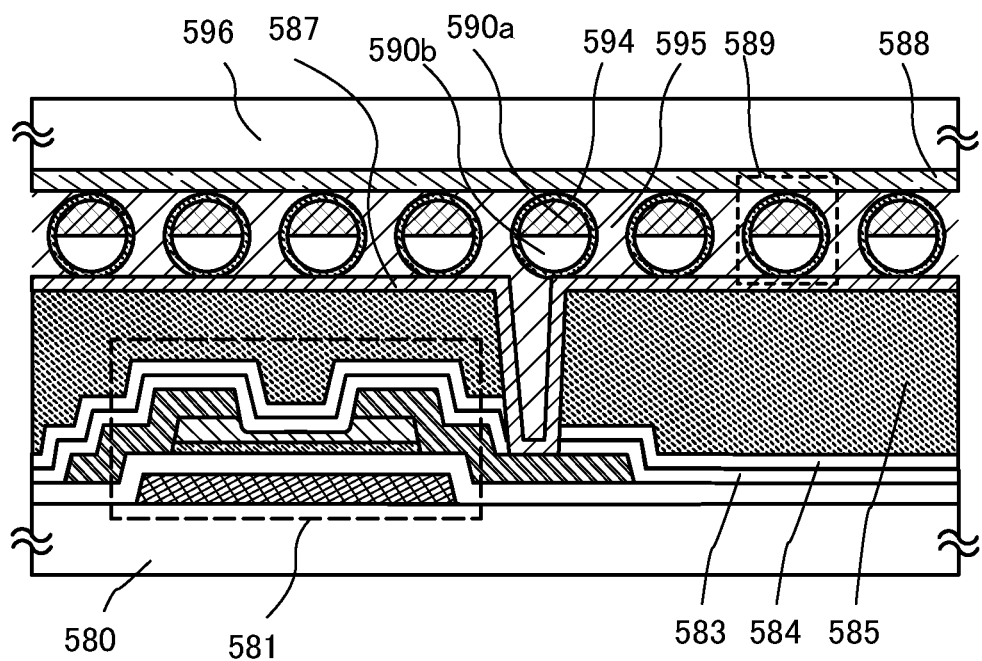
FIG. 13 illustrates a semiconductor device according to an embodiment of the present invention.

FIG. 13 illustrates active matrix electronic paper as an example of a semiconductor device. The thin film transistor described in any of Embodiments 1 to 3 can be used as a thin film transistor 581 used for the semiconductor device.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom-gate structure, and a source electrode layer and a drain electrode layer thereof is in contact with a first electrode layer 587 at an opening formed in insulating layers 583, 584, and 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 13). In this embodiment, the first electrode layer 587 and the second electrode layer 588 correspond to a pixel electrode and a common electrode, respectively. The second electrode layer 588 is electrically connected to a common potential line provided over the same substrate as the thin film transistor 581. With the use of any one of the common connection portions described in Embodiments 1 to 3, the second electrode layer 588 and the common potential line can be electrically connected to each other through conductive particles provided between the pair of substrates.

Further, instead of the twisting ball, an electrophoretic element may be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

With the above-mentioned structures, highly reliable electronic paper as a semiconductor device can be manufactured.

Note that the structure described in this embodiment can be used in combination with any of the structures and methods described in the other embodiments, as appropriate.

Embodiment 8

In this embodiment, an example of a light-emitting display device is described as a semiconductor device to which the thin film transistor described in any of Embodiments 1 to 3 is applied. Here, a light-emitting element utilizing electroluminescence is described as a display element included in the display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. The carriers (electrons and holes) are recombined and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

Figure 20:
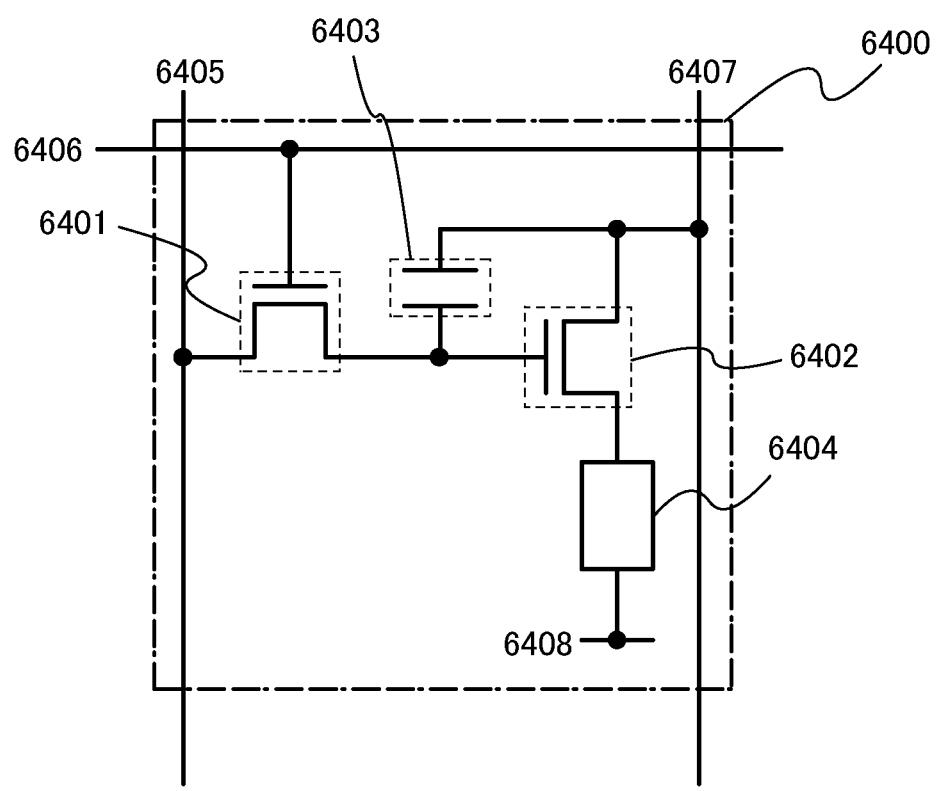
FIG. 20 illustrates a pixel equivalent circuit of a semiconductor device according to an embodiment of the present invention.

FIG. 20 is a diagram illustrating an example of a pixel structure to which digital time ratio grayscale driving can be applied, as an example of a semiconductor device to which an embodiment of the present invention is applied.

A structure and an operation of a pixel to which digital time ratio grayscale driving can be applied is described. Here, an example is described in which one pixel includes two n-channel transistors each using the oxide semiconductor layer typified by an In—Ga—Zn—O-based non-single-crystal film, which is described in any of Embodiments 1 to 3, for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over the same substrate as the common electrode 6408.

The second electrode of the light-emitting element 6404 (the common electrode 6408) is set at a low power supply potential. Note that the low power supply potential is a potential satisfying the low power supply potential<a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404, and a current is supplied to the light-emitting element 6404. Here, in order to make the light-emitting element 6404 emit light, each potential is set so that the potential difference between the high power supply potential and the low power supply potential is a forward threshold voltage of the light-emitting element 6404 or higher.

Note that gate capacitance of the driving transistor 6402 may be used as a substitute for the capacitor 6403, so that the capacitor 6403 can be omitted. The gate capacitance of the driving transistor 6402 may be formed between a channel region and the gate electrode.

Here, in the case of a voltage-input voltage driving method, a video signal is input to the gate of the driving transistor 6402 so that the driving transistor 6402 is sufficiently turned on or turned off. That is, the driving transistor 6402 operates in a linear region. Since the driving transistor 6402 operates in a linear region, a voltage higher than the voltage of the power supply line 6407 is applied to the gate of the driving transistor

6402. Note that a voltage higher than or equal to "power supply line voltage+$V_{th}$ of the driving transistor 6402" is applied to the signal line 6405.

Further, in the case of using analog grayscale driving instead of the digital time ratio grayscale driving, the pixel structure the same as that of FIG. 20 can be employed by inputting signals in a different way.

In the case of performing the analog grayscale driving, a voltage higher than or equal to "a forward voltage of the light-emitting element 6404+$V_{th}$ of the driving transistor 6402" is applied to the gate of the driving transistor 6402. The forward voltage of the light-emitting element 6404 refers to a voltage for obtaining a desired luminance, and larger than a forward threshold voltage. Note that by inputting the video signal which allows the driving transistor 6402 to operate in a saturation region, a current can be supplied to the light-emitting element 6404. In order that the driving transistor 6402 may operate in the saturation region, the potential of the power supply line 6407 is set to be higher than the gate potential of the driving transistor 6402. When the video signal is an analog signal, a current corresponding to the video signal is supplied to the light-emitting element 6404, so that the analog grayscale driving can be performed.

Note that a pixel structure of the present invention is not limited to that illustrated in FIG. 20. For example, a switch, a resistor, a capacitor, a transistor, a logic circuit, or the like may be added to the pixel illustrated in FIG. 20.

Next, structures of the light-emitting element are described with reference to FIGS. 21A to 21C. The cross-sectional structures of pixels are described by taking the case where a driving TFT is an n-channel TFT as an example. Driving TFTs 7001, 7011, and 7021 used for the semiconductor devices illustrated in FIGS. 21A to 21C can be manufactured similarly to the thin film transistors described in Embodiments 1 to 3 and are highly reliable thin film transistors each using an oxide semiconductor layer typified by an In—Ga—Zn—O-based non-single-crystal film.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to an embodiment of the present invention can be applied to a light-emitting element having any of these emission structures.

A light-emitting element having a top emission structure is described with reference to FIG. 21A.

Figure 21A:
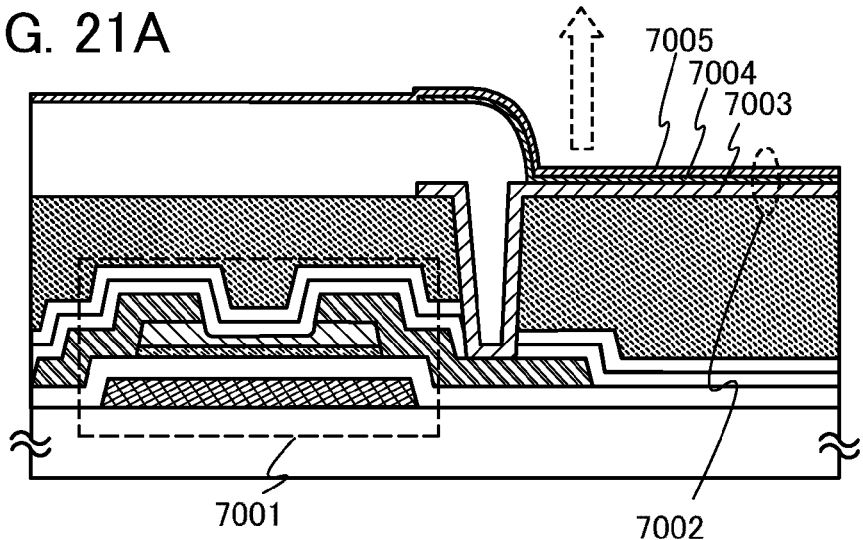
FIGS. 21A to 21C each illustrate a semiconductor device according to an embodiment of the present invention.

FIG. 21A is a cross-sectional view of a pixel in the case where the driving TFT 7001 is an n-channel transistor and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be formed using any of a variety of materials as long as it is a conductive film that has a low work function and reflects light. For example, Ca, Al, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed using a light-transmitting conductive material such as a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The light-emitting element 7002 corresponds to a region where the cathode 7003 and the anode 7005 sandwich the light-emitting layer 7004. In the case of the pixel illustrated in FIG. 21A, light is emitted from the light-emitting element 7002 to the anode 7005 side as shown by an arrow.

Next, a light-emitting element having a bottom emission structure is described with reference to FIG. 21B. FIG. 21B is a cross-sectional view of a pixel in the case where the driving TFT 7011 is an n-channel TFT and light is emitted from a light-emitting element 7012 to the cathode 7013 side. In FIG. 21B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. For the cathode 7013, any of a variety of materials can be used as in the case of FIG. 21A as long as it is a conductive material having a low work function. It is to be noted that the cathode 7013 is formed to a thickness that allows light transmission (preferably, about 5 nm to 30 nm). For example, an aluminum film with a thickness of 20 nm can be used as the cathode 7013. As in the case of FIG. 21A, the light-emitting layer 7014 may be formed using either a single layer or a plurality of layers stacked. The anode 7015 is not required to transmit light, but can be formed using a light-transmitting conductive material as in the case of FIG. 21A. As the light-blocking film 7016, metal or the like that reflects light can be used for example; however, it is not limited to a metal film. For example, a resin or the like to which black pigments are added may alternatively be used.

The light-emitting element 7012 corresponds to a region where the cathode 7013 and the anode 7015 sandwich the light-emitting layer 7014. In the case of the pixel illustrated in FIG. 21B, light is emitted from the light-emitting element 7012 to the cathode 7013 side as shown by an arrow.

Next, a light-emitting element having a dual emission structure is described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 21A, the cathode 7023 can be formed using any of a variety of materials as long as it is a conductive material having a low work function. It is to be noted that the cathode 7023 is formed to a thickness that allows light transmission. For example, a film of Al having a thickness of 20 nm can be used as the cathode 7023. As in FIG. 21A, the light-emitting layer 7024 may be formed using either a single layer or a plurality of layers stacked. The anode 7025 can be formed using a light-transmitting conductive material as in the case of FIG. 21A.

The light-emitting element 7022 corresponds to a region where the cathode 7023, the light-emitting layer 7024, and the anode 7025 are overlapped with one another. In the case of the pixel illustrated in FIG. 21C, light is emitted from the light-emitting element 7022 to both the anode 7025 side and the cathode 7023 side as shown by arrows.

Note that, although an organic EL element is described here as a light-emitting element, an inorganic EL element can alternatively be provided as a light-emitting element.

Note that in this embodiment, the example is described in which a thin film transistor (driving TFT) which controls the driving of a light-emitting element is electrically connected to the light-emitting element; however, a structure may be employed in which a TFT for current control is connected between the driving TFT and the light-emitting element.

Figure 21B:
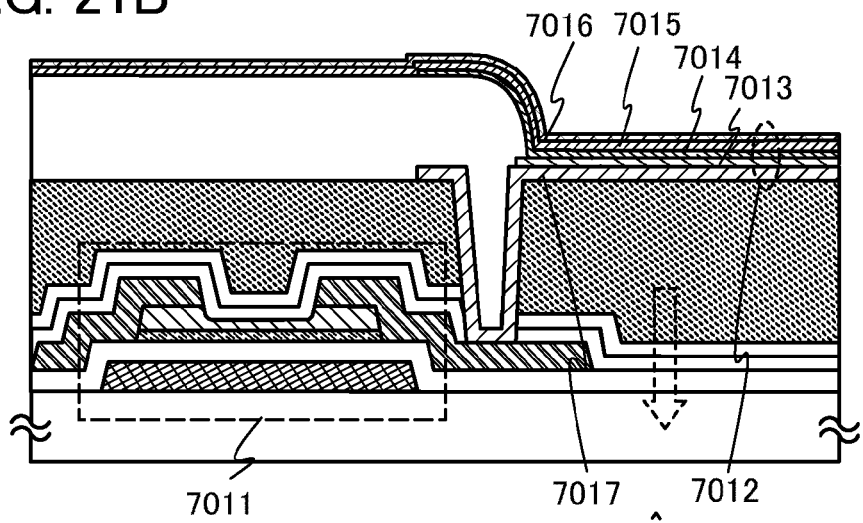
Figure 21C:
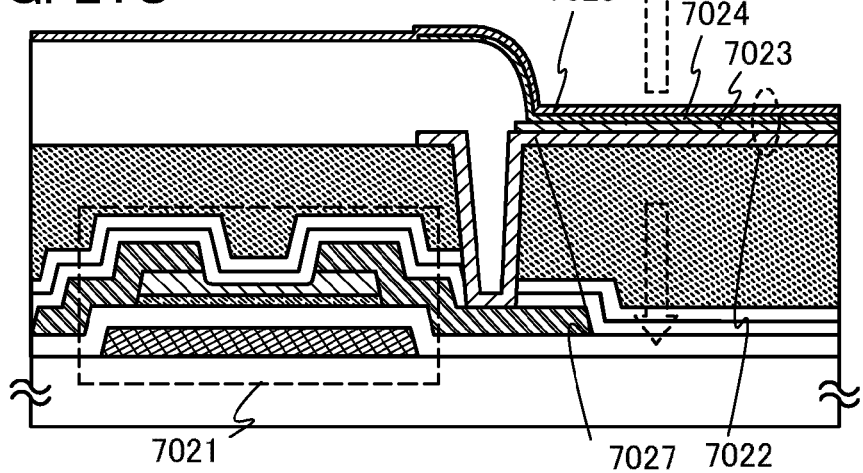

The semiconductor device described in this embodiment is not limited to the structures illustrated in FIGS. 21A to 21C and can be modified in various ways based on the spirit of techniques of the present invention.

Figure 24A:
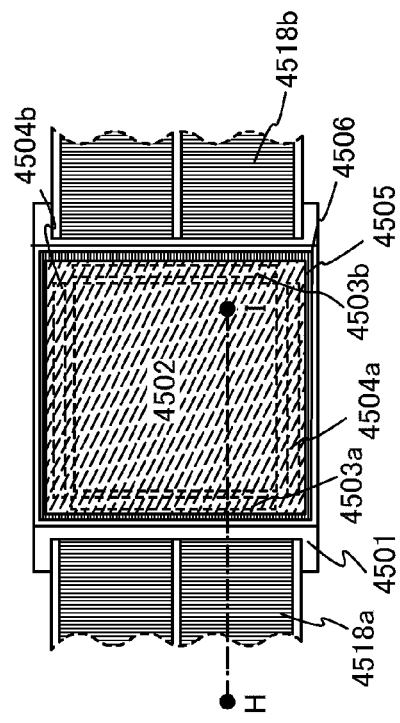
FIGS. 24A and 24B illustrate a semiconductor device according to an embodiment of the present invention.
Figure 24B:
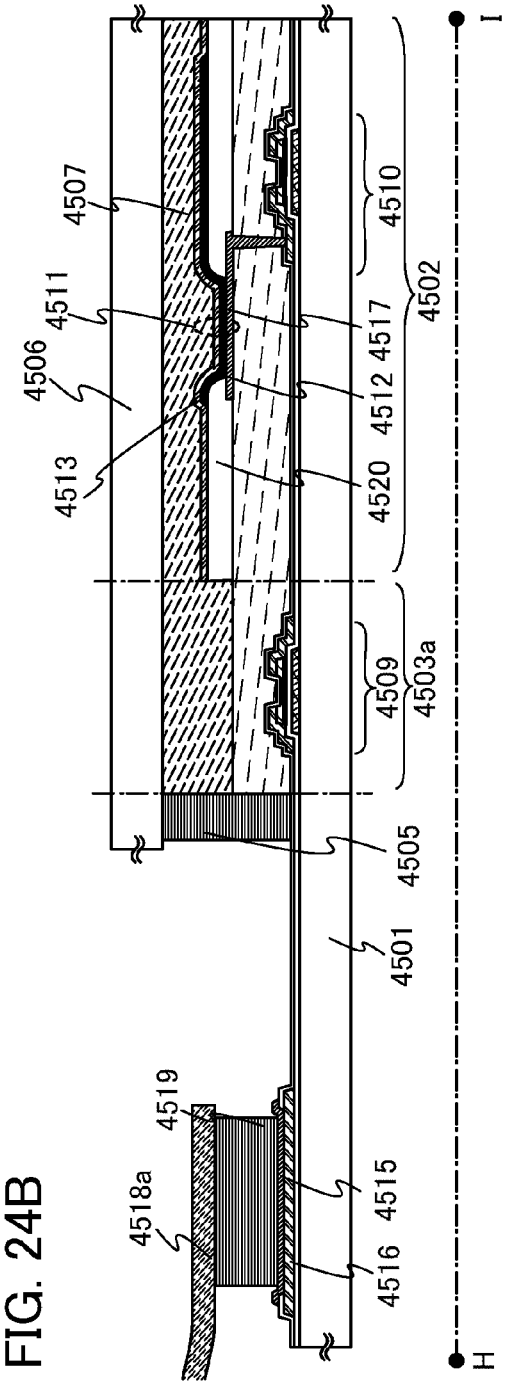

Next, the upper aspect and the cross section of a light-emitting display panel (also referred to as a light-emitting panel) which corresponds to one embodiment of a semiconductor device to which the thin film transistor described in any of Embodiments 1 to 3 is applied are described with reference to FIGS. 24A and 24B. FIG. 24A is a top view of a panel in which thin film transistors and a light-emitting element, which are formed over a first substrate, are sealed between the first substrate and a second substrate with a sealant. FIG. 24B corresponds to a cross-sectional view taken along line H-I of FIG. 24A.

The sealant 4505 is provided so as to surround a pixel portion 4502, a signal line driver circuits 4503a and 4503b, and scan line driver circuits 4504a and 4504b which are provided over the first substrate 4501. In addition, the second substrate 4506 is formed over the pixel portion 4502, the signal line driver circuits 4503a and 4503b, and scan line driver circuits 4504a and 4504b. Accordingly, the pixel portion 4502, the signal line driver circuits 4503a and 4503b, and the scan line driver circuits 4504a and 4504b are sealed, together with a filler 4507, with the first substrate 4501, the sealant 4505, and the second substrate 4506. In this manner, it is preferable that the pixel portion 4502, the signal line driver circuits 4503a and 4503b, and the scan line driver circuits 4504a and 4504b be packaged (sealed) with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the outside air.

The pixel portion 4502, the signal line driver circuits 4503a and 4503b, and the scan line driver circuits 4504a and 4504b formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 24B.

As the thin film transistors 4509 and 4510, highly reliable thin film transistors each using the oxide semiconductor layer typified by an In—Ga—Zn—O-based non-single-crystal film, which is described in any of Embodiments 1 to 3, can be used. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a layered structure of the first electrode layer 4517, an electric field light-emitting layer 4512, and the second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

The partition wall 4520 is formed using an organic resin film, an inorganic insulating film, or organic polysiloxane. It is particularly preferable that the partition wall 4520 be formed using a photosensitive material to have an opening portion over the first electrode layer 4517 so that a sidewall of the opening portion is formed as an inclined surface with a continuous curvature.

The electric field light-emitting layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, and the pixel portion 4502 from FPCs 4518a and 4518b.

In this embodiment, a connection terminal electrode 4515 is formed using a conductive film the same as that of the first electrode layer 4517 included in the light-emitting element 4511. A terminal electrode 4516 is formed using a conductive film the same as that of the source and drain electrode layers included in the thin film transistors 4509 and 4510.

The connection terminal electrode 4515 is electrically connected to a terminal included in the FPC 4518a through an anisotropic conductive film 4519.

As the second substrate 4506 located in the direction in which light is extracted from the light-emitting element 4511 needs to have a light-transmitting property. In this case, a light-transmitting material such as a glass plate, a plastic plate, a polyester film, or an acrylic film is used.

As the filler 4507, an inert gas such as nitrogen or argon, an ultraviolet curable resin, or a thermosetting resin can be used. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used as the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or polycrystalline semiconductor film over separately prepared may be mounted as the signal line driver circuits 4503a and 4503b and the scan line driver circuits 4504a and 4504b. Alternatively, only the signal line driver circuits or part thereof, or the scan line driver circuits or part thereof may be separately formed and mounted. This embodiment is not limited to the structure illustrated in FIGS. 24A and 24B.

With the above-mentioned structures, a highly reliable light-emitting display device (display panel) as a semiconductor device can be manufactured.

Note that the structure described in this embodiment can be used in combination with any of the structures and methods described in the other embodiments, as appropriate.

Embodiment 9

A semiconductor device to which the thin film transistor described in any of Embodiments 1 to 3 is applied can be applied to electronic paper. Electronic paper can be used for electronic appliances of a variety of fields as long as they can display data. For example, electronic paper can be applied to an electronic book (e-book), a poster, a transportation advertisement in a vehicle such as a train, displays of various cards such as a credit card, and the like. Examples of the electronic appliances are illustrated in FIGS. 25A, 25B, and FIG. 26.

Figure 25A:
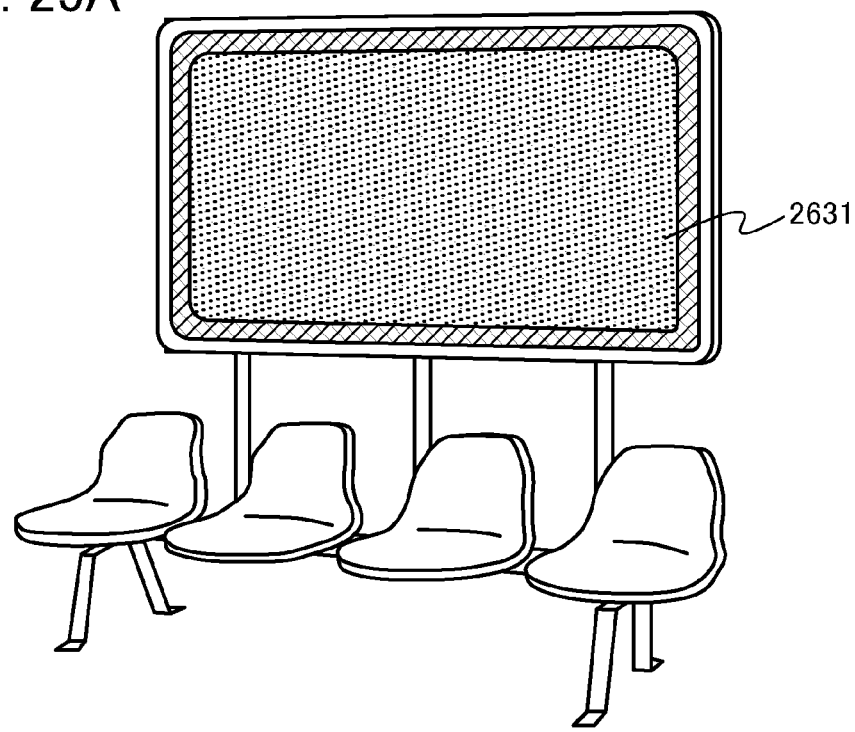
FIGS. 25A and 25B illustrate examples of application of electronic paper.

FIG. 25A illustrates a poster 2631 formed using electronic paper. In the case where an advertising medium is printed paper, the advertisement is replaced by manpower; however, by using electronic paper, the advertising display can be changed in a short time. Further, an image can be stably displayed without being distorted. Note that the poster may transmit and receive data wirelessly.

Figure 25B:
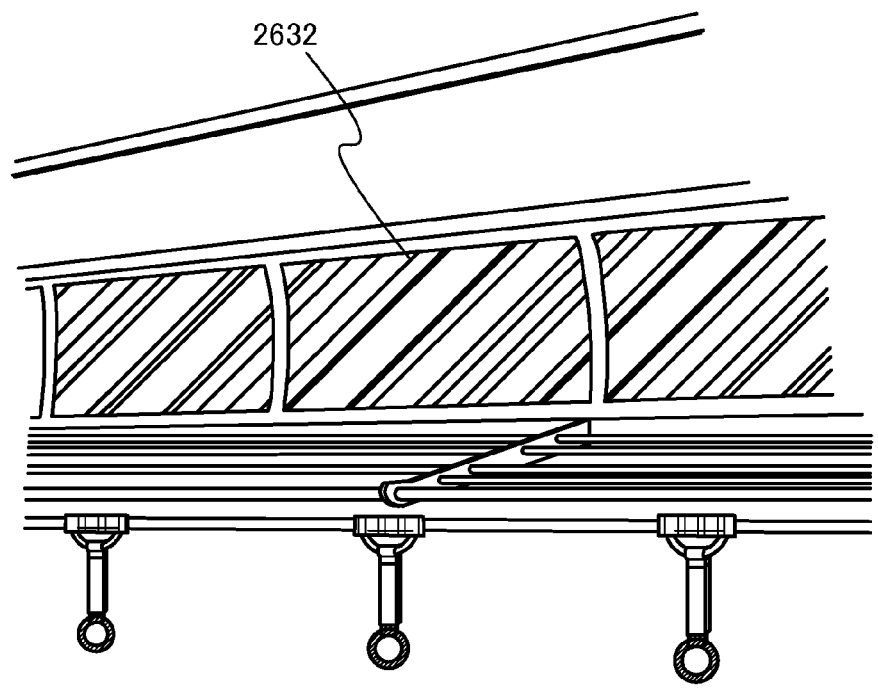

FIG. 25B illustrates an advertisement 2632 in a vehicle such as a train. In the case where an advertising medium is printed paper, the advertisement is replaced by manpower; however, by using electronic paper, the advertising display can be changed in a short time without a lot of manpower. Further an image can be stably displayed without being distorted. Note that the advertisement in a vehicle may transmit and receive data wirelessly.

Figure 26:
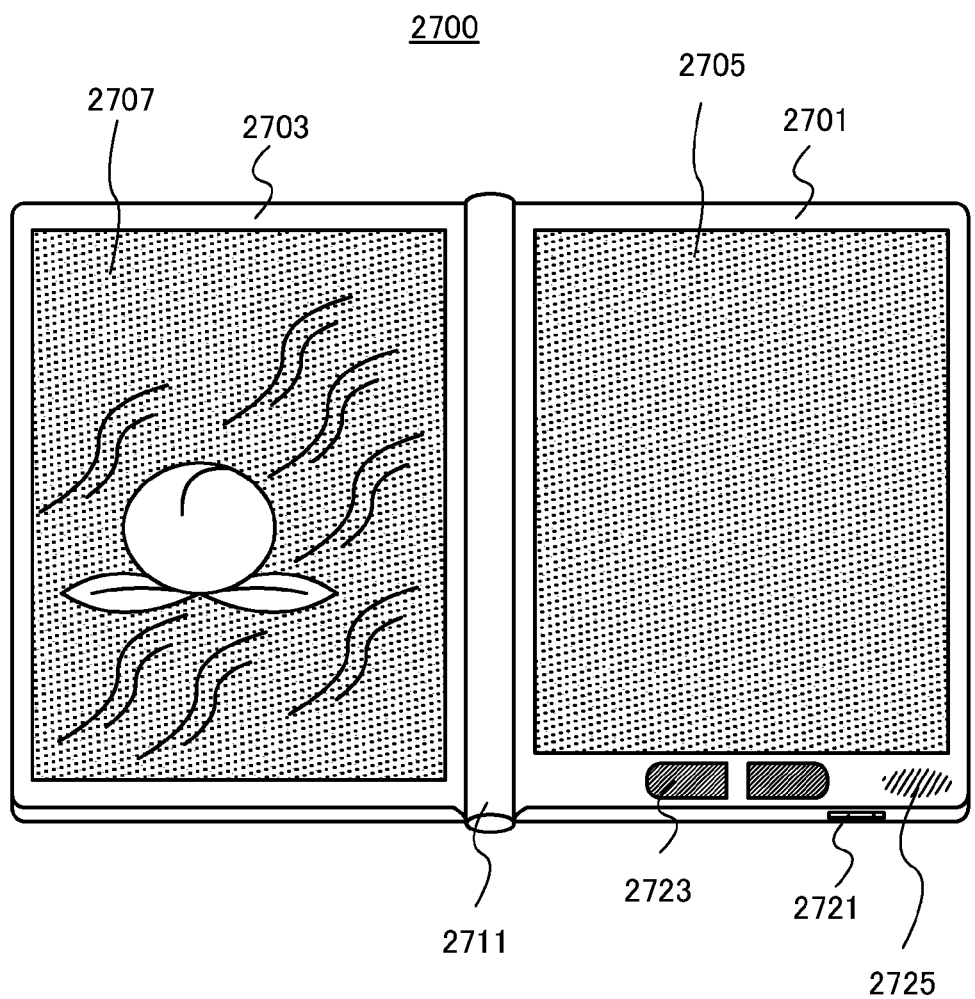
FIG. 26 illustrates an example of an electronic book.

FIG. 26 illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 26) can display text and a display portion on the left side (the display portion 2707 in FIG. 26) can display graphics.

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book 2700 may have a function of an electronic dictionary.

The electronic book 2700 may transmit and receive data wirelessly. The structure may be employed in which a desired book data or the like is purchased and downloaded from an electronic book server wirelessly.

Note that the structure described in this embodiment can be used in combination with any of the structures and methods described in the other embodiments, as appropriate.

Embodiment 10

A semiconductor device using the thin film transistor described in any of Embodiments 1 to 3 can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 27A:
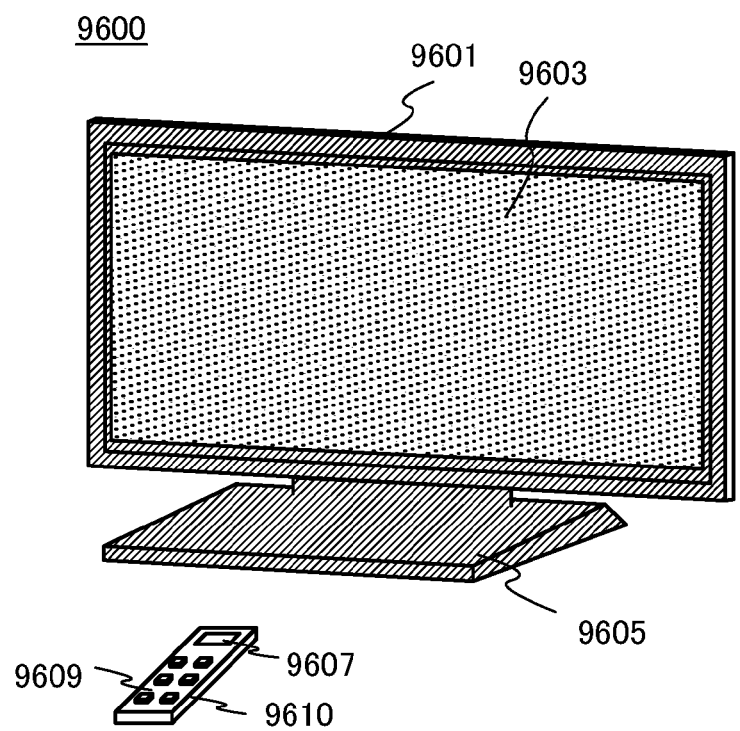
FIGS. 27A and 27B illustrate examples of a television set and a digital photo frame.

FIG. 27A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 27B:
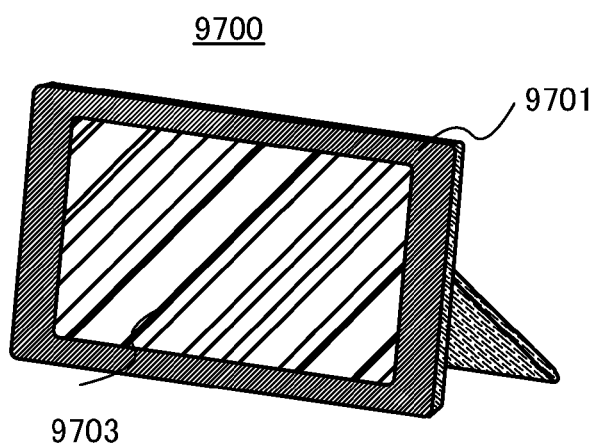

FIG. 27B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 28A:
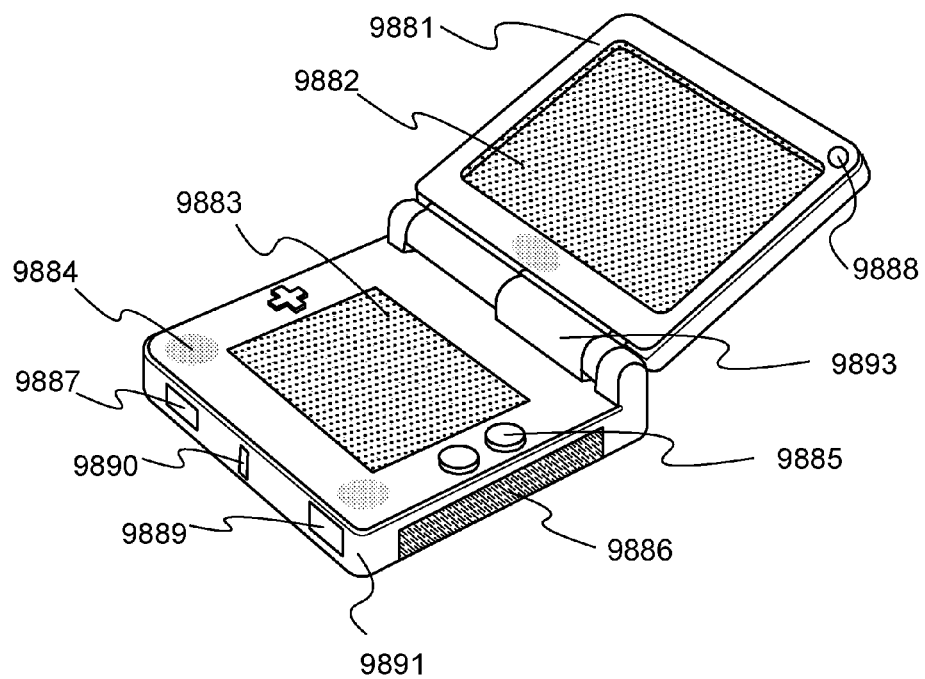
FIGS. 28A and 28B illustrate examples of game machines.

FIG. 28A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 28A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. Needless to say, the structure of the portable game machine is not limited to the above, and may be any structure as long as at least a semiconductor device according to one embodiment of the present invention is provided. Moreover, another accessory may be provided as appropriate. The portable game machine illustrated in FIG. 28A has a function of reading out a program or data stored in a storage medium to display it on the display portion, and a function of sharing information with another portable game machine by wireless communication. The portable game machine in FIG. 28A can have a variety of functions other than those above.

Figure 28B:
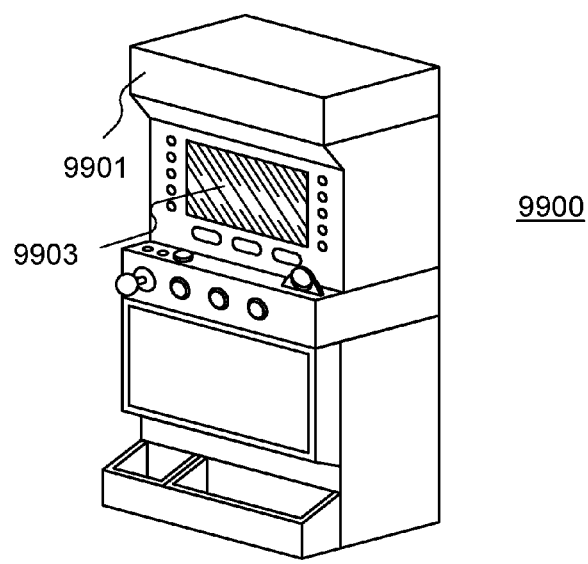

FIG. 28B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 29A:
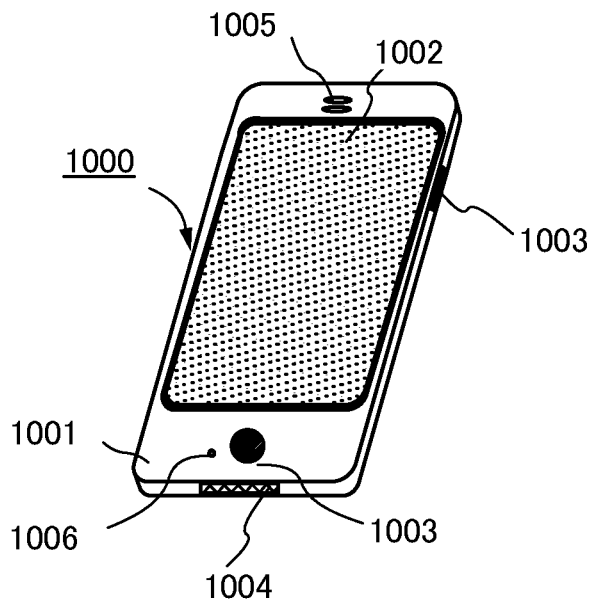
FIGS. 29A and 29B illustrate examples of mobile phones.

FIG. 29A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 29A is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 (whether the mobile phone handset 1000 is placed horizontally or vertically).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

Figure 29B:
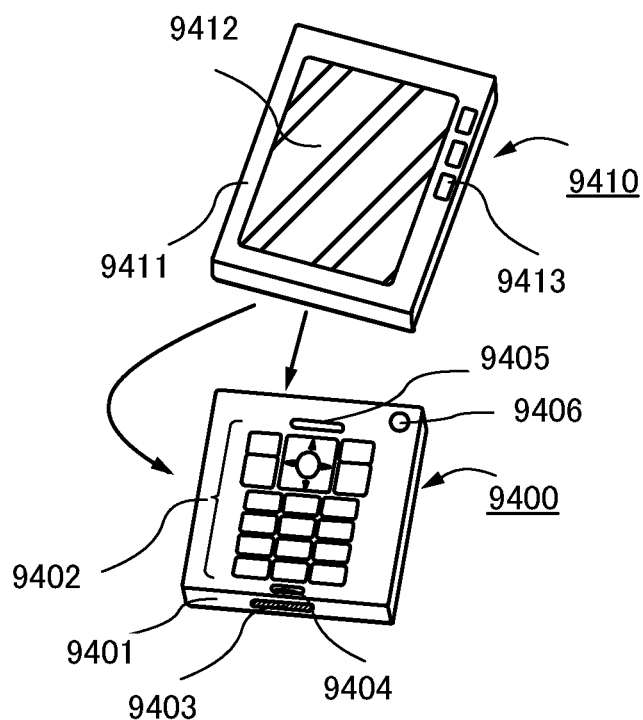

FIG. 29B illustrates another example of a mobile phone handset. The mobile phone handset illustrated in FIG. 29B is provided with a display device 9410 including a display portion 9412 and operation buttons 9413 in a housing 9411 and a communication device 9400 including scan buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions shown by the arrows. Thus, the display device 9410 and the communication device 9400 may be attached to each other along their short sides or long sides. Further, when only the display function is needed, the display device 9410 can be detached from the communication device 9400 and used alone. Images or input data can be transmitted or received by wireless communication or wired communication between the communication device 9400 and the display device 9410, each of which has a rechargeable battery.

Note that the structure described in this embodiment can be used in combination with any of the structures and methods described in the other embodiments, as appropriate.

This application is based on Japanese Patent Application serial no. 2009-045536 filed with Japan Patent Office on Feb. 27, 2009, the entire contents of which are hereby incorporated by reference.

What is claimed is:

1. A semiconductor device comprising:
    a gate electrode layer;
    a gate insulating layer over the gate electrode layer;
    an oxide semiconductor layer over the gate insulating layer;
    an oxide semiconductor layer containing insulating oxide over the oxide semiconductor layer; and
    a source electrode layer and a drain electrode layer over the oxide semiconductor layer containing insulating oxide,
    wherein the oxide semiconductor layer includes a crystal grain, and
    wherein the oxide semiconductor layer containing insulating oxide is electrically connected to the source electrode layer and the drain electrode layer.

2. The semiconductor device according to claim 1, wherein the insulating oxide is silicon oxide.

3. The semiconductor device according to claim 1, wherein the crystal grain is 1 nm to 10 nm in diameter.

4. The semiconductor device according to claim 1, wherein the oxide semiconductor layer and the oxide semiconductor layer containing insulating oxide each contain at least one of indium, tin, and zinc.

5. The semiconductor device according to claim 1, wherein the oxide semiconductor layer has a region which is between the source electrode layer and the drain electrode layer and whose thickness is smaller than that of a region overlapped with the source electrode layer or the drain electrode layer.

6. The semiconductor device according to claim 1, wherein a portion of the oxide semiconductor layer containing insulating oxide between the source electrode layer and the drain electrode layer is exposed.

7. The semiconductor device according to claim 1, wherein a channel protective layer formed using an inorganic material is provided over the oxide semiconductor layer.

8. The semiconductor device according to claim 1, wherein a width in a channel direction of the gate electrode layer is larger than that of either the oxide semiconductor layer containing insulating oxide or the oxide semiconductor layer.

9. The semiconductor device according to claim 1, wherein a hollow is formed under an end portion of the oxide semiconductor layer containing insulating oxide.

10. The semiconductor device according to claim 1, wherein an end portion of the oxide semiconductor layer is covered with the oxide semiconductor layer containing insulating oxide.

11. A semiconductor device comprising:
a gate electrode layer;
a gate insulating layer over the gate electrode layer;
an oxide semiconductor layer over the gate insulating layer;
an oxide semiconductor layer containing insulating oxide over the oxide semiconductor layer;
a buffer layer having n-type conductivity over the oxide semiconductor layer containing insulating oxide; and
a source electrode layer and a drain electrode layer over the buffer layer,
wherein the oxide semiconductor layer includes a crystal grain,
wherein a conductivity of the buffer layer is higher than that of the oxide semiconductor layer; and
wherein the oxide semiconductor layer containing insulating oxide is electrically connected to one of the source electrode layer and the drain electrode layer through the buffer layer.

12. The semiconductor device according to claim 11, wherein the buffer layer includes an oxide semiconductor film which is non-single crystal.

13. The semiconductor device according to claim 11, wherein the insulating oxide is silicon oxide.

14. The semiconductor device according to claim 11, wherein the crystal grain is 1 nm to 10 nm in diameter.

15. The semiconductor device according to claim 11, wherein the oxide semiconductor layer and the oxide semiconductor layer containing insulating oxide each contain at least one of indium, tin, and zinc.

16. The semiconductor device according to claim 11, wherein the oxide semiconductor layer has a region which is between the source electrode layer and the drain electrode layer and whose thickness is smaller than that of a region overlapped with the source electrode layer or the drain electrode layer.

17. The semiconductor device according to claim 11, wherein a portion of the oxide semiconductor layer containing insulating oxide between the source electrode layer and the drain electrode layer is exposed.

18. The semiconductor device according to claim 11, wherein a channel protective layer formed using an inorganic material is provided over the oxide semiconductor layer.

19. The semiconductor device according to claim 11, wherein a width in a channel direction of the gate electrode layer is larger than that of either the oxide semiconductor layer containing insulating oxide or the oxide semiconductor layer.

20. The semiconductor device according to claim 11, wherein a hollow is formed under an end portion of the oxide semiconductor layer containing insulating oxide.

21. The semiconductor device according to claim 11, wherein an end portion of the oxide semiconductor layer is covered with the oxide semiconductor layer containing insulating oxide.

* * * * *